(12) United States Patent
Yanagida et al.

(10) Patent No.: US 10,440,302 B2
(45) Date of Patent: *Oct. 8, 2019

(54) IMAGING DEVICE INCLUDING PIXEL

(71) Applicant: PANASONIC INTELLECTUAL PROPERTY MANAGEMENT CO., LTD., Osaka (JP)

(72) Inventors: Masaaki Yanagida, Osaka (JP); Takayasu Kito, Osaka (JP); Yoshiaki Satou, Kyoto (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/107,687

(22) Filed: Aug. 21, 2018

(65) Prior Publication Data

US 2018/0359439 A1 Dec. 13, 2018

Related U.S. Application Data

(63) Continuation of application No. 15/190,368, filed on Jun. 23, 2016, now Pat. No. 10,079,988.

(30) Foreign Application Priority Data

Jul. 7, 2015 (JP) .................. 2015-136328
Mar. 18, 2016 (JP) .................. 2016-055777

(51) Int. Cl.
*H04N 5/369* (2011.01)
*H04N 5/353* (2011.01)
(Continued)

(52) U.S. Cl.
CPC ......... *H04N 5/3698* (2013.01); *H01L 27/307* (2013.01); *H04N 5/3532* (2013.01); *H04N 5/378* (2013.01)

(58) Field of Classification Search
CPC ................ H04N 5/3698; H04N 5/378
See application file for complete search history.

(56) References Cited

U.S. PATENT DOCUMENTS 6,677,993 B1   1/2004  Suzuki et al.
6,777,660 B1*  8/2004  Lee ............... H01L 27/14609
                                            250/208.1
(Continued)

FOREIGN PATENT DOCUMENTS

JP    2008-271186 A    11/2008
JP    2009-290628 A    12/2009
(Continued)

OTHER PUBLICATIONS

Non-Final Office Action issued in U.S. Appl. No. 15/190,368, dated Dec. 27, 2017.

*Primary Examiner* — Christopher K Peterson
(74) *Attorney, Agent, or Firm* — McDermott Will & Emery LLP

(57) ABSTRACT

An imaging device having a pixel including a photoelectric converter that converts incident light into charges, and a reset transistor having a first source, a first drain and a first gate, one of the first source and the first drain coupled to the photoelectric converter. The imaging device further including first voltage generating circuity that generates a first voltage; second voltage generating circuity that generates a second voltage, the second voltage generating circuity being different from the first voltage generating circuity; and first switching circuity that causes either the first voltage generating circuity or the second voltage generating circuity to selectively couple to the other of the first source and the first drain of the reset transistor.

13 Claims, 25 Drawing Sheets

(51) Int. Cl.
*H04N 5/378* (2011.01)
*H01L 27/30* (2006.01)

(56) References Cited

U.S. PATENT DOCUMENTS

| | | |
|---|---|---|
| 10,079,988 B2 * | 9/2018 | Yanagida ............... H01L 27/307 |
| 2005/0036048 A1 * | 2/2005 | Fowler ............... H04N 5/23241 |
| | | 348/302 |
| 2008/0259195 A1 | 10/2008 | Yoshida et al. |
| 2011/0115959 A1 | 5/2011 | Toyama et al. |
| 2013/0107094 A1 | 5/2013 | Yamamoto et al. |
| 2014/0027619 A1 | 1/2014 | Ishii et al. |
| 2014/0184316 A1 | 7/2014 | Chou et al. |

FOREIGN PATENT DOCUMENTS

| | | |
|---|---|---|
| JP | 2011-109282 A | 6/2011 |
| JP | 2011-228621 A | 11/2011 |
| JP | 2012-019167 A | 1/2012 |
| JP | 2014-064211 A | 4/2014 |
| WO | 2011/125677 A1 | 10/2011 |
| WO | 2012/137445 A1 | 10/2012 |

\* cited by examiner

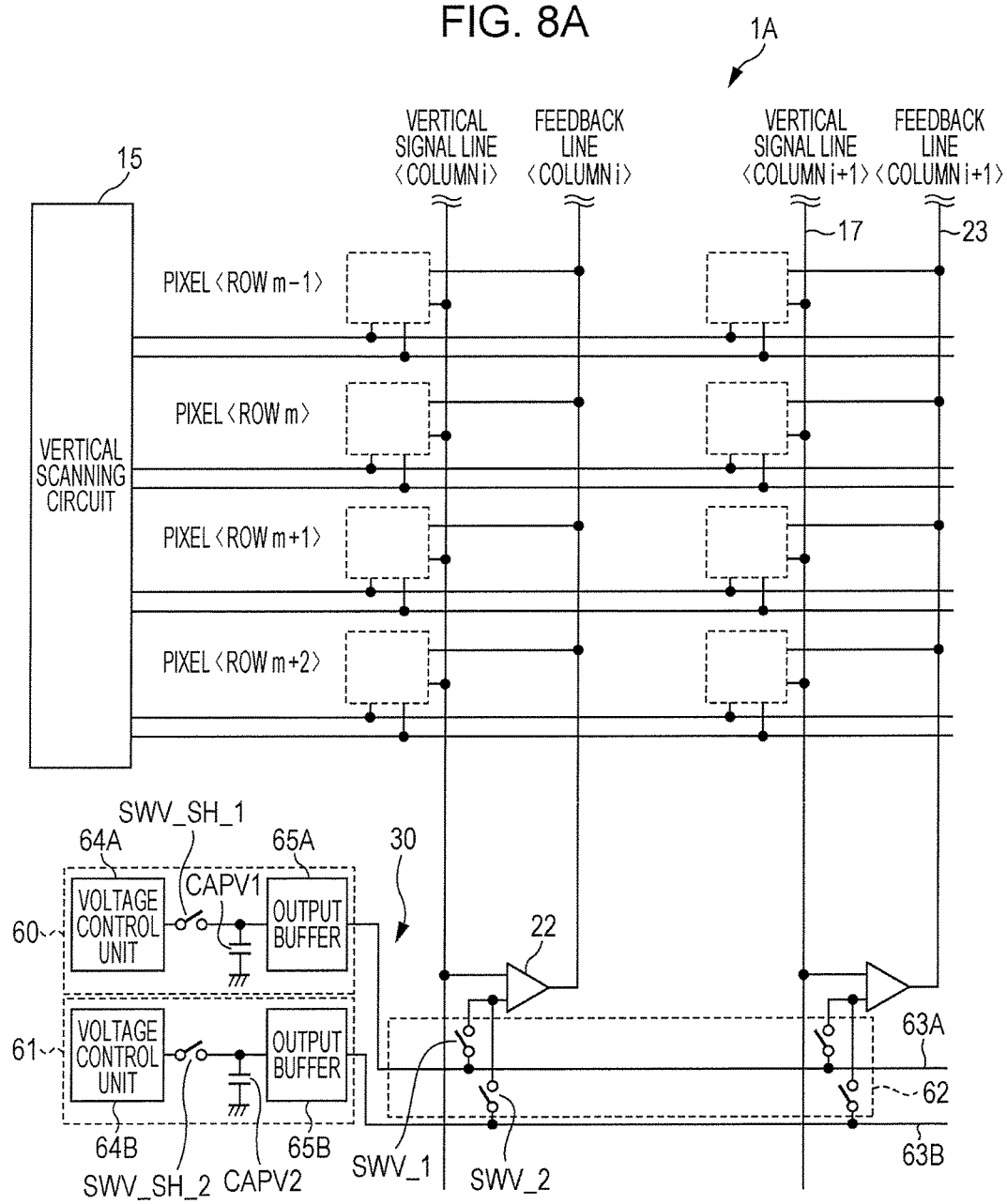

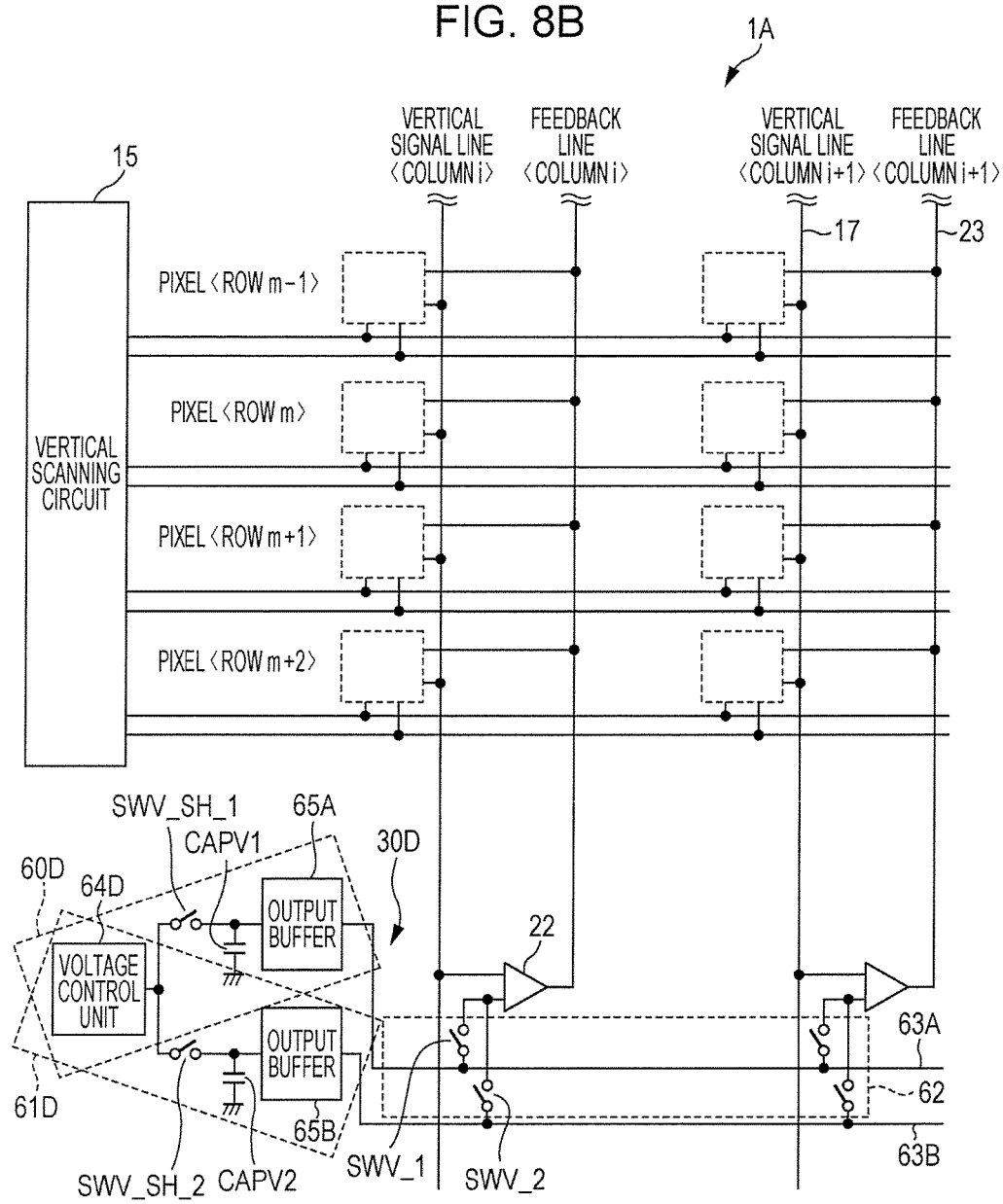

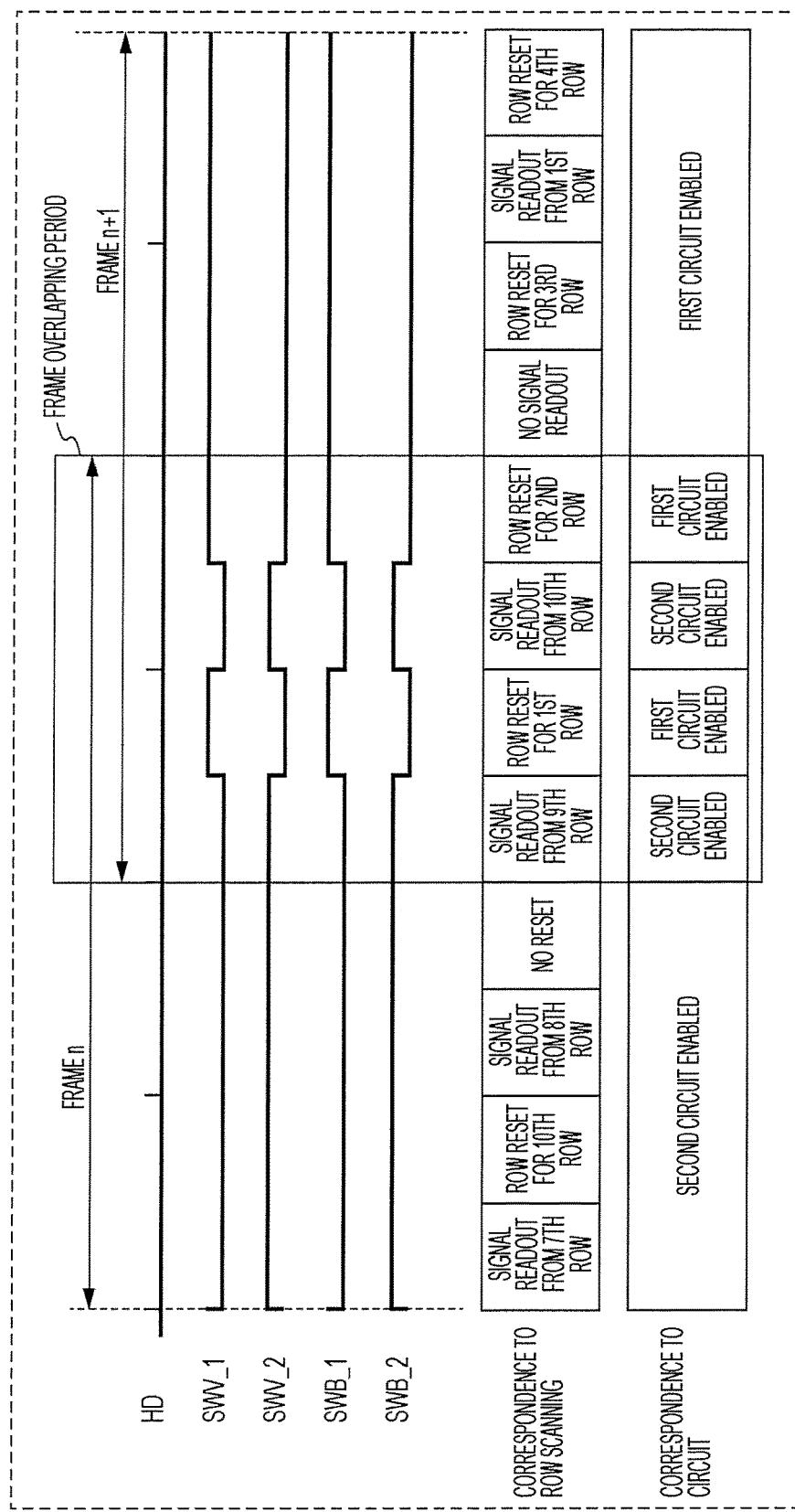

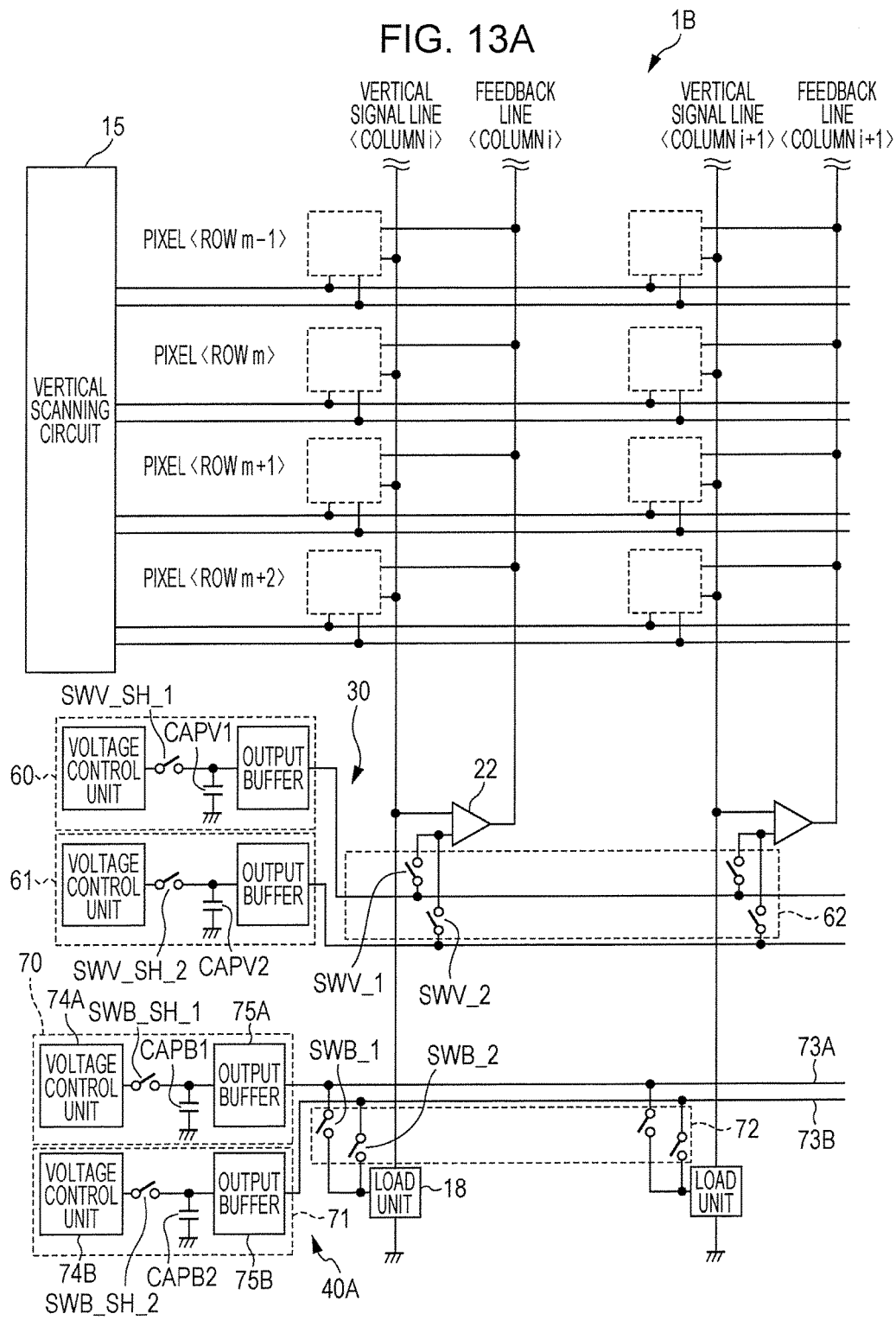

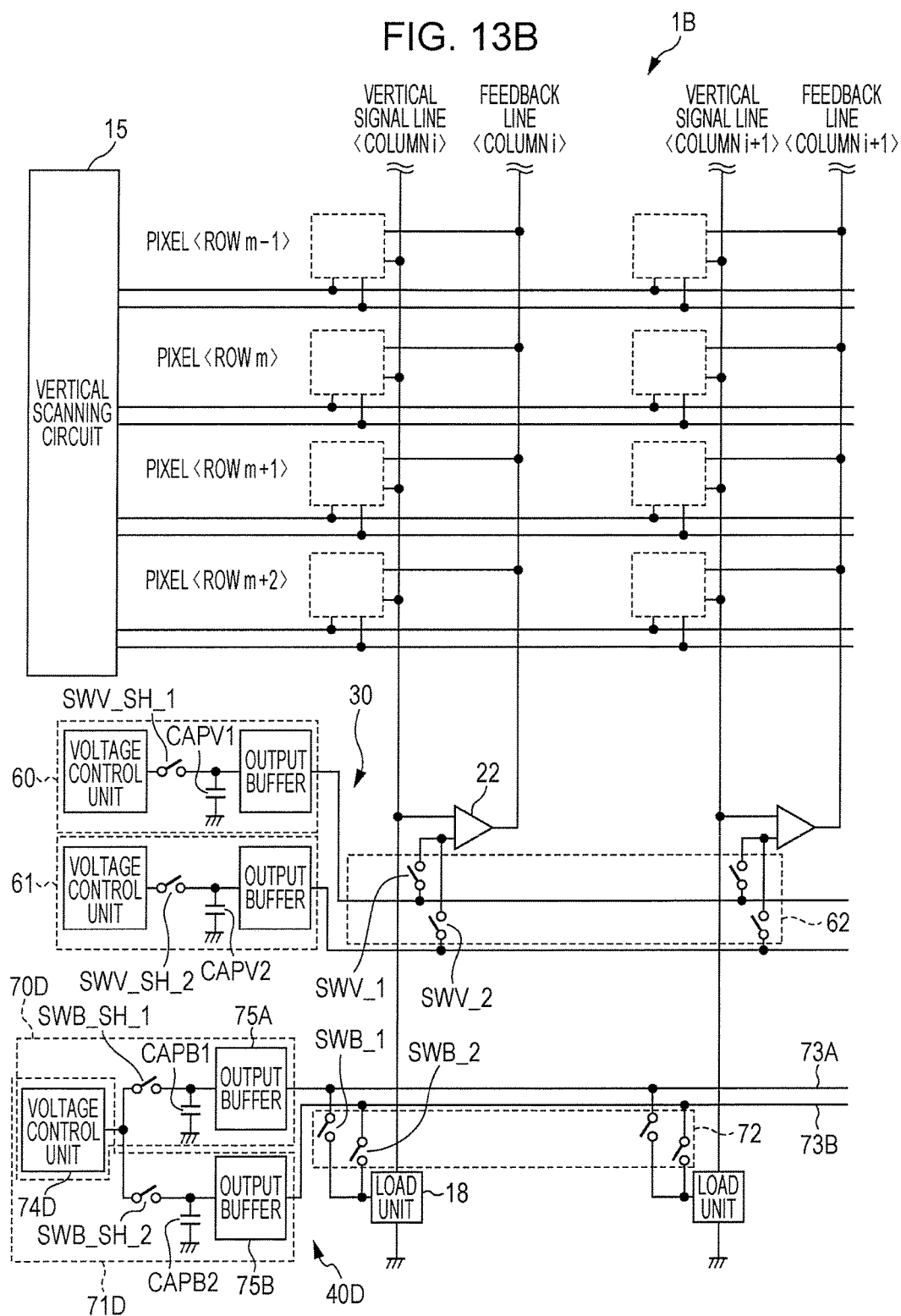

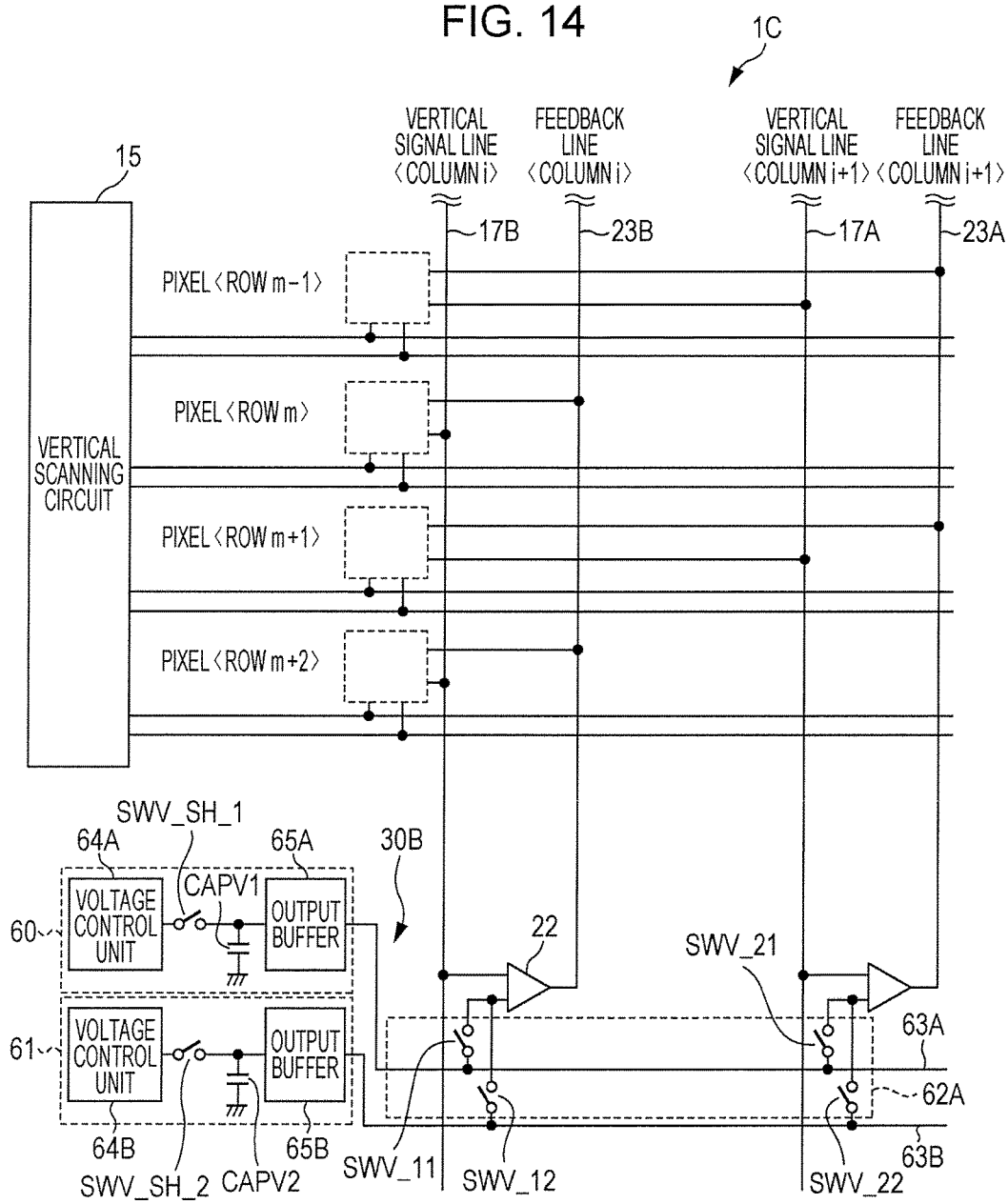

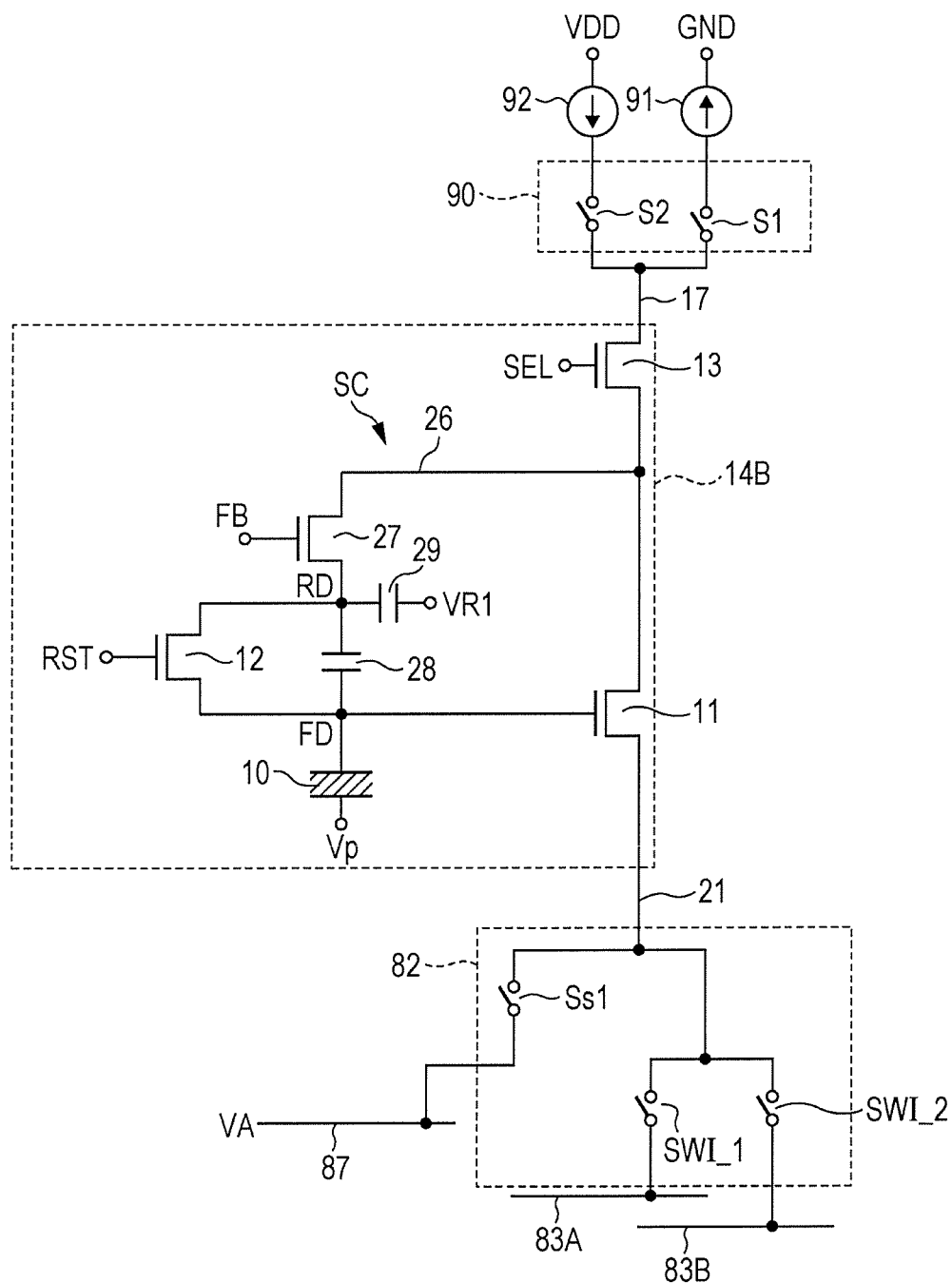

IMAGING DEVICE INCLUDING PIXEL

CROSS-REFERENCE OF RELATED APPLICATIONS

This application is a Continuation application of U.S. patent application Ser. No. 15/190,368, filed on Jun. 23, 2016, which in turn claims the benefit of Japanese Application No. 2015-136328, filed on Jul. 7, 2015 and Japanese Patent Application No. 2016-055777, filed on Mar. 18, 2016, the entire disclosures of which Applications are incorporated by reference herein.

BACKGROUND

1. Technical Field

The present disclosure relates to an imaging device (also called an "image sensor").

2. Description of the Related Art

In recent years, video cameras and digital cameras have been in widespread use. Such cameras include a charge coupled device (CCD) image sensor or a complementary metal oxide semiconductor (CMOS) image sensor. In particular, CMOS image sensors are becoming more mainstream. One of the reasons is that since a peripheral circuit can be integrated into a single chip, a signal can be read out of the imaging device at high speed and, thus, the imaging device can be improved in terms of their speed and resolution.

For example, Japanese Unexamined Patent Application Publication No. 2011-228621 describes an imaging device using an organic photoelectric conversion film in a light receiving unit thereof. In addition, Japanese Unexamined Patent Application Publication No. 2011-109282 describes an imaging device including a sample-and-hold circuit.

SUMMARY

An imaging device capable of further reducing horizontal line noise is expected to be developed. One non-limiting and exemplary embodiment provides an imaging device capable of reducing horizontal line noise while maintaining a high frame rate.

In one general aspect, the techniques disclosed here feature an imaging device having a pixel comprising a photoelectric converter that converts incident light into charges, and a reset transistor having a first source, a first drain and a first gate, one of the first source and the first drain coupled to the photoelectric converter. The imaging device further comprising first voltage generating circuitry that generates a first voltage; second voltage generating circuitry that generates a second voltage, the second voltage generating circuitry being different from the first voltage generating circuitry; and first switching circuitry that causes either the first voltage generating circuitry or the second voltage generating circuitry to selectively couple to the other of the first source and the first drain of the reset transistor. It should be noted that general or specific embodiments may be implemented as a system, a method, an integrated circuit, a computer program, a storage medium, or any selective combination thereof.

According to the aspect of the disclosure, an imaging device capable of reducing horizontal line noise while maintaining a high frame rate can be provided.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 8A is a schematic illustration of a typical example of the circuit configuration of a reference voltage applying circuit included in the imaging device.

FIG. 8B is a schematic illustration of an example of a reference voltage applying circuit including a single voltage control unit;

FIG. 9 is a timing diagram of the drive timing of the imaging device according to the second exemplary embodiment;

FIG. 13A is a schematic illustration of the circuit configuration of an imaging device according to a third exemplary embodiment;

FIG. 13B is a schematic illustration of an example of the circuit configuration of a bias circuit including a single voltage control unit;

FIG. 14 is a schematic illustration of the circuit configuration of an imaging device according to a fourth exemplary embodiment;

FIG. 19 is a schematic illustration of another exemplary circuit configuration of a pixel capable of forming a feedback path;

DETAILED DESCRIPTION

Before exemplary embodiments of the present disclosure are described, the issues that the present inventors have found in existing imaging devices are described.

In recent years, the area per pixel of an imaging device has decreased with increasing number of pixels used in the imaging device. Accordingly, a decrease in the sensitivity of a pixel and a decrease in the number of saturation electrons are recognized as major problems. To solve the problems, an organic CMOS image sensor that uses an organic photoelectric conversion film in a light receiving unit has been developed.

For example, the organic CMOS image sensor described in Japanese Unexamined Patent Application Publication No. 2011-228621 has an organic photoelectric conversion film disposed above a readout circuit. The readout circuit is electrically connected to the light receiving unit including the organic photoelectric conversion film via a metal wiring line. The organic CMOS image sensor can maintain the area of the light receiving unit even when the pixel size is reduced. Thus, the sensitivity of a pixel and the number of saturation electrons can be maintained at a high level.

In general, CMOS image sensors (including an organic CMOS image sensor) include a readout circuit including three transistors (hereinafter referred to as a "3Tr readout circuit") or a readout circuit including four transistors (hereinafter referred to as a "4Tr readout circuit"). Each of the types of readout circuit is described in detail below.

The organic CMOS image sensor described in Japanese Unexamined Patent Application Publication No. 2011-228621 includes a 3Tr readout circuit. In the readout circuit, a light receiving unit is electrically connected to a floating diffusion (FD) node. In addition, the readout circuit includes a reset transistor that resets the charge accumulated in the FD node. Hereinafter, resetting of the charge accumulated in the FD node is referred to as "resetting of a pixel".

Figure 1:
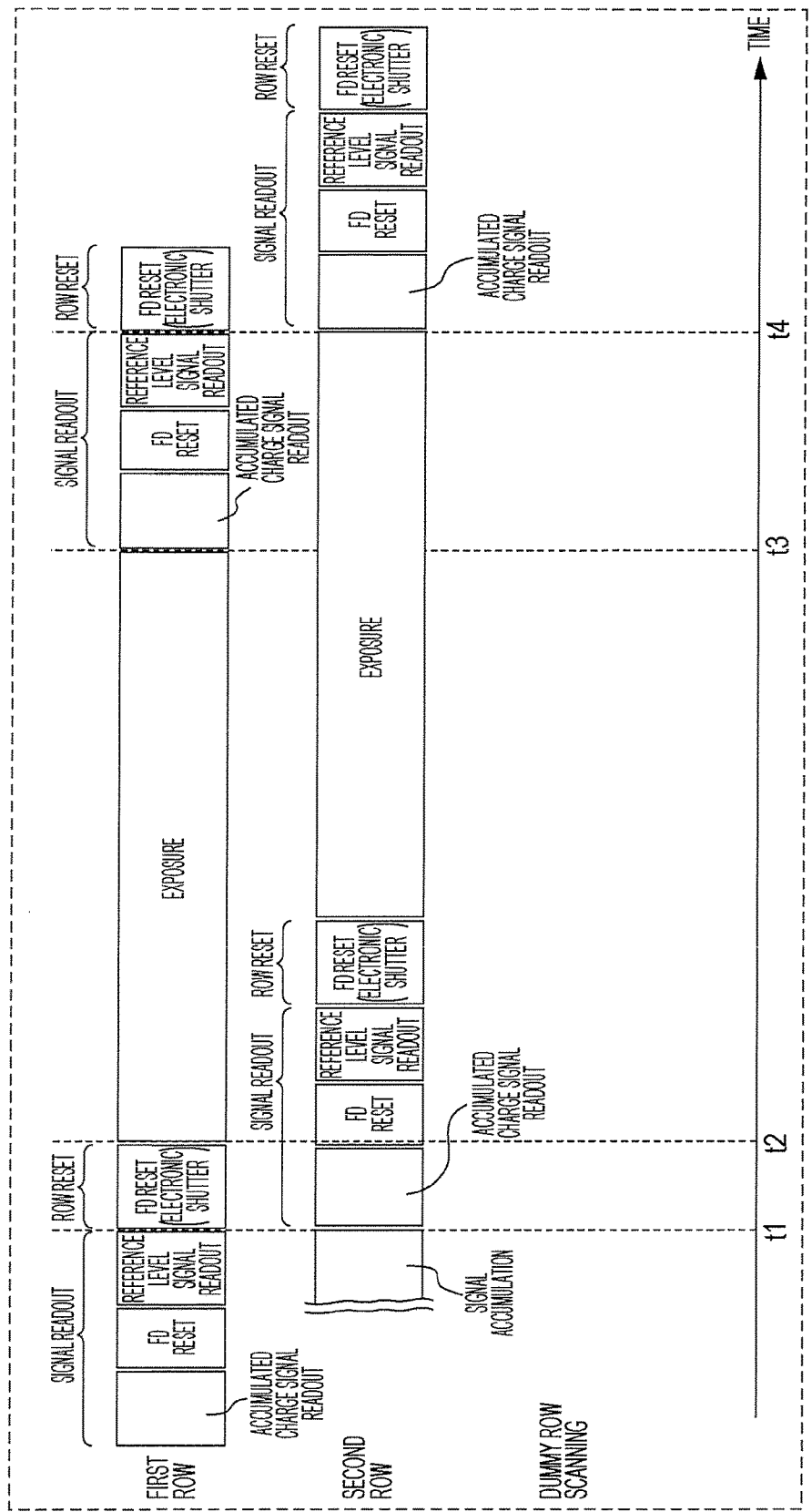
FIG. 1 is a timing diagram of a typical operation performed by an organic CMOS image sensor including a 3Tr readout circuit.

FIG. 1 illustrates a typical timing of the operation of an organic CMOS image sensor including a 3Tr readout circuit. For simplicity of description, the number of pixels arranged in the vertical direction is two. Hereinafter, the first row is discussed. The pixel is reset at a time t1 first. As used herein, resetting of all the pixels in a certain row is referred to as "row reset". In an example illustrated in FIG. 1, a period required for row reset of the first row is the period from the time t1 to a time t2. This period is referred to as "row reset period". Through row reset, the charge in the FD nodes in the pixels arranged in a row which is a target of row reset is discharged. Note that the row reset performed for each of the rows at the beginning of one frame period is generally referred to as an "electronic shutter (in particular, rolling shutter) operation". By controlling the period of the electronic shutter operation, that is, by controlling the row reset timing, the exposure period can be controlled.

The exposure period is the period from the time t2 to a time t3. The exposure starts at the time t2, and a signal level in accordance with the charge generated through the exposure is read out at the time t3 (first signal readout). Thereafter, row reset is performed again, and a dark signal level obtained when no charge is generated in the FD is read out (second signal readout). The signal level serves as a reference level used when a pixel signal is obtained from a pixel. That is, the difference between the signal level obtained in the first signal readout and the signal level obtained in the second signal readout is acquired. Thereafter, row reset is performed for the next frame at a time t4. Subsequently, a similar operation is repeated. In addition, for each of the other rows, row reset and signal readout are sequentially performed in the same manner as for the first row. As used herein, the time period from the time t3 to the time t4 is referred to as a "signal readout period".

In the present specification, a period according to one frame for one row is referred to as "one frame period". In the above example, one frame period may correspond to a period from the start of the row reset period to the end of the signal readout period. That is, one frame period may correspond to a period from time t1 to time t4 in FIG. 1. And, a period according to one frame for all the rows is referred to as "one frame scanning period". In the above example, one frame scanning period may correspond to a period from the start of the row reset period of the first row to the end of the signal readout period of the last row. Note that in FIG. 1, setting is made so that the exposure period is the longest, and the row reset serving as an electronic shutter is performed immediately after the signal readout period for the previous frame, for each row. At that time, as described above, by delaying the time point for the row reset, the length of the exposure period can be decreased.

In 3Tr readout circuits, a transfer operation of charge from the light receiving unit to the FD is not performed. Accordingly, even when the light receiving unit is not fully depleted, transfer noise and a residual image are negligibly generated. In contrast, 4Tr readout circuits include a transfer transistor for transferring all the signal charge from the light receiving unit to the FD (this operation is referred to as "complete transfer"). In 4Tr readout circuits, if complete transfer fails, incomplete transfer noise and a residual image are generated. Accordingly, full depletion of the light receiving unit is required.

In organic CMOS image sensors, it is difficult to perform complete transfer because of their structures. If the structure of an organic CMOS image sensor is taken into account, a 3Tr readout circuit can be more easily applied to the sensor than a 4Tr readout circuit. However, in 3Tr readout circuits, a reset voltage applied to a plurality of pixels commonly connected in the column direction and a bias voltage applied to a bias circuit serving as a current source for reading out the voltage signals of a pixel are likely to vary row by row during the exposure period. The variations generate horizontal line noise at random. As used herein, such noise is referred to as "random horizontal line noise". In particular, in a moving image, the random horizontal line noise randomly and repeatedly appears. Thus, the random horizontal line noise is one of the factors that decrease the quality of the image.

Figure 2:
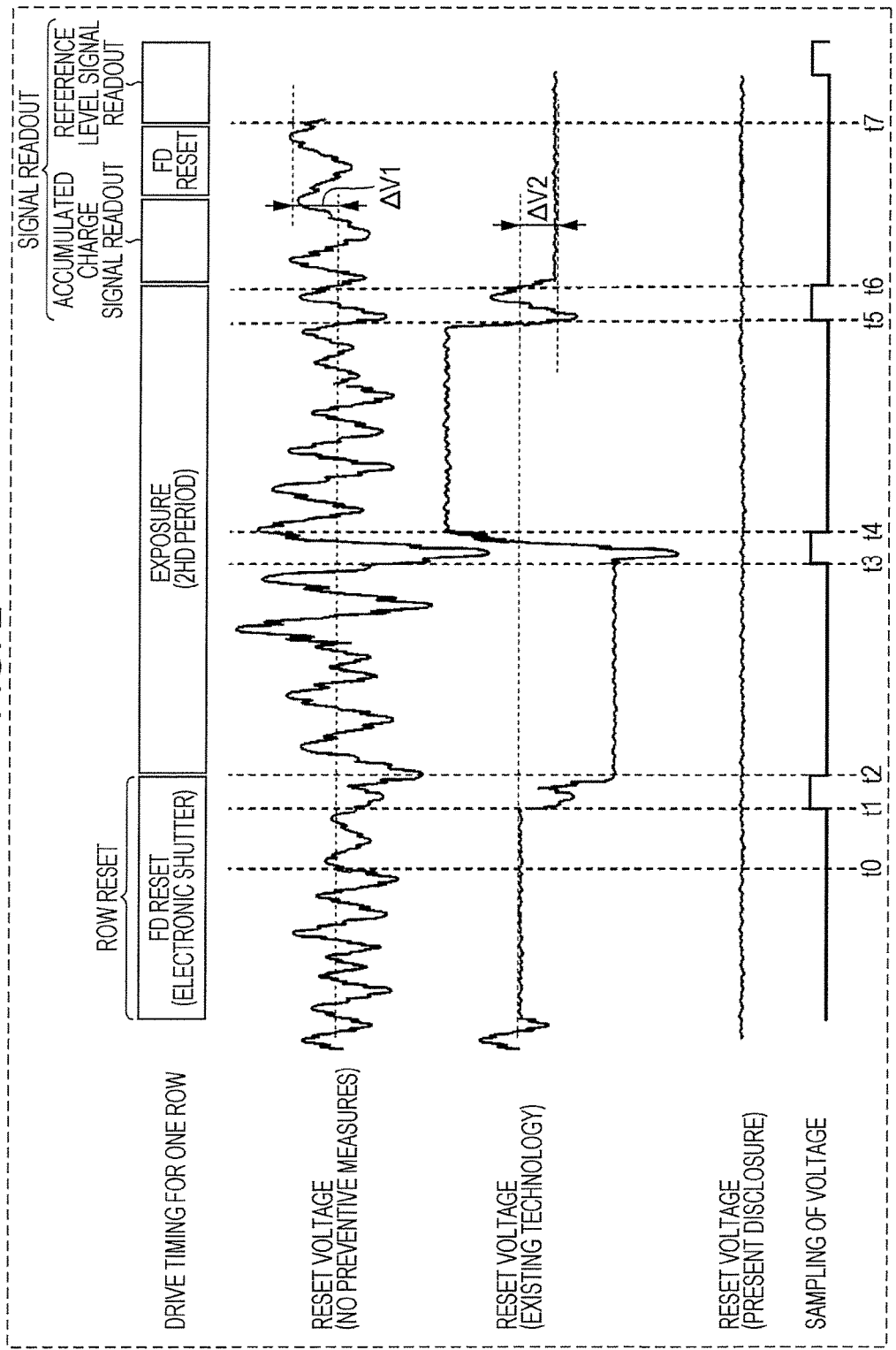
FIG. 2 illustrates a random horizontal line noise generating mechanism.

The mechanism of generation of random horizontal line noise is described below with reference to FIG. 2. FIG. 2 illustrates the random horizontal line noise generating mechanism, that is, FIG. 2 is a schematic illustration of a variation of the reset voltage during each of the row reset period, the exposure period, and the signal readout period. The reset voltage serves as a reference voltage used to reset the FD of a pixel to the reference level. The reference voltage can be provided from the outside or can be generated inside. When the reference voltage is provided from the outside, the reference voltage is influenced by the disturbance noise received from the power supply and a set board. In contrast, when the reference voltage is generated inside, the reference voltage is influenced by the thermal noise and the 1/f noise received from a transistor in a voltage generation circuit. Note that the random horizontal line noise caused by a variation of the reset voltage is generated in a 3Tr readout circuit and is not generated in a 4Tr readout circuit. The reason is described below.

In 4Tr readout circuits, a transfer transistor is connected between the photoelectric conversion unit and the FD. In such a readout circuit, the FD is reset, and a signal of a reference level is read out first. Thereafter, the transfer transistor is turned on, and the accumulated charge is transferred from the photoelectric conversion unit to the FD. Subsequently, the signal is read out. The difference between the readout signal and the reference signal is obtained as a pixel signal. As described above, since a reset operation is not performed between the two signal readout operations, random horizontal line noise caused by a variation of the reset voltage is not generated.

In contrast, in 3Tr readout circuits, the photoelectric conversion unit is not electrically insulated from the FD. As described above, two row reset operations, that is, the row reset serving as an electronic shutter to set the FD to the reference level and the row reset during the signal readout period are performed for each of the rows in one frame period. If the reset voltages in the two row reset operations vary due to the influence of the above-described noise and, thus, differ from each other, a signal offset that temporally varies row by row is added to the pixel signal. The signal offset is detectable by the eyes in the form of random horizontal line noise.

The random horizontal line noise may also be generated due to a variation of the voltage of a bias line of a current source used for reading out a voltage signal of a pixel into a vertical signal line and a variation of the voltage of a lamp voltage line used for analog-to-digital (AD) conversion. To prevent the random horizontal line noise generated by these voltage variations, a technique using a sample-and-hold circuit during a period from resetting of the FD to completion of the AD conversion is widely used. For example, the 4Tr readout circuit described in Japanese Unexamined Patent Application Publication No. 2011-109282 employs such a technique.

Even in 3Tr readout circuits, a sample-and-hold circuit can hold the reset voltage during a period from a time t1 to a time t4 (refer to FIG. 1). However, in recent years, the frame rate has been increased. Accordingly, in some cases, an image sensor is driven so that signal readout scanning during one frame period and the shutter scanning for the next frame are performed at the same time. That is, in some cases, an image sensor is driven so that a frame scanning period for one frame partially overlaps a frame scanning period for the next frame. To prevent the occurrence of random horizontal line noise, it is desirable that the reset voltage be held throughout one frame scanning period. However, according to the drive technique in which signal readout scanning and the shutter scanning according to the frames contiguous with each other are performed in an overlap period, the reset voltage holding period extends across two frames. As described above, it is difficult to increase the frame rate and reduce noise caused by a sample-and-hold operation at the same time.

As illustrated in FIG. 2, if the reset voltage is not sampled and held, the reset voltage varies at every moments. In this example, the instantaneous value of the bias voltage during the signal readout period varies by up to $\Delta V1$ when the average of the bias voltages over the row reset period serving as an electronic shutter is used as a reference value. According to the existing technology described in Japanese Unexamined Patent Application Publication No. 2011-109282, the sample-and-hold circuit holds the reset voltage during a period from the completion of signal readout of the accumulated charge through completion of signal readout of the reference level and samples a signal during the other period. By performing such an operation, a variation of the reset voltage during the signal readout period (a time period from the time t3 to the time t4 in FIG. 1) can be prevented.

However, if a 3Tr readout circuit is used, it is difficult to prevent a variation of the reset voltage caused by noise generated during the exposure period (a period from the time t2 to the time t3 in FIG. 1) by using such an operation. In an example illustrated in FIG. 2, the average of the reset voltages during the signal readout period varies by $\Delta V2$ on the basis of the average of the bias voltages during the row reset period serving as the electronic shutter (see a graph in the middle). As described above, if the reset voltage varies during one frame period, it is difficult for an existing technique to effectively prevent the random horizontal line noise.

As a result of the study of such problems, the present inventors conceived the idea of an imaging device having a novel configuration that addresses the above-described tradeoff.

The present disclosure provides imaging devices having the configurations described below.

Configuration 1

An imaging device includes a plurality of pixels arranged two-dimensionally, a row scanning circuit that generates a row scanning signal, a plurality of reset voltage lines each disposed for one of rows and connected to the pixels in the row, first and second reset voltage generating circuits capable of being electrically connected to the pixels via the reset voltage lines, where each of the first and second reset voltage generating circuits generates a reset voltage, and a first switching circuit that electrically connects one of the first and second reset voltage generating circuits to the pixels for an odd numbered frame and electrically connects the other of the first and second reset voltage generating circuits to the pixels for an even numbered frame.

The imaging device having Configuration 1 can prevent a variation of the reset voltage caused by, for example, disturbance noise or thermal noise.

Configuration 2

An imaging device includes a plurality of pixels arranged two-dimensionally, a row scanning circuit that generates a row scanning signal, a plurality of column signal lines each disposed for one of columns and connected to the pixels in the column, a plurality of inverting amplifiers each disposed for one of the columns and connected to the column signal line for the column, a plurality of feedback signal lines each disposed for one of the columns and connected to an output terminal of the inverting amplifier for the column, first and second reference voltage applying circuits capable of being electrically connected to a reference voltage input terminal of each of the inverting amplifiers via a common reference voltage line, where each of the first and second reference voltage applying circuits generates a reference voltage for the inverting amplifiers, and a second switching circuit that electrically connects one of the first and second reference voltage applying circuits to the reference voltage input terminals of the inverting amplifiers for an odd numbered frame and electrically connects the other of the first and second reference voltage applying circuits to the reference voltage input terminals of the inverting amplifiers for an even numbered frame.

The imaging device having Configuration 2 can prevent a variation of the reference voltage caused by, for example, disturbance noise or thermal noise.

Configuration 3

The imaging device of the configuration 2 further includes first and second bias circuits disposed for each of the columns and capable of being electrically connected to a plurality of load units connected to the column signal line for the column, where each of the first and second bias circuits generates a control voltage that controls the load units, and a third switching circuit that electrically connects one of the first and second bias circuits to the load units for an odd numbered frame and electrically connects the other of the first and second bias circuits to the load units for an even numbered frame.

The imaging device having Configuration 3 can prevent a variation of the bias voltage caused by, for example, disturbance noise or thermal noise.

Configuration 4

In the imaging device of any one of the configurations 1 to 3, each of the pixels includes a photoelectric conversion unit that photoelectrically converts incident light and a signal detection circuit including a reset circuit and an amplifier circuit, and the signal detection circuit detects a signal of the photoelectric conversion unit.

The amplifier circuit outputs a signal voltage in accordance with charge generated by the photoelectric conversion unit to the column signal line for the column, and the row scanning circuit supplies a control signal for controlling the reset circuit to the signal detection circuit.

According to the imaging device having the configuration 4, an organic CMOS image sensor capable of preventing random horizontal line noise can be provided.

Configuration 5

An imaging device includes a plurality of pixels arranged two-dimensionally, each including a photoelectric conversion unit, an amplifier transistor having a gate connected to the photoelectric conversion unit, and a feedback line that electrically connects a source of the amplifier transistor to the photoelectric conversion unit, a plurality of column signal lines each disposed for one of columns and connected to the pixels disposed in the column, a fourth switching circuit, and first and second drain voltage applying circuits capable of being electrically connected to a drain of the amplifier transistor via the fourth switching circuit, where each of the first and second drain voltage applying circuits generates a drain voltage of the amplifier transistor.

The source of the amplifier transistor is electrically connected to a corresponding one of the column signal lines, and the fourth switching circuit electrically connects one of the first and second drain voltage applying circuits to the drain of the amplifier transistor for an odd numbered frame and electrically connects the other of the first and second drain voltage applying circuits to the drain of the amplifier transistor for an even numbered frame.

The imaging device having Configuration 5 can prevent a variation of the drain voltage of the amplifier transistor caused by, for example, disturbance noise or thermal noise.

Configuration 6

The imaging device having Configuration 5 further includes first and second bias circuits disposed for one of the columns and capable of being electrically connected to a plurality of load units connected to the column signal line for the column, where each of the first and second bias circuits generates a control voltage that controls the load units, and a fifth switching circuit that electrically connects one of the first and second bias circuits to the load units for an odd numbered frame and electrically connects the other of the first and second bias circuits to the load units for an even numbered frame.

The imaging device having Configuration 6 can more effectively prevent the random horizontal line noise.

Configuration 7

In the imaging device of Configuration 2, 3, 5, or 6, the plurality of column signal lines include a first column signal line and a second column signal line disposed for each of the columns of the pixels.

At least some of the pixels in the same column are connected to the first column signal line, and the other pixels in the column are connected to the second column signal line.

The imaging device of Configuration 7 can capture images at high frame rate.

Configuration 8

In the imaging device of Configuration 7, at least some of the pixels in the same column are pixels disposed in the odd numbered rows of the plurality of pixels, and the other pixels in the column are pixels disposed in the even numbered rows of the plurality of pixels.

Configuration 9

In the imaging device of any one of Configurations 1 to 8, part of a row scanning period for an odd numbered frame overlaps part of a row scanning period for an even numbered frame.

The imaging device of Configuration 9 can capture images at high frame rate.

Configuration 10

An imaging device includes a plurality of pixels arranged two-dimensionally, a row scanning circuit that generates a row scanning signal, a plurality of reset voltage lines each disposed for one of rows and connected to the pixels in the row, first and second reset voltage generating circuits capable of being electrically connected to the pixels via the plurality of reset voltage lines, where each of the first and second reset voltage generating circuits generates a reset voltage, and a first switching circuit that electrically connects one of the first and second reset voltage generating circuits to the plurality of pixels during a row reset period and electrically connects the other of the first and second reset voltage generating circuits to the plurality of pixels during a pixel signal readout period.

The imaging device having Configuration 10 can prevent a variation of the reset voltage caused by, for example, disturbance noise or thermal noise.

Configuration 11

An imaging device includes a plurality of pixels arranged two-dimensionally, a row scanning circuit that generates a row scanning signal, a plurality of column signal lines each disposed for one of columns and connected to the pixels in the column, a plurality of inverting amplifiers each disposed for one of the columns and connected to the column signal line for the column, a plurality of feedback signal lines each disposed for one of the columns and connected to an output terminal of the inverting amplifier for the column, first and second reference voltage applying circuits capable of being electrically connected to a reference voltage input terminal of each of the inverting amplifiers via a common reference voltage line, where each of the first and second reference voltage applying circuits generates a reference voltage for the inverting amplifiers, and a second switching circuit that electrically connects one of the first and second reference voltage applying circuits to the reference voltage input terminals of the inverting amplifiers during a row reset period and electrically connects the other of the first and second reference voltage applying circuits to the reference voltage input terminals of the inverting amplifiers during a pixel signal readout period.

The imaging device having Configuration 11 can prevent a variation of the reference voltage caused by, for example, disturbance noise or thermal noise.

Configuration 12

The imaging device of Configuration 11 further includes first and second bias circuits disposed for each of the columns and capable of being electrically connected to a plurality of load units connected to the column signal line for the column, where each of the first and second bias circuits generates a control voltage that controls the load units, and a third switching circuit that electrically connects one of the first and second bias circuits to the load units during the row reset period and electrically connects the other of the first and second bias circuits to the load units during the pixel signal readout period.

The imaging device having Configuration 12 can prevent a variation of the bias voltage caused by, for example, disturbance noise or thermal noise.

Configuration 13

In the imaging device of one of Configurations 10 to 12, each of the plurality of pixels includes a photoelectric conversion unit that photoelectrically converts incident light and a signal detection circuit including a reset circuit and an amplifier circuit, and the signal detection circuit detects a signal of the photoelectric conversion unit.

The amplifier circuit outputs a signal voltage in accordance with charge generated by the photoelectric conversion unit to the column signal line for the column, and the row scanning circuit supplies a control signal for controlling the reset circuit to the signal detection circuit.

The imaging device having Configuration 13 can provide an organic CMOS image sensor capable of preventing random horizontal line noise.

Configuration 14

An imaging device includes a plurality of pixels arranged two-dimensionally, each including a photoelectric conversion unit, an amplifier transistor having a gate connected to the photoelectric conversion unit, and a feedback line that electrically connects a source of the amplifier transistor to the photoelectric conversion unit, a plurality of column signal lines each disposed for one of columns and connected to the pixels disposed in the column, a fourth switching circuit, and first and second drain voltage applying circuits capable of being electrically connected to a drain of the amplifier transistor via the fourth switching circuit, where each of the first and second drain voltage applying circuits generates a drain voltage of the amplifier transistor.

The source of the amplifier transistor is electrically connected to a corresponding one of the column signal lines, and the fourth switching circuit electrically connects one of the first and second drain voltage applying circuits to the drain of the amplifier transistor during a row reset period and electrically connects the other of the first and second drain voltage applying circuits to the drain of the amplifier transistor during a pixel signal readout period.

The imaging device having Configuration 14 can prevent a variation of the drain voltage of the amplifier transistor caused by, for example, disturbance noise or thermal noise.

Configuration 15

The imaging device according to Claim 14 further includes first and second bias circuits disposed for one of the columns and capable of being connected to a plurality of load units connected to a column signal line for the column, where each of the first and second bias circuits generates a control voltage that controls the load units, and a third switching circuit that electrically connects one of the first and second bias circuits to the load units during the row reset period and electrically connects the other of the first and second bias circuits to the load units during the pixel signal readout period.

The imaging device having Configuration 15 can more effectively prevent the random horizontal line noise.

Configuration 16

In the imaging device having any one of Configurations 3, 6, 12, and 15, each of the plurality of the load units includes a load transistor, and the first and second bias circuits share the plurality of the load transistors.

Configuration 17

In the imaging device having any one of Configurations 11, 12, 14, and 15, the plurality of column signal lines include a first column signal line and a second column signal line disposed for each of the columns of the pixels, at least some of the pixels in the same column are connected to the first column signal line, and the other pixels in the column are connected to the second column signal line.

Configuration 18

In the imaging device having Configuration 17, at least some of the pixels disposed in the same column are disposed in the odd numbered rows of the plurality of pixels, and the other pixels in the column are disposed in the even numbered rows of the plurality of pixels.

Configuration 19

In the imaging device having any one of Configurations 10, 11, 12, 13, 14, 15, 17, and 18, part of the row reset period overlaps part of the pixel signal readout period.

The imaging device of Configuration 19 can capture images at high frame rate.

Configuration 20

In the imaging device having Configuration 1 or 10, each of the first and second reset voltage generating circuits includes a sample-and-hold circuit.

Configuration 21

In the imaging device having any one of Configurations 3, 6, 12, 15, and 16, each of the first and second bias circuits includes a sample-and-hold circuit.

Configuration 22

In the imaging device having any one of Configurations 2, 3, 11, and 12, each of the first and second reference voltage applying circuits includes a sample-and-hold circuit.

Configuration 23

In the imaging device having any one of Configurations 5, 6, 14, and 15, each of the first and second drain voltage applying circuits includes a sample-and-hold circuit.

According to the above-described aspects of the present disclosure, since the reset voltage can be held during one frame period (refer to FIG. 2), random horizontal line noise generated during the exposure period can be prevented while maintaining a high frame rate. As a result, an imaging device capable of reducing image degradation can be provided.

Exemplary embodiments of the present disclosure are described below with reference to the accompanying drawings. Note that modifications can be performed within the scope and spirit of the disclosure as needed. In addition, one of the embodiments can be integrated with one or some of the other embodiments. In the following description, the same or similar constituent elements are designated with the same reference numerals. In this case, description is not repeated again as needed. Additionally, in the present specification, "A is electrically connected to B" means structures in which A is connected to B via one or more electric elements such as, for example, an inverting amplifier, a transistor, a switching element or a source follower, as well as structures in which A is directly connected to B by wiring.

First Exemplary Embodiment

The configuration and the functions of an imaging device according to the first exemplary embodiment are described below with reference to FIGS. 3 to 6.

Figure 3:
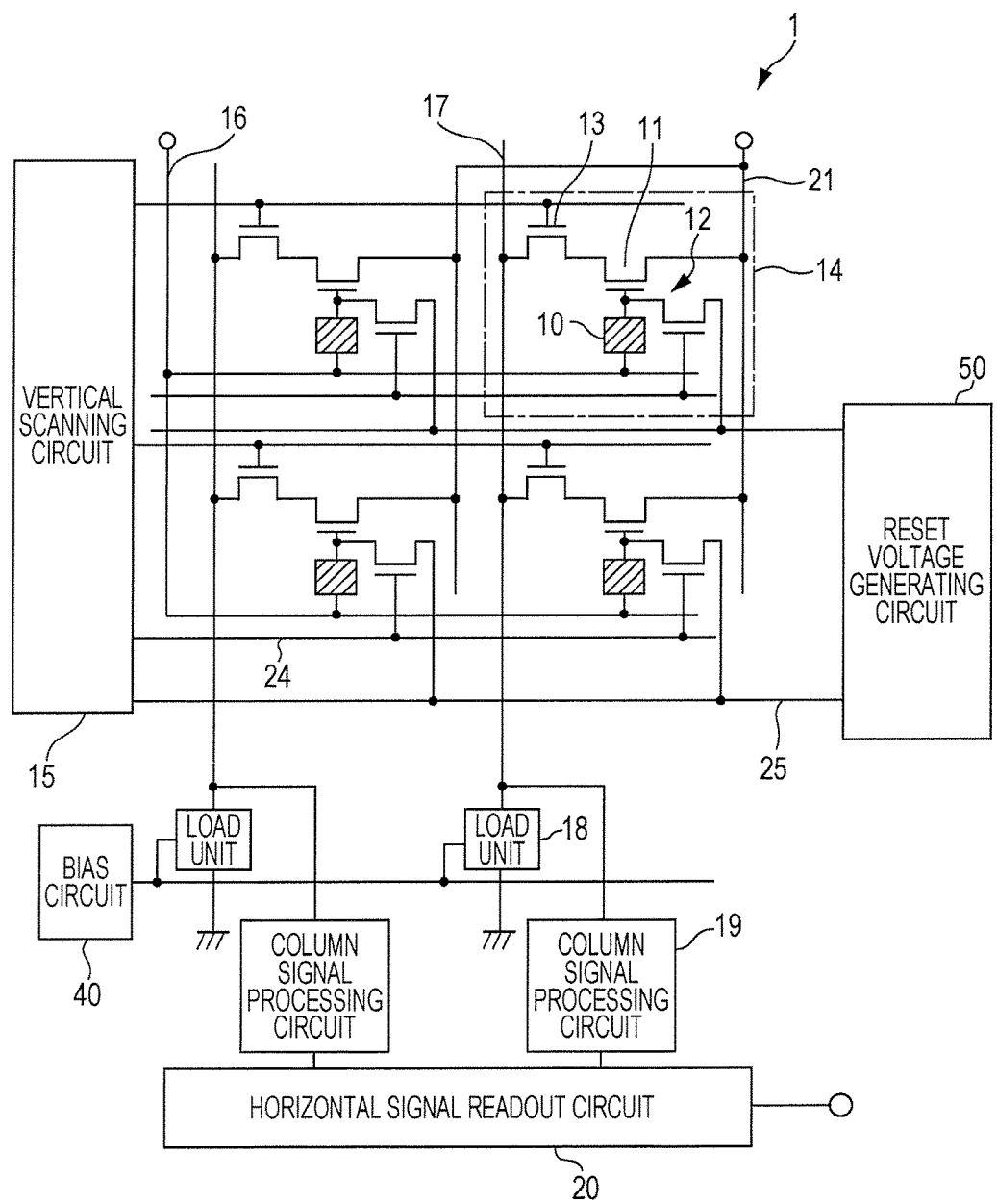
FIG. 3 is a schematic illustration of the circuit configuration of an imaging device according to a first exemplary embodiment.

FIG. 3 is a schematic illustration of the circuit configuration of an imaging device 1 according to the first exemplary embodiment. Note that four pixels 14 arranged in a 2×2 array are illustrated in FIG. 3. In reality, millions of the pixels 14 are arranged in a two-dimensional array.

The imaging device 1 includes a plurality of the pixels 14, a drive circuit unit, a photoelectric conversion unit control line 16, a plurality of vertical signal lines 17, and a power source wiring line 21. The pixels 14 are arranged two-dimensionally, that is, arranged in the row and column directions to form a photosensitive region (a pixel region). The drive circuit unit sequentially drives the pixels 14 and reads out signal charge generated through photoelectric conversion. Note that according to the present disclosure, the pixels 14 may be configured in a close-packed fashion (e.g., a configuration in which the pixels 14 are two-dimensionally arranged in a honeycomb structure).

The drive circuit unit includes, typically, a vertical scanning circuit 15, a plurality of load units 18, a plurality of column signal processing circuits 19, a horizontal signal readout circuit 20, a bias circuit 40, and a reset voltage generating circuit 50. The vertical scanning circuit 15 is also referred to as a "row scanning circuit". The horizontal signal readout circuit 20 is also referred to as a "column scanning circuit". The column signal processing circuit 19 is also referred to as a "row signal accumulating circuit".

Each of the pixels 14 includes the photoelectric conversion unit (also referred to as "photoelectric converter") 10 and a signal detection circuit. The signal detection circuit includes an amplifier transistor 11, a reset transistor 12, and an address transistor 13. The address transistor is also referred to as a "row selection transistor".

The photoelectric conversion unit 10 is electrically connected to a drain electrode of the reset transistor 12 and a gate electrode of the amplifier transistor 11 in the pixel 14 and photoelectrically converts light incident on the pixel 14. The photoelectric conversion unit 10 generates signal charge in accordance with the amount of the incident light and accumulates the signal charge.

The amplifier transistor 11 outputs a signal voltage in accordance with the amount of the signal charge generated by the photoelectric conversion unit 10. The reset transistor 12 resets (initializes) the signal charge in the photoelectric conversion unit 10. That is, the reset transistor 12 resets the voltage of the gate electrode of the amplifier transistor 11. In other word, the reset transistor 12 resets (initializes) the photoelectric conversion unit 10. The address transistor 13 selectively outputs the signal voltage from the pixel 14 to the vertical signal line 17. In this manner, the output voltage of the amplifier transistor 11 is read out of the vertical signal line 17 via the address transistor 13.

The vertical scanning circuit 15 generates a scanning signal. The vertical scanning circuit 15 is electrically connected to the pixels 14 disposed in each of the rows via a signal line corresponding to the row. The vertical scanning circuit 15 applies, to the gate electrodes of the address transistors 13, a row selection signal which controls on/off of the address transistors 13. In this manner, the rows are scanned in the column direction to select the row which is a target of readout. The signal voltages are read out from the pixels 14 in the selected row to the vertical signal lines 17. In addition, the vertical scanning circuit 15 applies a signal voltage, which controls on/off of the reset transistors 12, to the gate electrodes of the reset transistors 12 via a reset control line 24.

The photoelectric conversion unit control line 16 is commonly connected to all the pixels 14. For example, the same positive constant voltage is applied to all the photoelectric conversion units 10 in the imaging device 1 by the photoelectric conversion unit control line 16.

Each of the vertical signal lines 17 is provided so as to correspond to one of the rows of the pixels 14. The vertical signal line 17 is connected to source electrodes of the address transistors 13 in the corresponding row of the pixels 14. The vertical signal line 17 transfers the signal voltage readout from the pixel 14 in the column direction.

Each of the load units 18 (also referred to as "load circuit") is disposed so as to correspond to one of the columns. The load unit 18 includes a load transistor (not illustrated). The load transistor is typically a MOS transistor. A drain electrode of the load transistor is electrically connected to the vertical signal line 17 corresponding to the column, and a source electrode of the load transistor is connected to a reference voltage. In addition, gate electrodes of the load transistors in all of the columns are electrically connected to the bias circuit 40 via a common control line. The load unit 18 and the amplifier transistor 11 form a source follower circuit. The load unit 18 functions as a source follower current source. The amount of current of the load unit 18 is adjusted by a voltage that the bias circuit 40 supplies.

Each of the column signal processing circuits 19 is disposed so as to correspond to one of the columns. The column signal processing circuit 19 is electrically connected to the pixels 14 disposed in the corresponding column via the vertical signal line 17 corresponding to the column. The column signal processing circuit 19 performs, for example, noise reduction signal processing (typically, correlated double sampling) and analog-to-digital conversion (AD conversion).

The horizontal signal readout circuit 20 is electrically connected to the plurality of column signal processing circuits 19. The horizontal signal readout circuit 20 sequentially reads out the signals from the column signal processing circuits 19 to a horizontal common signal line (not illustrated).

The power source wiring line 21 is a wiring line for the source follower power source. The power source wiring line 21 supplies a predetermined power source voltage to the pixels 14. The power source wiring line 21 is connected to the drain electrodes of the amplifier transistors 11. The same source follower power source voltage is applied to the amplifier transistors 11 of all the pixels 14 by the power source wiring line 21.

The bias circuit 40 typically includes a sample-and-hold circuit. The bias circuit 40 generates a control voltage that controls on/off of the load transistors and applies the control voltage to the gate electrodes of the load transistors via a common control line.

The reset voltage generating circuit 50 is connected to the pixels 14 via a reset voltage lines 25. The reset voltage generating circuit 50 supplies, to the pixels 14, a reference voltage for resetting the FDs to a reference level.

In the imaging device 1, the pixels 14 in one row is sequentially selected by the vertical scanning circuit 15. The signal charge obtained through photoelectric conversion performed by the photoelectric conversion unit 10 of a selected pixel 14 is amplified by the amplifier transistor 11. The signal charge in the pixel 14 is read out into the vertical signal line 17 via the address transistor 13. The series of operations are repeatedly performed during each of horizontal scanning periods in one frame scanning period.

Configuration and Operation of Reset Voltage Generating Circuit

Figure 4A:
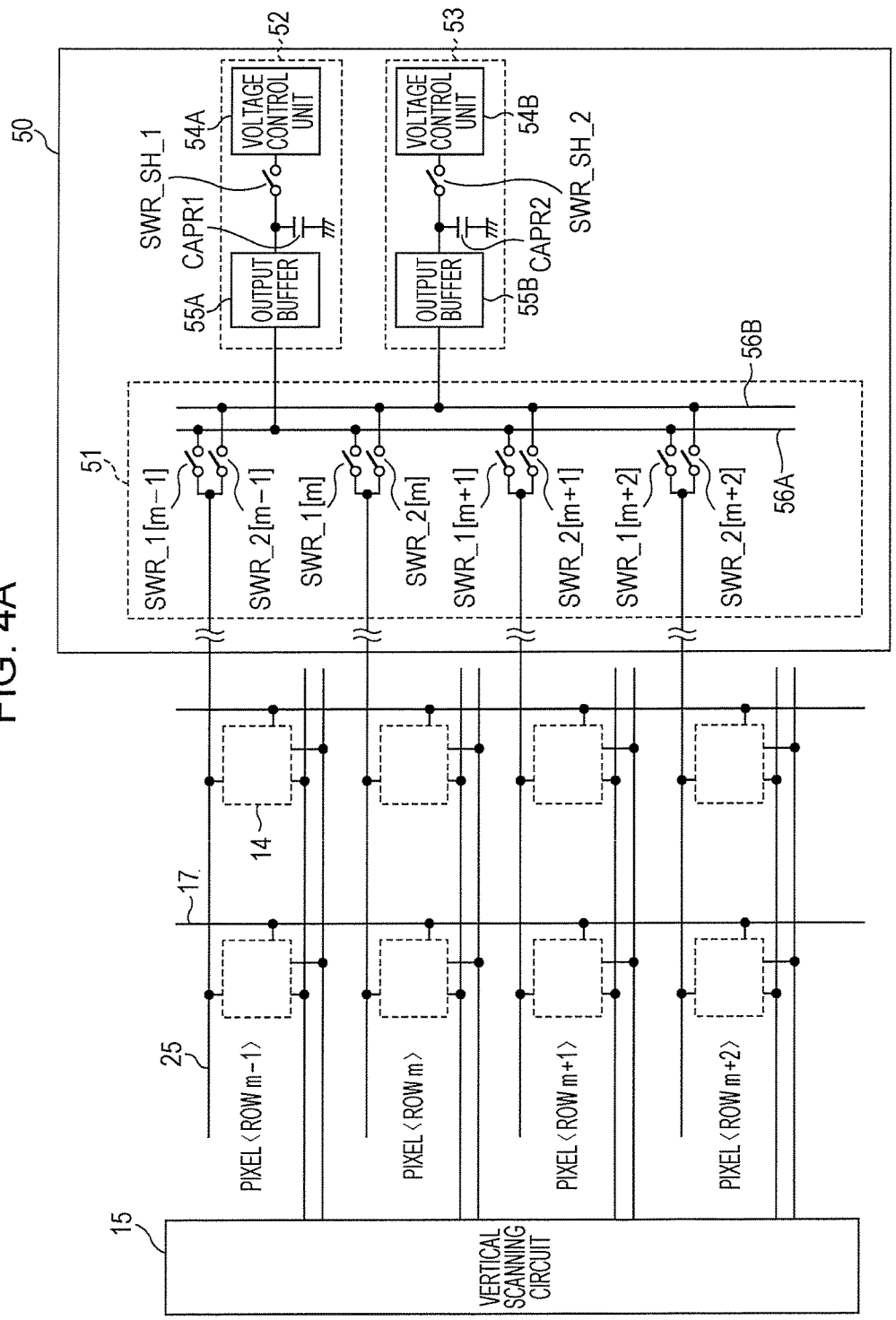
FIG. 4A is a schematic illustration of an exemplary circuit configuration of a reset voltage generating circuit.

FIG. 4A is a schematic illustration of an exemplary circuit configuration of the reset voltage generating circuit 50. An exemplary connection relationship between the reset voltage generating circuit 50 and each of the reset voltage lines 25 corresponding to the (m−1)th row to the (m+2)th row (m is an integer greater than or equal to 1) is illustrated in FIG. 4A.

The reset voltage generating circuit 50 includes a first switching circuit 51, a first reset voltage generating circuit 52, and a second reset voltage generating circuit 53. The first reset voltage generating circuit 52 and the second reset voltage generating circuit 53 can be electrically connected to the plurality of pixels 14 via the first switching circuit 51.

In the exemplary configuration illustrated in FIG. 4A, the first switching circuit 51 has two switches for each of the rows. For example, the (m−1)th row has a switch SWR_1[m−1] and a switch SWR_2[m−1] provided therefor, where m is an integer greater than or equal to 1. The switch SWR_1[m−1] is connected to the first reset voltage generating circuit 52 via a common signal line 56A. The switch SWR_2[m−1] is connected to the second reset voltage generating circuit 53 via a common signal line 56B.

Each of the first reset voltage generating circuit 52 and the second reset voltage generating circuit 53 can include a sample-and-hold circuit. In the illustrated example, the first reset voltage generating circuit 52 includes an output buffer 55A, a capacitor CAPR1, a switch SWR_SH_1, and a voltage control unit 54A. In contrast, the second reset voltage generating circuit 53 includes an output buffer 55B, a capacitor CAPR2, a switch SWR_SH_2, and a voltage control unit 54B. The capacitors CAPR1 and CAPR2 and the voltage control units 54A and 54B may be disposed outside the imaging device 1.

Each of the voltage control units 54A and 54B generates the reset voltage. The magnitudes of the reset voltages generated by the voltage control units 54A and 54B are equivalent to each other. In other word, the magnitudes are equivalent to each other to the extent that the noise due to the difference of these reset voltages cannot be recognized in the resulting image. If the switch SWR_SH_1 is turned on, the output voltage from the voltage control unit 54A is charged in the capacitor CAPR1 as the reset voltage. This operation is referred to as "sampling". If the switch SWR_SH_1 is turned off, the sample operation is completed, and sampled voltage signal is held by the capacitor CAPR1. This operation is referred to as "hold". As in the first reset voltage generating circuit 52, a sample-and-hold operation is performed in the second reset voltage generating circuit 53 by turning on and off the switch SWR_SH_2.

As used herein, the phrase "causing the sample-and-hold circuit to perform the hold operation" is referred to as "enabling the circuit". In addition, "causing the sample-and-hold circuit to perform the sample operation" is referred to as "disabling the circuit". Furthermore, the holding period is referred to as an "enabled period", and the sampling period is referred to as a "disabled period".

The voltage signals held by the capacitors CAPR1 and CAPR2 are output to the first switching circuit 51 via the output buffers 55A and 55B, respectively. The first switching circuit 51 can be controlled by, for example, a peripheral logic circuit (not illustrated). The first switching circuit 51 performs exclusive control (or complementary control) over the switches so that one of switches SWR_1[m−1] and SWR_2[m−1] is turned on and the other is turned off for a selected row. For an unselected row, each of switches SWR_1[m−1] and SWR_2[m−1] may be turned on or off.

If the switch SWR_1[m−1] is turned on and the switch SWR_2[m−1] is turned off, the first reset voltage generating circuit 52 is electrically connected to the pixels 14 in the corresponding row (the (m−1)th row), and the reset voltage is supplied from the first reset voltage generating circuit 52 to the pixels 14. In contrast, if the switch SWR_1[m−1] is turned off and the switch SWR_2[m−1] is turned on, the second reset voltage generating circuit 53 is electrically connected to the pixels 14 in the corresponding row (the (m−1)th row), and the reset voltage is supplied from the second reset voltage generating circuit 53 to the pixels 14. As illustrated in FIG. 4A, by providing the switches SWR_1 and SWR_2 for each of the rows of the pixels 14, the control that is more flexible than existing control can be provided and, thus, there are more choices than ever before for the driving method.

In the exemplary configuration illustrated in FIG. 4A, the reset voltage generating circuit 50 includes the first reset voltage generating circuit 52 and the second reset voltage generating circuit 53 each having an independent voltage control unit. That is, as described above with reference to FIG. 4A, the first reset voltage generating circuit 52 and the second reset voltage generating circuit 53 include the voltage control unit 54A and the voltage control unit 54B, respectively. However, the configuration of the reset voltage generating circuit is not limited to such an example.

Figure 4B:
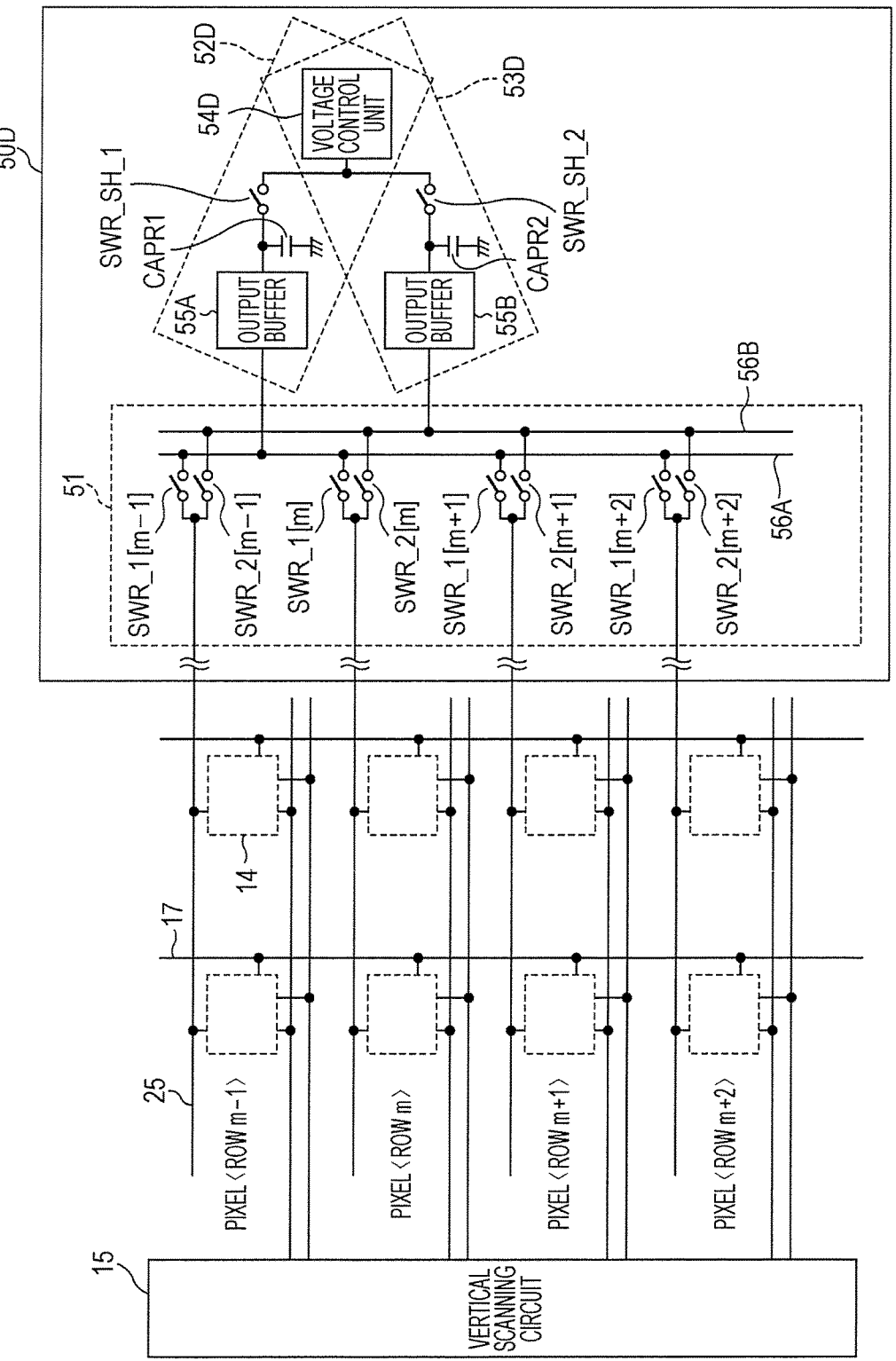
FIG. 4B is a schematic illustration of an example of the configuration of a reset voltage generating circuit including a single voltage control unit.

FIG. 4B illustrates an example of the configuration of the reset voltage generating circuit including a single voltage control unit. As illustrated in FIG. 4B, a reset voltage generating circuit 50D includes a first reset voltage generating circuit 52D and a second reset voltage generating circuit 53D each including a sample-and-hold circuit. The first reset voltage generating circuit 52D includes the output buffer 55A, the capacitor CAPR1, the switch SWR_SH_1, and a voltage control unit 54D. The second reset voltage generating circuit 53D includes the output buffer 55B, the capacitor CAPR2, the switch SWR_SH_2, and the voltage control unit 54D. That is, in this example, the voltage control unit 54D is shared by the first reset voltage generating circuit 52D and the second reset voltage generating circuit 53D. By allowing the first reset voltage generating circuit 52D and the second reset voltage generating circuit 53D to share the voltage control unit 54D, the size of the drive circuit unit can be reduced, as compared with the case in which a plurality of voltage control units are provided. Like the voltage control units 54A and 54B, the voltage control unit 54D may be disposed inside the imaging device 1. Alternatively, the voltage control unit 54D may be disposed outside the imaging device 1. As described above, the reset voltage may be generated by the shared voltage control unit 54D.

One Frame Scanning Period Hold

Figure 5:
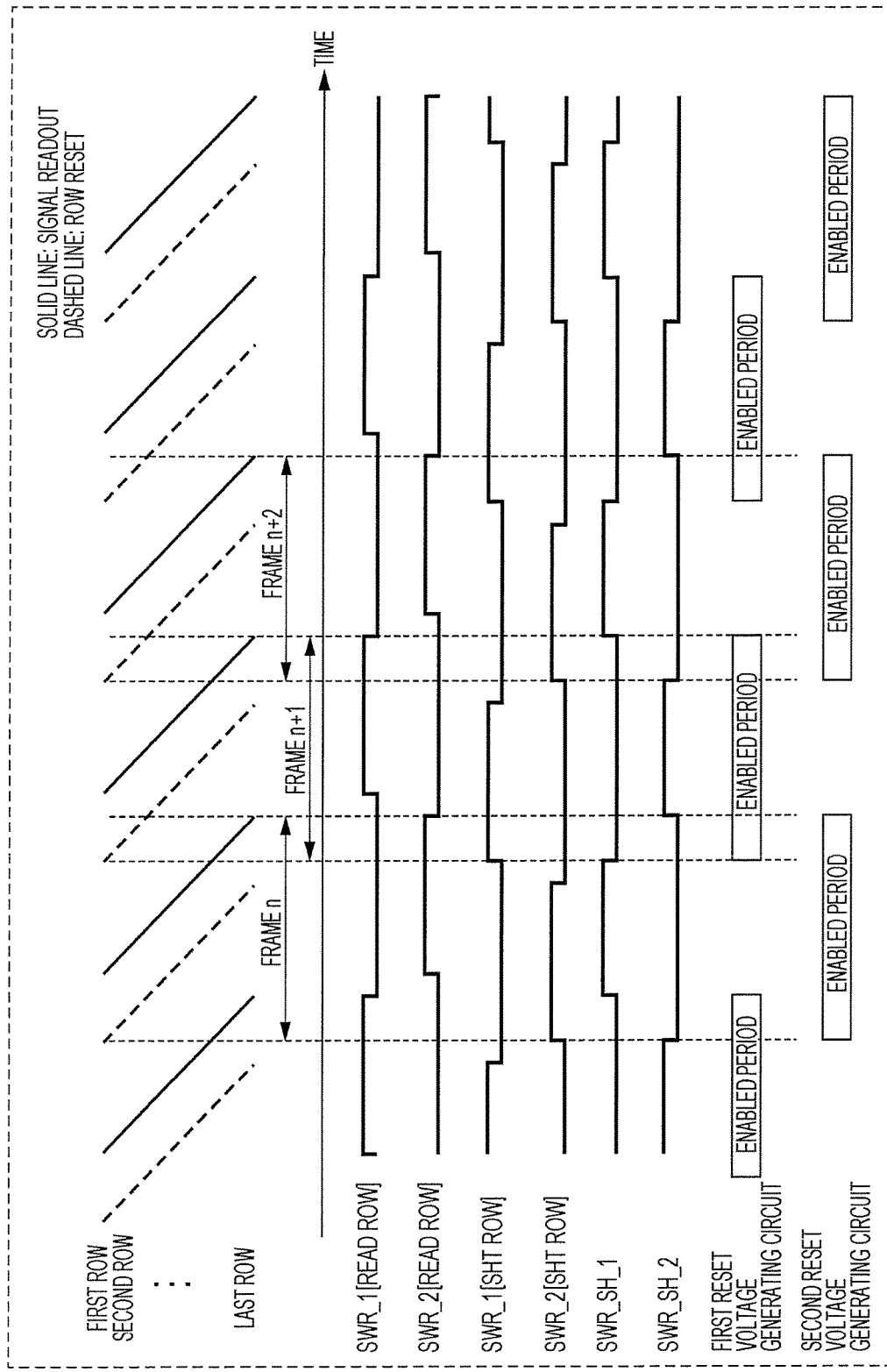
FIG. 5 is a timing diagram illustrating the drive timing of the imaging device according to the first exemplary embodiment.

FIG. 5 is an example of the drive timing diagram of the imaging device 1 according to the present exemplary embodiment. In FIG. 5, one frame scanning period is indicated by, for example, the arrow "FRAME n", and the timing of the row reset for each of the rows during one frame scanning period is indicated by a diagonal dashed line, and the timing of signal readout for each of the rows is indicated by a diagonal solid line. The period of the row reset for each of the rows from the first row to the last row is defined as the row reset period, and the period of the signal readout for each of the rows from the first row to the last row is defined as the signal readout period. In the following description, an n-th frame (frame n) represents an even numbered frame, and an (n+1)th frame (frame n+1) represents an odd numbered frame.

As used herein, a row from which the signal is to be read out is referred to as a "READ row", and a row to be subjected to row reset is referred to as a "SHT row". Each of the switches of the first switching circuit 51 is turned on if, for example, the control signal is "High" and is turned off if the control signal is "Low". However, the polarity of the switch is not limited thereto. For example, the polarity of the switch may be reversed. That is, when, for example, the (m−1)th row is discussed, the switches SWR_1[m−1] and SWR_2[m−1] may be controlled so as to be turned off when the control signal is "High" and be turned on when the control signal is "Low". The first switching circuit 51 electrically connects the first reset voltage generating circuit 52 to the pixels 14 in the (m−1)th row if the switch SWR_1[m−1] is turned on. The first switching circuit 51 electrically connects the second reset voltage generating circuit 53 to the pixels 14 in the (m−1)th row if the switch SWR_2[m−1] is turned on. Although not illustrated, the control signal to control the switches SWR_1 and SWR_2 corresponding to an unselected row is fixed at "Low" or "High".

In the example illustrated in FIG. 5, in the n-th frame scanning period, the control signal to control the switch SWR_2 for an SHT row is fixed at "High" during the row reset period. During the signal readout period, the control signal to control the switch SWR_2 for a READ row is fixed at "High". As schematically indicated by the diagonal dashed lines and the diagonal solid lines in FIG. 5, the SHT row and READ row are changed throughout the rows from the first row to the last row due to scanning of the row that is the target of readout performed by the vertical scanning circuit 15.

As illustrated in FIG. 5, during the n-th frame scanning period, the control signal to control the switch SWR_SH_2 of the second reset voltage generating circuit 53 is fixed at "Low", and the switch SWR_SH_2 is turned off. Since the switch SWR_SH_2 is set to off, the voltage signal held by the capacitor CAPR2 is supplied to the pixels 14 in the selected row via the first switching circuit 51 due to the hold operation performed by the sample-and-hold circuit. In contrast, during the n-th frame scanning period other than the periods overlapping with the (n−1)th frame scanning period and the (n+1)th frame scanning period, the control signal to control the switch SWR_SH_1 of the first reset voltage generating circuit 52 is fixed at "High", and the switch SWR_SH_1 is set to on. Since the switch SWR_SH_1 is set to on, the reset voltage is charged in the capacitor CAPR1. That is, the sample-and-hold circuit of the first reset voltage generating circuit 52 samples the voltage signal in part of the n-th frame scanning period.

In contrast, in the (n+1)th frame scanning period, the control signal to control the switch SWR_1 for a SHT row is fixed at "High" during the row reset period. During the signal readout period, the control signal to control the switch SWR_1 for a READ row is fixed at "High". As described above, the SHT row and READ row change throughout the rows from the first row to the last row.

During the (n+1)th frame scanning period, the control signal to control the switch SWR_SH_1 of the first reset voltage generating circuit 52 is fixed at "Low", and the switch SWR_SH_1 is turned off. Since the switch SWR_SH_1 is set to off, the voltage signal held by the capacitor CAPR1 is supplied to the pixels 14 in the selected row via the first switching circuit 51 due to the hold operation performed by the sample-and-hold circuit. In contrast, during the (n+1)th frame scanning period other than the periods overlapping with the n-th frame scanning period and the (n+2)th frame scanning period, the control signal to control the switch SWR_SH_2 of the second reset voltage generating circuit 53 is fixed at "High", and the switch SWR_SH_2 is set to on. Since the switch SWR_SH_2 is set to on, the reset voltage is charged in the capacitor CAPR2. That is, the sample-and-hold circuit of the first reset voltage generating circuit 52 samples the voltage signal in part of the n-th frame scanning period, while the sample-and-hold circuit of the second reset voltage generating circuit 53 samples the voltage signal in part of the (n+1)th frame scanning period.

According to the above-described driving method, the first reset voltage generating circuit 52 and the second reset voltage generating circuit 53 can be alternately switched between the (n+1)th frame period and the n-th frame period using the first switching circuit 51 and, thus, the pixels 14 in the READ row or the SHT row can be connected thereto. Since, according to the operation described with reference to FIG. 5, the hold operation performed by the sample-and-hold circuit can be maintained throughout one frame scanning period, the variation of the reset voltage caused by, for example, disturbance noise or thermal noise can be prevented. As a result, the random horizontal line noise can be effectively reduced. Note that during the n-th frame scanning period, the first reset voltage generating circuit 52 may be enabled, and the second reset voltage generating circuit 53 may be disabled. During the (n+1)th frame scanning period, the first reset voltage generating circuit 52 may be disabled, and the second reset voltage generating circuit 53 may be enabled.

Row Reset Period Hold and Signal Readout Period Hold

A driving method that differs from the driving method illustrated in FIG. 5 is described below with reference to FIG. 6.

Figure 6:
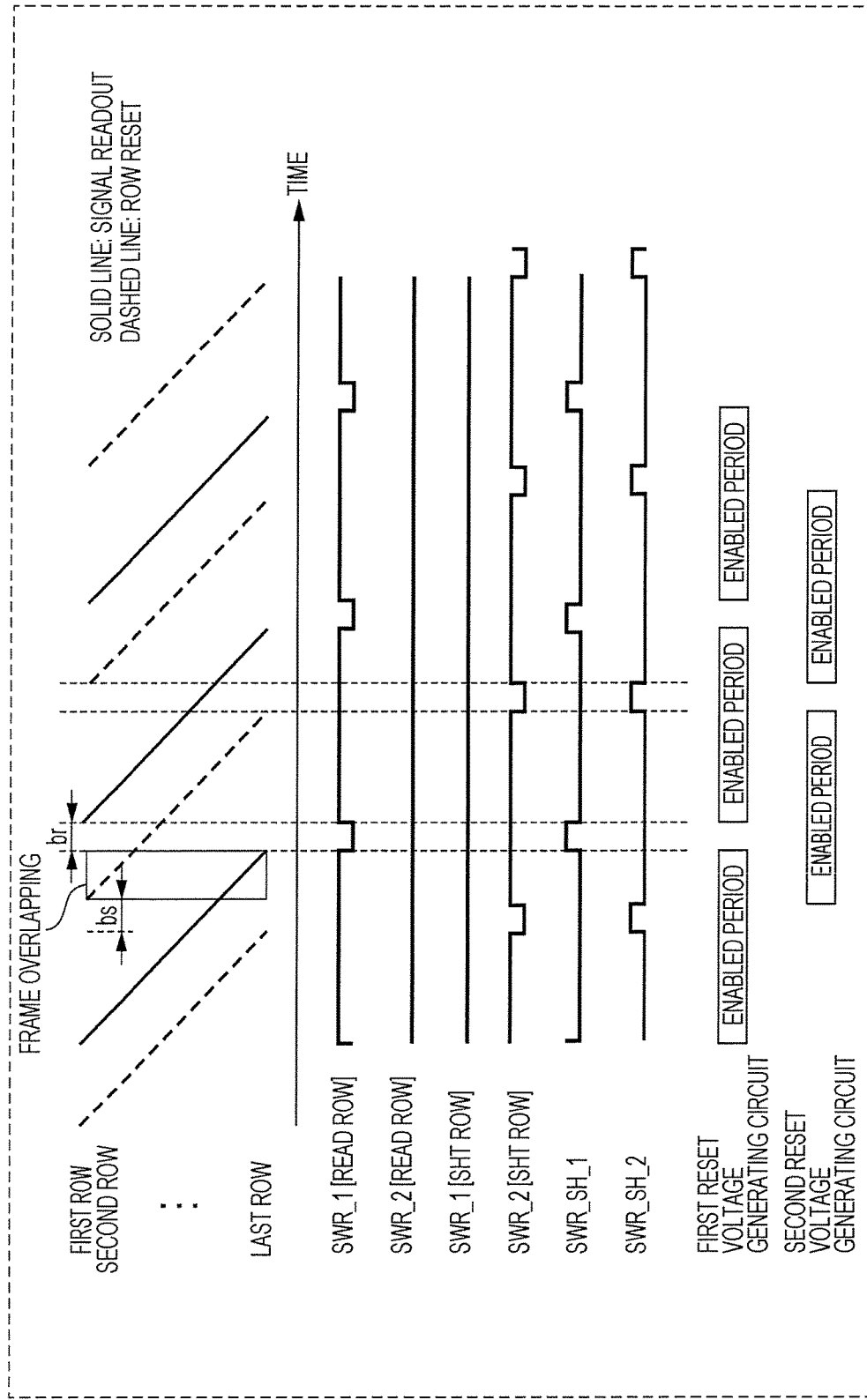
FIG. 6 is a timing diagram illustrating another drive timing of the imaging device according to the first exemplary embodiment.

FIG. 6 is an example of a drive timing diagram of the imaging device 1 other than that illustrated in FIG. 5 according to the present exemplary embodiment. Although not illustrated, as in the example described with reference to FIG. 5, in this example, the control signal for each of the switches SWR_1 and SWR_2 corresponding to an unselected row is fixed at "Low" or "High".

According to the driving method, the first switching circuit 51 electrically connects one of the first reset voltage generating circuit 52 and the second reset voltage generating circuit 53 to the pixels 14 in the selected row during the row reset period in one frame scanning period and electrically connects the other to the pixels 14 in the selected row during the pixel signal readout period in the one frame scanning period.

In the example illustrated in FIG. 6, the control signal to control the switch SWR_2 for a SHT row is set to "High" during the row reset period in one frame scanning period. As a result, the pixels 14 (the pixels 14 in the SHT row) are electrically connected to the second reset voltage generating circuit 53. At that time, the first reset voltage generating circuit 52 is electrically disconnected from the pixels 14 (the pixels 14 in the SHT row).

As illustrated in FIG. 6, in this example, the control signal to control the switch SWR_SH_2 of the second reset voltage generating circuit 53 is fixed at "Low". Accordingly, during the row reset period, the second reset voltage generating circuit 53 is enabled. That is, since the switch SWR_SH_2 is set to off, the reset voltage held in the capacitor CAPR2 through the hold operation performed by the sample-and-hold circuit is supplied to the pixels 14 in the SHT row via the first switching circuit 51. In this example, by fixing the control signal to control the switch SWR_SH_2 of the second reset voltage generating circuit 53 at "High" during a period other than the row reset period (a SHT blanking period bs), the capacitor CAPR2 of the second reset voltage generating circuit 53 is charged, that is, sampling is performed.

In contrast, the control signal to control the switch SWR_1 for a READ row is fixed at "High" during the signal readout period in the one frame scanning period. As a result, the pixels 14 (the pixels 14 in the READ row) are electrically connected to the first reset voltage generating circuit 52. At that time, the second reset voltage generating circuit 53 is electrically disconnected from the pixels 14 (the pixels 14 in the READ row).

That is, in this example, the first reset voltage generating circuit 52 is enabled during the signal readout period. That is, the control signal to control the switch SWR_SH_1 of the first reset voltage generating circuit 52 is fixed at "Low". Accordingly, the switch SWR_SH_1 is set to off. Thus, the reset voltage held in the capacitor CAPR1 through the hold operation performed by the sample-and-hold circuit is supplied to the pixels 14 in the READ row via the first switching circuit 51. In this example, by fixing the control signal to control the switch SWR_SH_1 of the first reset voltage generating circuit 52 to "High" during a period other than the signal readout period (a READ blanking period br), the capacitor CAPR1 of the first reset voltage generating circuit 52 is charged, that is, sampling is performed.

According to the driving method, the hold operation performed by the sample-and-hold circuit of one of the first reset voltage generating circuit 52 and the second reset voltage generating circuit 53 can be maintained during the entire row reset period and the entire signal readout period. Unlike the hold during the entire one frame scanning period described with reference to FIG. 5, noise is inevitably generated. However, since the noise is equally distributed across all the rows. As a result, the horizontal line noise is not detectable by the eyes. This driving method is effective in a long exposure mode, such as a mode used when the image of a starry sky is captured. Note that the first reset voltage generating circuit 52 may be enabled and the second reset voltage generating circuit 53 may be disabled during the row reset period in the frame scanning period. In addition, the first reset voltage generating circuit 52 may be disabled and the second reset voltage generating circuit 53 may be enabled during the signal readout period in the frame scanning period.

Second Exemplary Embodiment

A second exemplary embodiment of the present disclosure is described below with reference to FIGS. 7 to 12. Unlike the imaging device 1 according to the first exemplary embodiment, an imaging device according to the present exemplary embodiment includes a reference voltage applying circuit 30 including a second switching circuit 62. The present exemplary embodiment is applied to a reference voltage applying circuit of a column feedback structure. Hereinafter, description of a constituent element that is the same as that of the imaging device 1 according to the first exemplary embodiment is not repeated. The configuration and the operation of the reference voltage applying circuit are mainly described below.

Figure 7:
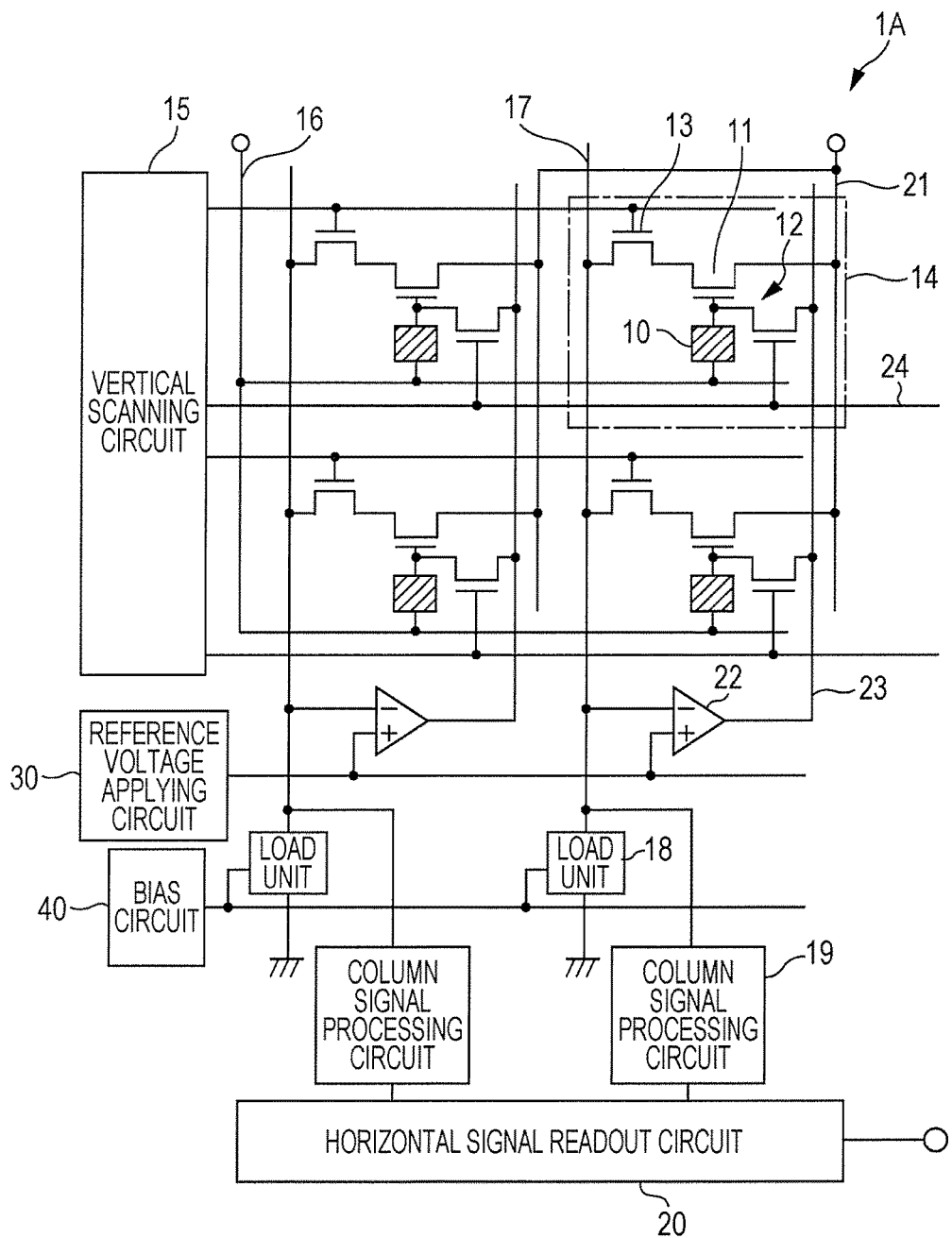
FIG. 7 is a schematic illustration of the circuit configuration of an imaging device according to a second exemplary embodiment.

FIG. 7 is a schematic illustration of the circuit configuration of an imaging device 1A according to a second exemplary embodiment of the present disclosure. FIG. 8A is a schematic illustration of a typical example of the circuit configuration of the reference voltage applying circuit 30 included in the imaging device 1A. An example of a connection relationship between the reference voltage applying circuit 30 and an inverting amplifier 22 for each of the i-th row and the (i+1)th row (i is an integer greater than or equal to 0) is illustrated in FIG. 8A.

As schematically illustrated in FIG. 7, the imaging device 1A includes a plurality of pixels 14, a drive circuit unit, a photoelectric conversion unit control line 16, a plurality of vertical signal lines 17, a power source wiring line 21, and a plurality of feedback lines 23. In the example of configuration illustrated in FIG. 7, the drive circuit unit typically includes a vertical scanning circuit 15, a plurality of load units 18, a plurality of column signal processing circuits 19, a horizontal signal readout circuit 20, a plurality of the inverting amplifiers 22, the reference voltage applying circuit 30, and a bias circuit 40. Note that the inverting amplifier 22 is also referred to as a "feedback amplifier".

Each of the inverting amplifiers 22 is disposed so as to correspond to one of the columns. A negative input terminal of the inverting amplifier 22 is connected to a corresponding vertical signal line 17. A positive input terminal of the inverting amplifier 22 is electrically connected to the reference voltage applying circuit 30 via a reference voltage line that is common to the columns of the pixels 14. In addition, the output terminal of the inverting amplifier 22 is connected to the drains of the reset transistors 12 of the pixels 14 via a corresponding one of the feedback lines 23, each corresponding to one of the columns.

When the address transistor 13 and the reset transistor 12 are set to on, the inverting amplifier 22 receives the output of the address transistor 13 using the negative input terminal. That is, the inverting amplifier 22 performs a feedback operation so that the gate voltage of the amplifier transistor 11 is equal to a predetermined feedback voltage. Through the negative feedback control, thermal noise referred to as kTC noise and generated in the reset transistor 12 can be prevented.

The reference voltage applying circuit 30 typically includes a sample-and-hold circuit. Sample-and-hold circuits typically include a capacitor. Sample-and-hold circuits sample and hold a predetermined signal voltage. The reference voltage applying circuit 30 applies a reference voltage for the inverting amplifier 22 to the positive input terminals of the inverting amplifiers 22 via a common reference voltage line. In a circuit configuration that is illustrated in FIG. 8A as an example and that prevents thermal noise by negative feedback control using the inverting amplifier 22, the reference voltage is used as a voltage that determines the reference level of the FD of a pixel. Accordingly, to prevent random horizontal line noise, it is effective if a variation of the reference voltage is prevented.

In the example of configuration illustrated in FIG. 8A, the reference voltage applying circuit 30 includes a first reference voltage applying circuit 60, a second reference voltage applying circuit 61, and a second switching circuit 62. The first reference voltage applying circuit 60 and the second reference voltage applying circuit 61 can be electrically connected to the positive input terminals of the inverting amplifiers 22 via the second switching circuit 62.

In the example of configuration illustrated in FIG. 8A, the second switching circuit 62 includes a switch SWV_1 and a switch SWV_2 for each of the columns. The switch SWV_1 for each of the columns is connected to the first reference voltage applying circuit 60 via a common signal line 63A. The switch SWV_2 for each of the columns is connected to the second reference voltage applying circuit 61 via a common signal line 63B.

Each of the first reference voltage applying circuit 60 and the second reference voltage applying circuit 61 can include a sample-and-hold circuit. In the example illustrated in FIG. 8A, the first reference voltage applying circuit 60 includes an output buffer 65A, a capacitor CAPV1, a switch SWV_SH_1, and a voltage control unit 64A. In contrast, the second reference voltage applying circuit 61 includes an output buffer 65B, a capacitor CAPV2, a switch SWV_SH_2, and a voltage control unit 64B. The capacitors CAPV1 and CAPV2 and the voltage control units 64A and 64B are disposed outside the imaging device 1A.

Each of the first reference voltage applying circuit 60 and the second reference voltage applying circuit 61 generates a reference voltage for the inverting amplifiers 22. The magnitudes of the reference voltages generated by the first reference voltage applying circuit 60 and the second reference voltage applying circuit 61 are equivalent to each other. In other word, the magnitudes are equivalent to each other to the extent that the noise due to the difference of these reference voltages cannot be recognized in the resulting image. If the switch SWV_SH_1 is turned on, the output voltage from the voltage control unit 64A is charged in the capacitor CAPV1 as the reference voltage. This operation is referred to as "sampling". If the switch SWV_SH_1 is turned off, the sample operation is completed, and sampled voltage signal is held by the capacitor CAPV1. This operation is referred to as "hold". As in the first reference voltage applying circuit 60, in the second reference voltage applying circuit 61, by turning on and off the switch SWVSH_2, a sample-and-hold operation is performed.

The voltage signals held by the capacitors CAPV1 and CAPV2 are output to the second switching circuit 62 via the output buffers 65A and 65B, respectively. The second switching circuit 62 can be controlled by, for example, a peripheral logic circuit (not illustrated). The second switching circuit 62 performs exclusive control over the switches so that one of the switches SWV_1 and SWV_2 is turned on and the other is turned off.

If the switch SWV_1 is turned on and the switch SWV_2 is turned off, the first reference voltage applying circuit 60 is electrically connected to the inverting amplifier 22 for the column for which the switch SWV_1 is turned on and, thus, the reference voltage is supplied from the first reference voltage applying circuit 60 to the inverting amplifier 22. In contrast, if the switch SWV_1 is turned off and the switch SWV_2 is turned on, the second reference voltage applying circuit 61 is electrically connected to the inverting amplifiers 22 for the column for which the switch SWV_2 is turned on and, thus, the reference voltage is supplied from the second reference voltage applying circuit 61 to the inverting amplifiers 22.

In the example of configuration illustrated in FIG. 8A, the reference voltage applying circuit 30 includes the first reference voltage applying circuit 60 and the second reference voltage applying circuit 61 each including an independent voltage control unit. However, the configuration is not limited to this example. For example, as illustrated in FIG. 8B, a reference voltage applying circuit 30D described below may be employed. That is, the reference voltage applying circuit 30D includes a first reference voltage applying circuit 60D and a second reference voltage applying circuit 61D which share a voltage control unit 64D. Since the voltage control unit is shared, the size of the drive circuit unit can be reduced. The voltage control unit 64D may be disposed either inside or outside the imaging device 1A.

One Frame Scanning Period Hold

Figure 10:
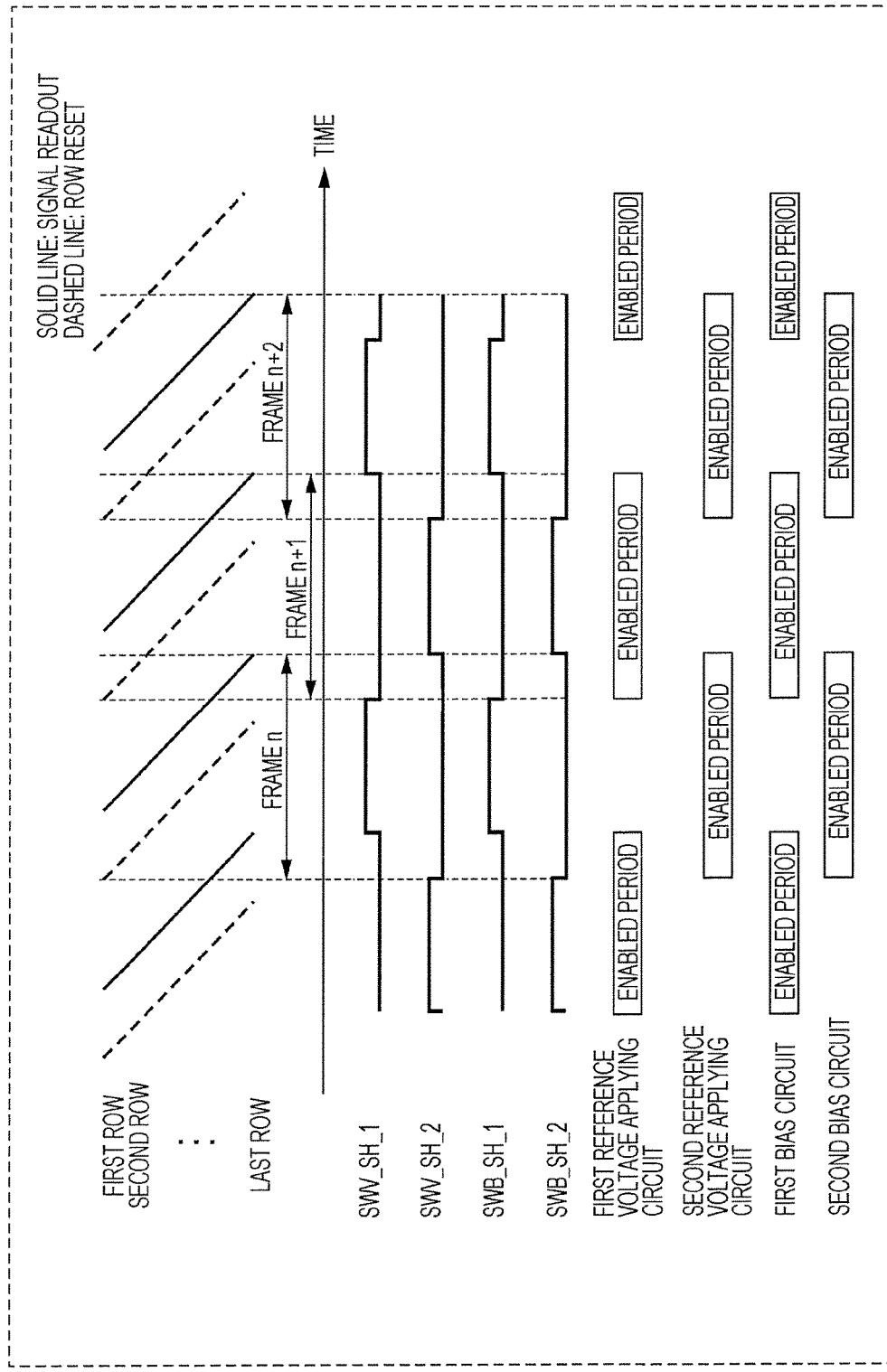
FIG. 10 is a timing diagram illustrating the enabled period of each of a first reference voltage applying circuit and a second reference voltage applying circuit in consecutive frame scanning period.

FIG. 9 illustrates an example of a timing diagram of the imaging device 1A according to the present exemplary embodiment. An HD signal in FIG. 9 is a start pulse for a horizontal scanning signal. More specifically, FIG. 9 illustrates a typical example of the waveforms of control signals for the switches SWV_1 and SWV_2 in a period for which the n-th frame scanning period overlaps the (n+1)th frame scanning period and its vicinity when 10 rows are provided and the blanking period is set to half of one horizontal scanning period (1H period) and the exposure period is set to two horizontal scanning period (2H). Note that in a blanking period, no row reset and no signal readout are performed. FIG. 10 illustrates the enabled period of each of the first reference voltage applying circuit 60 and the second reference voltage applying circuit 61 between two consecutive frames.

In the following description, it is assumed that the switches SWV_1 and SWV_2 of the second switching circuit 62 are turned on when the control signal is "High" and are turned off when the control signal is "Low". However, the polarities of the switches are not limited thereto. The polarities of the switches may be reversed. That is, each of the switches SWV_1 and SWV_2 may be driven so as to be turned off when the control signal is "High" and be turned on when the control signal is "Low".

The second switching circuit 62 electrically connects one of the first reference voltage applying circuit 60 and the second reference voltage applying circuit 61 to the plurality of inverting amplifiers 22 in the row reset period and the signal readout period according to the (n+1)th frame and electrically connects the other to the plurality of inverting amplifiers 22 in the row reset period and the signal readout period according to the n-th frame.

In the example illustrated in FIG. 9, the control signal to control the switch SWV_2 is fixed at "High", and the control signal to control the switch SWV_1 is fixed at "Low" in the row reset period and the signal readout period according to the n-th frame. Thus, the second reference voltage applying circuit 61 is electrically connected to the plurality of inverting amplifiers 22, and the first reference voltage applying circuit 60 is electrically disconnected from the inverting amplifiers 22. Note that in FIGS. 9 and 10, the waveforms of signals in the middle ("SWB_1", "SWB_2", "SWB_SH_1" and "SWB_SH_2") are described in more detail below.

As illustrated in FIG. 10, in the n-th frame scanning period, the control signal to control the switch SWV_SH_2 of the second reference voltage applying circuit 61 is fixed at "Low", and the switch SWV_SH_2 is turned off. Since the switch SWR_SH_2 is set to off, the voltage signal held by the capacitor CAPV2 through the hold operation of the sample-and-hold circuit is supplied to the inverting amplifiers 22 via the second switching circuit 62. In contrast, during the n-th frame scanning period other than the periods overlapping with the (n−1)th frame scanning period and the (n+1)th frame scanning period, the control signal to control the switch SWV_SH_1 of the first reference voltage applying circuit 60 is fixed at "High", and the switch SWV_SH_1 is set to on. When the switch SWV_SH_1 is on, the reference voltage for the inverting amplifiers 22 is charged in the capacitor CAPV1. That is, the sample-and-hold circuit of the first reference voltage applying circuit 60 samples the voltage signal in part of the n-th frame scanning period.

In contrast, in the row reset period and the signal readout period according to the (n+1)th frame, the control signal to control the switch SWV_1 is fixed at "High", and the control signal to control the switch SWV_2 is fixed at "Low". Thus, the first reference voltage applying circuit 60 is electrically connected to the inverting amplifiers 22, and the second reference voltage applying circuit 61 is electrically disconnected from the inverting amplifiers 22. That is, the first reference voltage applying circuit 60 is enabled, and the second reference voltage applying circuit 61 is disabled.

As illustrated in FIG. 10, in the (n+1)th frame period, the control signal to control the switch SWV_SH_1 of the first reference voltage applying circuit 60 is fixed at "Low", and the switch SWVSH_1 is turned off. Since the switch SWV_SH_1 is off, the voltage signal held by the capacitor CAPV1 through the hold operation performed by the sample-and-hold circuit is supplied to the inverting amplifiers 22 via the second switching circuit 62. In contrast, during the (n+1)th frame scanning period other than the periods overlapping with the n-th frame scanning period and the (n+2)th frame scanning period, the control signal to control the switch SWR_SH_2 of the first reset voltage generating circuit 61 is fixed at "High", and the switch SWR_SH_2 is set to on. When the switch SWV_SH_2 is on, the reference voltage for the inverting amplifiers 22 is charged in the capacitor CAPV2. That is, the sample-and-hold circuit of the second reference voltage applying circuit 61 samples the voltage signal in part of the (n+1)th frame scanning period.

As illustrated in FIG. 9, in this example, the row reset (the row reset serving as an electronic shutter) for the first row of the (n+1)th frame is started before completion of signal readout for the 10th row of the n-th frame. That is, in this example, there is an overlapping period between two consecutive frame scanning periods.

In the example illustrated in FIGS. 9 and 10, the second reference voltage applying circuit 61 is connected to the inverting amplifiers 22 during a signal readout period according to the n-th frame in the overlapping period. In addition, the first reference voltage applying circuit 60 is connected to the inverting amplifiers 22 during the row reset period according to the (n+1)th frame. While the example has been described with reference to the overlapping period that is set to 2HD, the length of the overlapping period can be changed in accordance with the control of the exposure period.

In addition, the switch SWVSH_1 and the switch SWV_SH_2 are set to off during the overlapping period. In this manner, the first reference voltage applying circuit 60 and the second reference voltage applying circuit 61 are enabled and, thus, the reference voltage is supplied from each of the first reference voltage applying circuit 60 and the second reference voltage applying circuit 61 to the second switching circuit 62.

As described with reference to FIG. 1, the signal readout period (the period from the time t3 to the time t4 in FIG. 1) can include a period for resetting the FD to read out the reference level ("ED RESET" in FIG. 1). In a configuration such as a configuration that is illustrated in FIG. 8A and that can prevent thermal noise through negative feedback control using the inverting amplifier 22, the FD reset period can include a period for forming a feedback path including the inverting amplifier 22 as part of the path. The FD reset can be performed during the period of the electronic shutter (the period from the time t1 to the time t2 in FIG. 1) in addition to during the signal readout period. According to the driving method described with reference to FIGS. 9 and 10, by using the second switching circuit 62, the first reference voltage applying circuit 60 and the second reference voltage applying circuit 61 can be alternately connected to the inverting amplifiers 22 between the row reset period and the signal readout period according to the (n+1)th frame and the row reset period and the signal readout period according to the n-th frame. That is, the signal voltage sampled into the capacitor CAPV2 of the second reference voltage applying circuit 61 can be used for two FD reset operations performed for each of the rows according to the n-th frame. In contrast, the signal voltage sampled into the capacitor CAPV1 of the first reference voltage applying circuit 60 can be used for two FD reset operations performed for each of the rows according to the (n+1)th frame.

According to the operation described with reference to FIGS. 9 and 10, the hold operation performed by the sample-and-hold circuit can be maintained throughout one frame scanning period. Accordingly, a variation of the reference voltage caused by disturbance noise or thermal noise can be prevented. As a result, random horizontal line noise can be effectively prevented.

Row Reset Period Hold and Signal Readout Period Hold

A driving method that differs from the driving method illustrated in FIGS. 9 and 10 is described below with reference to FIGS. 11 and 12.

Figure 11:
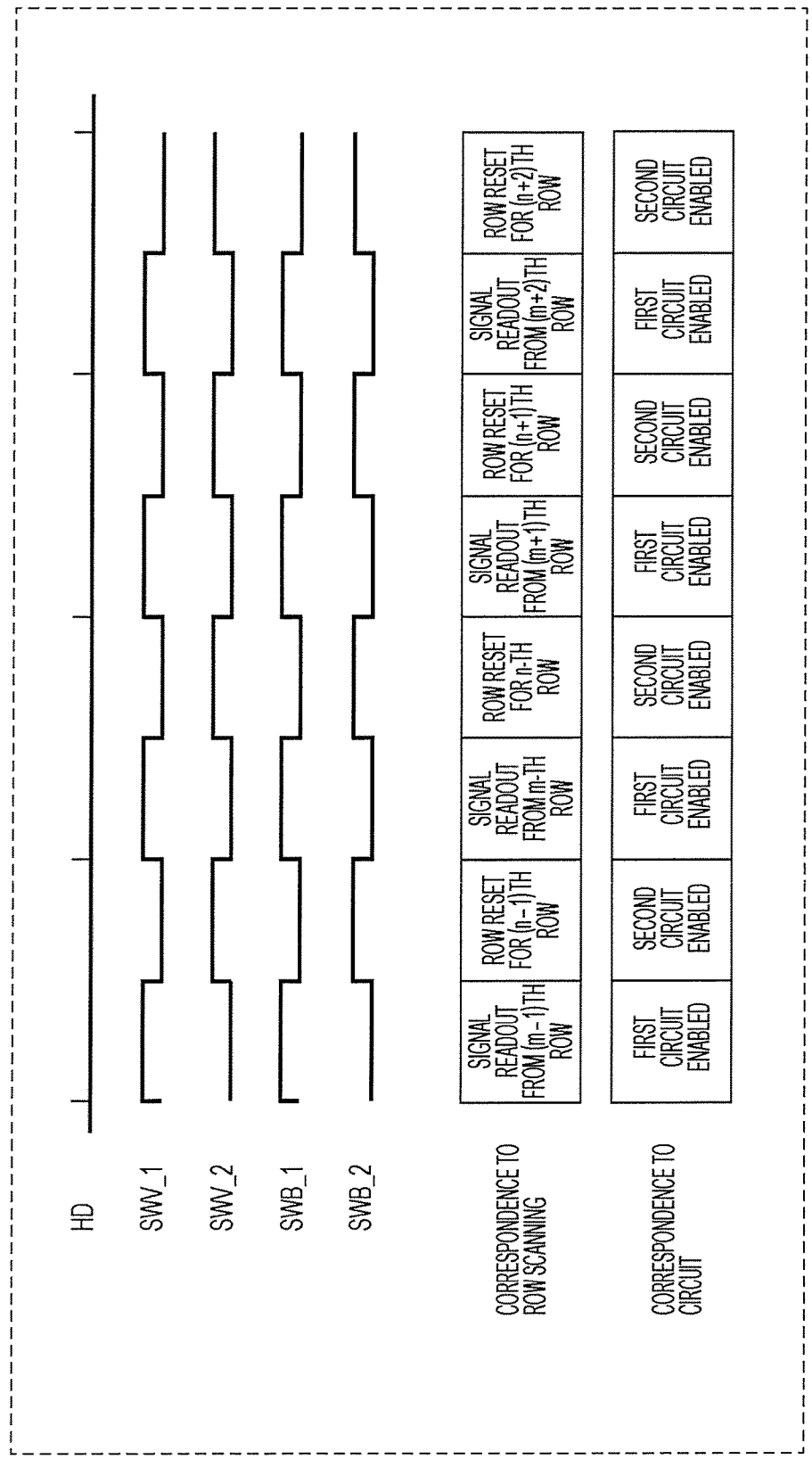
FIG. 11 is a timing diagram of another example of the timing of control of the switches in a second switching circuit.

FIG. 11 illustrates another example of control timing of the switches of the second switching circuit 62 of the imaging device 1A according to the present exemplary embodiment. FIG. 12 illustrates an example of control timing of the switches of the reference voltage applying circuit 30 according to two consecutive frames. In addition, FIG. 12 illustrates the period in which each of the first reference voltage applying circuit 60 and the second reference voltage applying circuit 61 is enabled. The waveforms of signals illustrated in the middle of FIGS. 11 and 12 ("SWB_1" and "SWB_2") are described in more detail below.

According to the driving method, the second switching circuit 62 electrically connects one of the first reference voltage applying circuit 60 and the second reference voltage applying circuit 61 to the inverting amplifiers 22 during the row reset period in one frame period and electrically connects the other to the inverting amplifiers 22 during the pixel signal readout period.

In an example illustrated in FIG. 11, the row reset and the signal readout are serially performed. For example, during the row reset period in each of the frame periods, the control signal to control the switch SWV_2 is fixed at "High". As a result, the inverting amplifiers 22 are electrically connected to the second reference voltage applying circuit 61. At that time, the first reference voltage applying circuit 60 is electrically disconnected from the inverting amplifiers 22.

Figure 12:
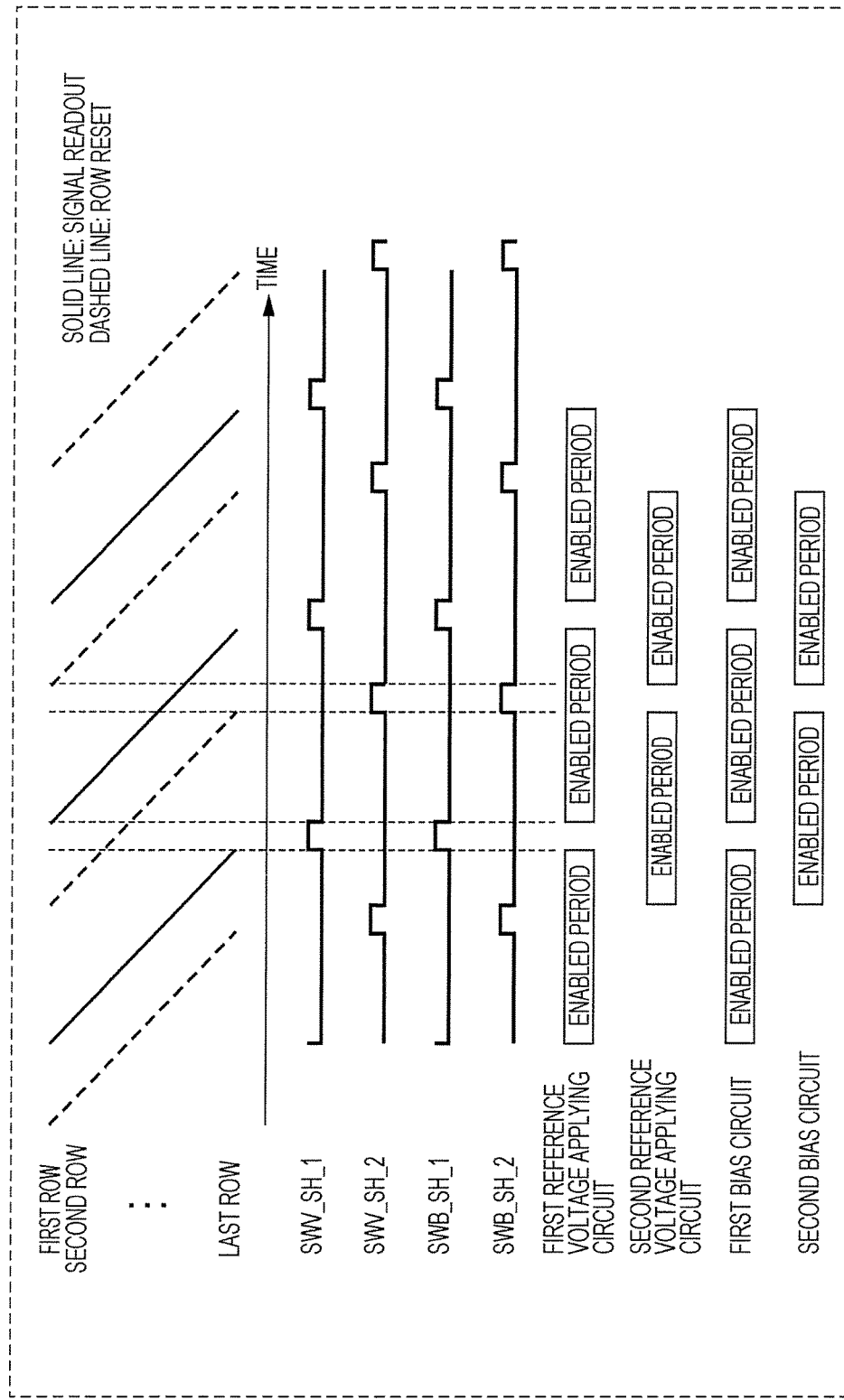
FIG. 12 is a timing diagram illustrating an example of the timing of control of the switches in the reference voltage applying circuit in consecutive frame scanning period.

As illustrated in FIG. 12, in this example, the control signal to control the switch SWV_SH_2 of the second reference voltage applying circuit 61 is fixed at "Low". Accordingly, the second reference voltage applying circuit 61 is enabled during the row reset period. That is, since the switch SWV_SH_2 is off, the voltage signal held by the capacitor CAPV2 through the hold operation performed by the sample-and-hold circuit is supplied to the inverting amplifiers 22 via the second switching circuit 62. In this example, by fixing the control signal to control the switch SWV_SH_2 at "High", charging of the capacitor CAPV2, that is, sampling is performed.

In contrast, during the signal readout period in each of the frame periods, the control signal to control the switch SWV_1 is fixed at "High" (refer to, for example, FIG. 11). As a result, the inverting amplifiers 22 are electrically connected to the first reference voltage applying circuit 60. At that time, the second reference voltage applying circuit 61 is electrically disconnected from the inverting amplifiers 22.

That is, in this example, the first reference voltage applying circuit 60 is enabled during the signal readout period. That is, the control signal to control the switch SWV_SH_1 is fixed at "Low" and, thus, the switch SWV_SH_1 is off. Accordingly, the voltage signal held by the capacitor CAPV1 through the hold operation performed by the sample-and-hold circuit is supplied to the inverting amplifiers 22 via the second switching circuit 62. In this example, by fixing the control signal to control the switch SWVSH_1 at "High" during a period other than the signal readout period, charging of the capacitor CAPV1, that is, sampling is performed.

As can be seen from FIG. 12, in this example, the switch SWV_SH_1 and the switch SWV_SH_2 are turned off during the overlapping period for which two consecutive frame scanning periods overlap each other. In this manner, each of the first reference voltage applying circuit 60 and the second reference voltage applying circuit 61 is enabled, and the reference voltage is supplied from each of the first reference voltage applying circuit 60 and the second reference voltage applying circuit 61 to the second switching circuit 62.

According to the driving method, the hold operation performed by the sample-and-hold circuit of one of the first reference voltage applying circuit 60 and the second reference voltage applying circuit 61 can be maintained throughout the row reset period and throughout the signal readout period. Unlike the hold throughout the one frame scanning period described with reference to FIGS. 9 and 10, noise is inevitably generated. However, since the noise is equally distributed across all the rows. As a result, the horizontal line noise is not detectable by the eyes. This driving method is effective in a long exposure mode, such as a mode used when the image of a starry sky is captured.

Third Exemplary Embodiment

A third exemplary embodiment of the present disclosure is described below with reference to FIGS. 9 to 12 and FIGS. 13A and 13B. Unlike the imaging device 1 according to the first exemplary embodiment, the imaging device according to the present exemplary embodiment includes a reference voltage applying circuit 30 including a second switching circuit 62 and a bias circuit 40A including a third switching circuit 72. The present exemplary embodiment is applied to a reference voltage applying circuit and a bias circuit having a column feedback configuration. The configuration and the operation of the reference voltage applying circuit 30 are the same as those described in the second exemplary embodiment. The configuration and the operation of the bias circuit are mainly described below.

FIG. 13A is a schematic illustration of the circuit configuration of an imaging device 1B according to the third exemplary embodiment of the present disclosure. An exemplary connection relationship between the bias circuit 40A including the third switching circuit 72 and the load unit 18 for each of the i-th and (i+1)th columns is illustrated in FIG. 13A. A connection relationship between each of the wiring lines and each of the transistors in the pixels 14 is the same as that illustrated in FIG. 7.

In the example of configuration illustrated in FIG. 13A, the bias circuit 40A includes a first bias circuit 70, a second bias circuit 71, and a third switching circuit 72. The first bias circuit 70 and the second bias circuit 71 can be electrically connected to the load units 18 via the third switching circuit 72.

In the configuration illustrated in FIG. 13A, the third switching circuit 72 has a switch SWB_1 and a switch SWB_2 for each of the columns. The switch SWB_1 for each of the columns is connected to the first bias circuit 70 via a common signal line 73A. The switch SWB_2 for each of the columns is connected to the second bias circuit 71 via a common signal line 73B.

Each of the first bias circuit 70 and the second bias circuit 71 can include a sample-and-hold circuit. In the example illustrated in FIG. 13A, the first bias circuit 70 includes an output buffer 75A, a capacitor CAPB1, a switch SWB_SH_1, and a voltage control unit 74A. In contrast, the second bias circuit 71 includes an output buffer 75B, a capacitor CAPB2, a switch SWB_SH_2, and a voltage control unit 74B. The capacitors CAPB1 and CAPB2 and the voltage control units 74A and 74B may be disposed outside the imaging device 1B.

Each of the first bias circuit 70 and the second bias circuit 71 generates a control voltage for controlling on/off of the load transistor of the load unit 18. The magnitudes of the control voltages generated by the first bias circuit 70 and the second bias circuit 71 are equivalent to each other. In other word, the magnitudes are equivalent to each other to the extent that the noise due to the difference of these control voltages cannot be recognized in the resulting image. If the switch SWB_SH_1 is turned on, the output voltage output from the voltage control unit 74A is charged in the capacitor CAPB1 as the control voltage. This operation is referred to as "sampling". If the switch SWB_SH_1 is turned off, the sample operation is completed, and sampled voltage signal is held by the capacitor CAPB1. This operation is referred to as "hold". As in the first bias circuit 70, in the second bias circuit 71, by turning on and off the switch SWB_SH_2, a sample-and-hold operation is performed.

The voltage signals held by the capacitors CAPB1 and CAPB2 are output to the third switching circuit 72 via the output buffers 75A and 75B, respectively. The third switching circuit 72 can be controlled by, for example, a peripheral logic circuit (not illustrated). The third switching circuit 72 performs exclusive control over the switches so that one of the switches SWB_1 and SWB_2 is turned on and the other is turned off.

If the switch SWB_1 is turned on and the switch SWB_2 is turned off, the first bias circuit 70 is electrically connected to the load unit 18 for the column for which the switch SWB_1 is turned on and, thus, the control voltage is supplied from the first bias circuit 70 to the load units 18. In contrast, if the switch SWB_1 is turned off and the switch SWB_2 is turned on, the second bias circuit 71 is electrically connected to the load unit 18 for the column for which the switch SWB_2 is turned on and, thus, the control voltage is supplied from the second bias circuit 71 to the load unit 18. In the example of configuration illustrated in FIG. 13A, the load unit 18 of each of the columns is electrically connected to the inverting amplifier 22 for the column via a vertical signal line. Accordingly, by preventing a variation of the control signal to control on/off of the load transistor, random horizontal line noise can be more effectively prevented.

As illustrated in FIG. 13B, a bias circuit 40D including a first bias circuit 70D and a second bias circuit 71D that share a voltage control unit 74D may be employed. Since the voltage control unit is shared, the size of the drive circuit unit can be advantageously reduced. The voltage control unit 74D may be disposed either inside or outside the imaging device 1B.

One Frame Period Hold

Refer back to FIGS. 9 and 10 again. The signal waveforms of the switches of the first bias circuit 70, the second bias circuit 71, and the third switching circuit 72 are also illustrated in FIGS. 9 and 10. The following description is given on the assumption that each of the switches SWB_1 and SWB_2 of the third switching circuit 72 is turned on when the control signal is "High" and is turned off when the control signal is "Low". However, the polarities of the switches are not limited thereto. The polarities of the switches may be reversed.

As described above, according to the driving method illustrated in FIGS. 9 and 10, the second switching circuit 62 electrically connects one of the first reference voltage applying circuit 60 and the second reference voltage applying circuit 61 to the inverting amplifiers 22 in the row reset period and the signal readout period according to the (n+1)th frame and electrically connects the other to the inverting amplifiers 22 in the row reset period and the signal readout period according to the n-th frame. In addition, according to the driving method described herein, the third switching circuit 72 electrically connects one of the first bias circuit 70 and the second bias circuit 71 to the load transistors in the row reset period and the signal readout period according to the (n+1)th frame and electrically connects the other to the load transistors in the row reset period and the signal readout period according to the n-th frame.

As can be seen from FIG. 9, the control signal to control the switch SWB_2 is fixed at "High" and the control signal to control the switch SWB_1 is fixed at "Low" in the row reset period and the signal readout period according to the n-th frame. Thus, the second bias circuit 71 is electrically connected to the load units 18, and the first bias circuit 70 is electrically disconnected from the load units 18.

As can be seen from FIG. 10, the control signal to control the switch SWB_SH_2 is fixed at "Low" during the n-th frame scanning period and, thus, the switch SWB_SH_2 is turned off. Accordingly, the voltage signal held by the capacitor CAPB2 through the hold operation performed by the sample-and-hold circuit is supplied to the load units 18 via the third switching circuit 72. At that time, by fixing the control signal to control the switch SWB_SH_1 at "High", the switch SWB_SH_1 is turned on. Since the switch SWB_SH_1 is turned on, the reset voltage is charged in the capacitor CAPB1. That is, the sample-and-hold circuit of the first bias circuit 70 performs sampling of the voltage signal during the n-th frame scanning period other than the periods overlapping with the (n−1)th frame scanning period and the (n+1)th frame scanning period.

In contrast, in the row reset period and the signal readout period according to the (n+1)th frame, the control signal to control the switch SWB_1 is fixed at "High", and the control signal to control the switch SWB_2 is fixed at "Low" (refer to FIG. 9). Thus, the first bias circuit 70 is electrically connected to the load units 18, and the second bias circuit 71 is electrically disconnected from the load units 18.

As illustrated in FIG. 10, during the (n+1)th frame scanning period, the control signal to control the switch SWB_SH_1 is fixed at "Low" and, thus, the switch SWB_SH_1 is turned off. Accordingly, the voltage signal held by the capacitor CAPB1 through the hold operation performed by the sample-and-hold circuit is supplied to the load units 18 via the third switching circuit 72. In contrast, the switch SWB_SH_2 is turned on by fixing the control signal at "High". When the switch SWB_SH_2 is on, the control voltage is charged in the capacitor CAPB2. That is, the sample-and-hold circuit of the second bias circuit 71 samples the voltage signal during the (n+1)th frame scanning period other than the periods overlapping with the n-th frame scanning period and the (n+2)th frame scanning period.

In the example illustrated in FIG. 9, there is an overlapping period between two consecutive frame scanning periods. The second bias circuit 71 is connected to the load units 18 during a signal readout period according tor the n-th frame in the overlapping period. In addition, the first bias circuit 70 is connected to the load units 18 during the row reset period according to the (n+1)th frame.

Note that during the overlapping period, the switch SWB_SH_1 and the switch SWB_SH_2 are turned off. In this manner, the first bias circuit 70 and the second bias circuit 71 are enabled and, thus, the reference voltage is supplied to the third switching circuit 72 from each of the first bias circuit 70 and the second bias circuit 71.

According to the driving method described with reference to FIGS. 9 and 10, by using the second switching circuit 62 and the third switching circuit 72, the first reference voltage applying circuit 60 and the second reference voltage applying circuit 61 can be alternately connected to the inverting amplifiers 22 between the row reset period and the signal readout period according to the (n+1)th frame and the row reset period and the signal readout period according to the n-th frame. In addition, the first bias circuit 70 and the second bias circuit 71 can be alternately connected to the load units 18. According to the operation described with reference to FIGS. 9 and 10, the hold operation performed by the sample-and-hold circuit can be maintained throughout one frame scanning period. Accordingly, a variation of the reference voltage caused by disturbance noise or thermal noise can be prevented. As a result, random horizontal line noise can be effectively prevented.

Row Reset Period Hold and Signal Readout Period Hold

Referring back to FIGS. 11 and 12, a driving method that differs from the driving method illustrated in FIGS. 9 and 10 is described below.

The signal waveforms of the switches of the first bias circuit 70, the second bias circuit 71, and the third switching circuit 72 are also illustrated in FIGS. 11 and 12. As described above, in the driving method illustrated in FIGS. 11 and 12, the second switching circuit 62 electrically connects one of the first reference voltage applying circuit 60 and the second reference voltage applying circuit 61 to the inverting amplifiers 22 during the row reset period in one frame period and electrically connects the other to the inverting amplifiers 22 during the pixel signal readout period. In addition, in the driving method described herein, the third switching circuit 72 electrically connects one of the first bias circuit 70 and the second bias circuit 71 to the load transistors during the row reset period and electrically connects the other to the load transistors during the pixel signal readout period.

In the example illustrated in FIG. 11, the row reset and the signal readout are serially performed. For example, during the row reset period in each of the frame periods, the control signal to control the switch SWB_2 is fixed at "High". As a result, the load units 18 are electrically connected to the second bias circuit 71. At that time, the first bias circuit 70 is electrically disconnected from the load units 18.

As illustrated in FIG. 12, in this example, the control signal to control the switch SWB_SH_2 of the second bias circuit 71 is fixed at "Low". Accordingly, the second bias circuit 71 is enabled during the row reset period. That is, since the switch SWB_SH_2 is off, the voltage signal held by the capacitor CAPB2 through the hold operation performed by the sample-and-hold circuit is supplied to the load units 18 via the third switching circuit 72. In this example, by fixing the control signal to control the switch SWB_SH_2 at "High", charging of the capacitor CAPB2, that is, sampling is performed.

In contrast, during the signal readout period in each of the frame periods, the control signal to control the switch SWB_1 is fixed at "High" (refer to, for example, FIG. 11). As a result, the load units 18 are electrically connected to the first bias circuit 70. At that time, the second bias circuit 71 is electrically disconnected from the load units 18.

That is, in this example, the first bias circuit 70 is enabled during the signal readout period. That is, the control signal to control the switch SWB_SH_1 of the first bias circuit 70 is fixed at "Low" and, thus, the switch SWB_SH_1 is off. Accordingly, the voltage signal held by the capacitor CAPB1 through the hold operation performed by the sample-and-hold circuit is supplied to the load units 18 via the third switching circuit 72. In this example, by fixing the control signal to control the switch SWB_SH_1 at "High" during a period other than the signal readout period, charging of the capacitor CAPB1, that is, sampling is performed.

As can be seen from FIG. 12, in this example, the switch SWB_SH_1 and the switch SWB_SH_2 are turned off during the overlapping period in which two consecutive scanning frames overlap each other. In this manner, each of the first bias circuit 70 and the second bias circuit 71 is enabled, and the control voltage to control the load transistor is supplied from each of the first bias circuit 70 and the second bias circuit 71 to the third switching circuit 72.

According to the driving method, the hold operation performed by the sample-and-hold circuit of one of the first bias circuit 70 and the second bias circuit 71 can be maintained throughout the row reset period and throughout the signal readout period. Unlike the hold throughout the one frame scanning period described with reference to FIGS. 9 and 10, noise is inevitably generated. However, since the noise is equally distributed across all the rows. As a result, the horizontal line noise is not detectable by the eyes. This driving method is effective in a long exposure mode, such as a mode used when the image of a starry sky is captured.

Fourth Exemplary Embodiment

An imaging device according to a fourth exemplary embodiment of the present disclosure is described below with reference to FIGS. 10, 14 and 15. Unlike the imaging device 1A according to the second exemplary embodiment, the imaging device according to the present exemplary embodiment has two column signal lines for each of the columns of the pixels 14. When a given column is discussed, at least some of the pixels 14 in the column are connected to a first column signal line, which is one of two column signal lines provided for the column. The other pixels 14 in the column are connected to a second column signal line, which is the other column signal line provided for the column. That is, in the imaging device according to the present exemplary embodiment, the output of the at least some of the pixels 14 are read out via the first column signal line, and the outputs of the other pixels 14 are read out via the second column signal line.

As described below with reference to the accompanying drawings, typically, at least one of the pixels 14 arranged in an odd numbered row is connected to the first column signal line, and at least one of the pixels 14 arranged in an even numbered row is connected to the second column signal line. Like the second exemplary embodiment, the present exemplary embodiment is applicable to reference voltage applying circuits of a column feedback configuration. The differences from the imaging device 1A according to the second exemplary embodiment are mainly described below.

FIG. 14 is a schematic illustration of the circuit configuration of an imaging device 1C according to the fourth exemplary embodiment of the present disclosure. In FIG. 14, four pixels in a given column among a plurality of pixels 14 arranged two-dimensionally are illustrated. In the example of configuration, the imaging device 1C includes a plurality of vertical signal lines 17A each connected to the pixels 14 arranged in one of the odd numbered rows and a plurality of vertical signal lines 17B each connected to the pixels 14 arranged in one of the even numbered rows.

In this example, the imaging device 1C further includes a plurality of feedback lines. Two of the feedback lines are disposed for each of the columns of the pixels 14. When a given column of the pixels 14 is discussed, feedback lines 23A and 23B are individually provided, as illustrated in FIG. 14. In this example, the feedback line 23A is electrically connected to the pixels 14 disposed in odd numbered rows, and the feedback lines 23B is electrically connected to the pixels 14 disposed in even numbered rows. Note that for convenience of description, in FIG. 14, one of two pairs each consisting of the vertical signal line and the feedback line (the pair consisting of the vertical signal line 17B and the feedback line 23B), which is provided for a given column of the pixels 14, is referred to as a "column i", and the other pair (the pair consisting of the vertical signal line 17A and the feedback line 23A) is referred to as a "column i+1". The same may apply to other drawings described below to distinguish the pairs consisting of a vertical signal line and a feedback line disposed in the same column from one another.

In the example of configuration illustrated in FIG. 14, the imaging device 1C includes a reference voltage applying circuit 30B including a first reference voltage applying circuit 60, a second reference voltage applying circuit 61, and a second switching circuit 62A. The second switching circuit 62A has two pairs of switches each for one of the columns of the pixels 14. In this example, a switch SWV_21 is connected between the positive input terminal of the inverting amplifier 22 having an output terminal connected to the feedback line 23A and a signal line 63A, and a switch SWV_22 is connected between the input terminal and a signal line 63B. In addition, a switch SWV_11 is connected between the positive input terminal of the inverting amplifier 22 having an output terminal connected to the feedback line 23B and the signal line 63A, and a switch SWV_12 is connected between the input terminal and the signal line 63B. As illustrated in FIG. 14, the switch SWV_11 and the switch SWV_21 each corresponding to one of the columns are connected to the first reference voltage applying circuit 60 via the common signal line 63A. The switch SWV_12 and the switch SWV_22 each corresponding to one of the columns are connected to the second reference voltage applying circuit 61 via the common signal line 63B.

Like the above-described pair consisting of the switches SWV_1 and SWV_2 of the second switching circuit 62, exclusive control is performed over the pair consisting of the switches SWV_11 and SWV_12 of the second switching circuit 62A. For example, when the switch SWV_11 is set to on, the switch SWV_12 is set to off. The same operation is performed over the pair consisting of the switches SWV_21 and SWV_22 of the second switching circuit 62A.

One Frame Scanning Period Hold

Figure 15:
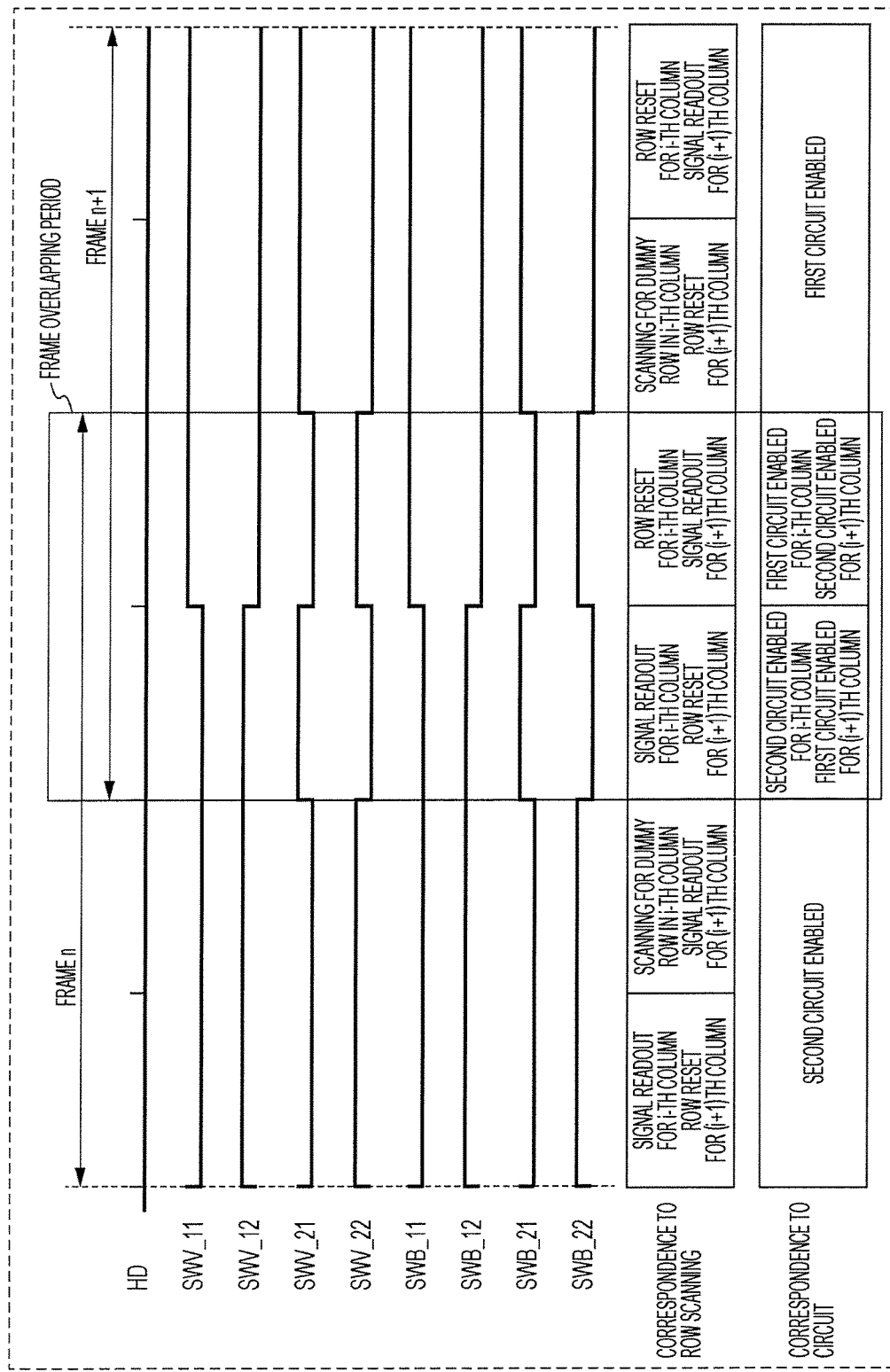
FIG. 15 is a schematic illustration of an example of the timing of control of the switches in the second switching circuit of the imaging device.

FIG. 15 illustrates an example of the control timing of the switches of the second switching circuit 62A in the imaging device 1C according to the present exemplary embodiment.

According to the driving method, row reset is performed using one of the vertical signal line 17A and the vertical signal line 17B provided for each of the columns. At the same time, signal readout is performed using the other of the vertical signal line 17A and the vertical signal line 17B. As in the example illustrated in FIG. 9, even in the example illustrated in FIG. 15, there is an overlapping period between two consecutive frame scanning periods. In the example of timing illustrated in FIG. 15, the overlapping period includes two 1H periods. In the example of timing illustrated in FIG. 15, signal readout and row reset are performed using the vertical signal line 17B and the vertical signal line 17A, respectively, in the first one of the two 1H periods. In the next 1H period, signal readout and row reset are performed using the vertical signal line 17A and the vertical signal lines 17B, respectively. Note that signal waveforms illustrated in the middle of FIG. 15 ("SWB_11", "SWB_12", "SWB_21", and "SWB_22") are described in detail below.

In the example illustrated in FIG. 15, the control signals for the switches SWV_12 and SWV_22 connected to the signal line 63B are set to "High" in the row reset period and the signal readout period according to the n-th frame. Thus, the inverting amplifiers 22 are electrically connected to the second reference voltage applying circuit 61. In contrast, the switch SWV_11 and SWV_21 connected to the signal line 63A are set to "Low". Thus, the first reference voltage applying circuit 60 is electrically disconnected from the inverting amplifiers 22.

Control of the switch SWV_SH_1 and the switch SWVSH_2 can be the same as in the example illustrated in FIG. 10. As illustrated in FIG. 10, the control signal to control the switch SWV_SH_2 is fixed at "Low" in the n-th frame scanning period and, thus, the switch SWV_SH_2 is turned off. At that time, the voltage signal held by the capacitor CAPV2 through the hold operation performed by the sample-and-hold circuit is supplied to the inverting amplifiers 22 via the second switching circuit 62A. In contrast, the switch SWV_SH_1 is turned on by fixing the control signal at "High". When the switch SWV_SH_1 is on, the reference voltage for the inverting amplifier 22 is charged in the capacitor CAPV1.

As illustrated in FIG. 15, in the row reset period and the signal readout period according to the (n+1)th frame, the control signals for the switches SWV_12 and SWV_22 are set to "Low" to electrically disconnect the second reference voltage applying circuit 61 from the inverting amplifiers 22. In addition, the control signals for the switches SWV_11 and SWV_21 are set to "High" to electrically connect the first reference voltage applying circuit 60 to the inverting amplifiers 22.

Referring back to FIG. 10, the control signal to control the switch SWV_SH_1 is fixed at "Low" during the (n+1)th frame scanning period and, thus, the switch SWV_SH_1 is turned off. At that time, the voltage signal held by the capacitor CAPV1 through the hold operation performed by the sample-and-hold circuit is supplied to the inverting amplifiers 22 via the second switching circuit 62A. In contrast, the switch SWV_SH_2 is turned on by fixing the control signal to control the switch SWV_SH_2 at "High". When the switch SWV_SH_2 is on, the reference voltage for the inverting amplifier 22 is charged in the capacitor CAPV2.

As described above, in this example, there is an overlapping period between two consecutive frame scanning periods, and the overlapping period includes two 1H periods. The first 1H period is discussed below first. In the first 1H period, signal readout for the n-th frame is performed using the vertical signal lines 17B. That is, among the pixels 14 in the even numbered rows, the output of the pixels 14 in a selected row is read out via the vertical signal line 17B.

As described above, the signal readout period can include a period for resetting an FD for reading out the reference level. A feedback path is formed during the FD reset period by turning on the amplifier transistor 11 and the reset transistor 12 in the pixel 14. That is, the feedback path includes the vertical signal line and the feedback line as part of the path. Accordingly, in, as illustrated in FIG. 8A, the circuit configuration in which one vertical signal line 17 and one feedback line 23 are disposed for each of the columns, formation of a feedback path for FD reset serving as an electronic shutter and formation of a feedback path for FD reset for the reference level readout cannot be performed at the same time.

In contrast, according to the circuit configuration of the fourth exemplary embodiment of the present disclosure, two vertical signal lines (the vertical signal lines 17A and 17B) and two inverting amplifiers 22 are disposed for each of the columns of the pixels 14. Accordingly, a feedback circuit for FD reset to read out the reference level can be formed for the pixel 14 connected to the vertical signal lines 17B at the same time as a feedback circuit for FD reset serving as an electronic shutter for the pixel 14 connected to the vertical signal line 17A for the same column is formed.

As described above, in this example, during the first 1H period of the overlapping period, signal readout is performed for the n-th frame using the vertical signal line 17B. As illustrated in FIG. 15, during the 1H period, the control signal to control the switch SWV_12 is set to "High". Accordingly, the second reference voltage applying circuit 61 is electrically connected to the inverting amplifier 22 connected to the vertical signal line 17B. As illustrated in FIG. 10, the second reference voltage applying circuit 61 is enabled for the n-th frame scanning period. Thus, the reference voltage for the inverting amplifier 22 held by the capacitor CAPV2 is applied to the positive input terminal of the inverting amplifier 22 connected to the vertical signal line 17B.

In addition, in this example, the row reset for the (n+1)th frame is performed concurrently with the signal readout for the n-th frame during the 1H period. The row reset is performed using the vertical signal line 17A. That is, among the odd numbered rows, the row reset for the selected row is performed. As illustrated in FIG. 15, during the 1H period, the control signal to control the switch SWV_21 is set to "High" and, thus, the inverting amplifier 22 connected to the vertical signal line 17A is electrically connected to the first reference voltage applying circuit 60 via the switch SWV_21. As illustrated in FIG. 10, the first reference voltage applying circuit 60 is enabled for the (n+1)th frame scanning period. Accordingly, the reference voltage for the inverting amplifier 22 held by the capacitor CAPV1 is applied to the positive input terminal of the inverting amplifiers 22 connected to the vertical signal line 17A.

During the next 1H in the overlapping period, the roles of the vertical signal line 17A and the vertical signal line 17B are exchanged. That is, signal readout for the n-th frame and row reset for the (n+1)th frame are performed using the vertical signal line 17A and the vertical signal line 17B, respectively. When the vertical signal line 17A is discussed, the control signal to control the switch SWV_22 is set to "High" during the 1H period, as illustrated in FIG. 15. Accordingly, the second reference voltage applying circuit 61 is electrically connected to the inverting amplifier 22 connected to the vertical signal line 17A. At that time, as can be seen from FIG. 10, the second reference voltage applying circuit 61 is enabled and, thus, the reference voltage for the inverting amplifier 22 held by the capacitor CAPV2 is applied to the positive input terminal of the inverting amplifier 22 connected to the vertical signal line 17A.

In contrast, the row reset for the (n+1)th frame is performed by using the vertical signal line 17B. When the vertical signal line 17B is discussed, the control signal to control the switch SWV_11 is set to "High" (refer to FIG. 15). Accordingly, the first reference voltage applying circuit 60 is electrically connected to the inverting amplifier 22 connected to the vertical signal line 17B. At that time, as can be seen from FIG. 10, the first reference voltage applying circuit 60 is enabled and, thus, the reference voltage for the inverting amplifier 22 held by the capacitor CAPV1 is applied to the positive input terminal of the inverting amplifier 22 connected to the vertical signal line 17B.

In addition, in this example, during the overlapping period, each of the switch SWV_SH_1 and the switch SWV_SH_2 in the sample-and-hold circuit is turned off. In this manner, each of the first reference voltage applying circuit 60 and the second reference voltage applying circuit 61 is enabled, and the reference voltage is supplied from each of the first reference voltage applying circuit 60 and the second reference voltage applying circuit 61 to the second switching circuit 62A.

According to the driving method described with reference to FIGS. 15 and 10, feedback paths can be concurrently formed for the pixels 14 disposed in the odd numbered lines and in the pixels 14 disposed in the even numbered lines in the same column. Thus, images can be captured at high frame rate.

Row Reset Period Hold and Signal Readout Period Hold

A driving method that differs from the driving method illustrated in FIGS. 10 and 15 is described below with reference to FIGS. 12 and 16.

Figure 16:
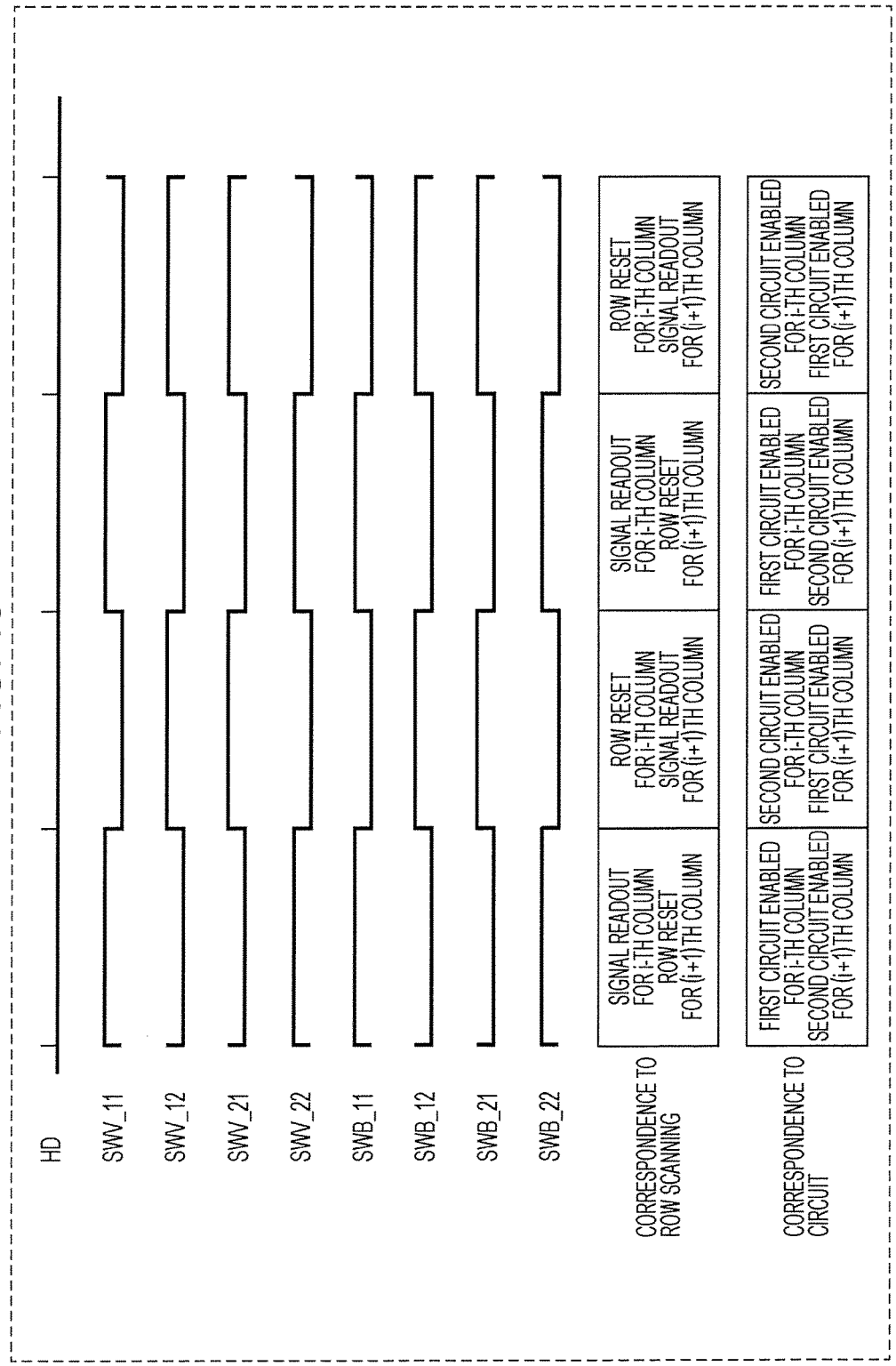
FIG. 16 is a timing diagram illustrating another example of the timing of control of the switches in the second switching circuit.

FIG. 16 illustrates an example of the waveforms of the control signals for the switches SWV_11, SWV_12, SWV_21, and SWV_22 of the second switching circuit 62A. Signal waveforms illustrated in the middle of FIG. 16 ("SWB_11", "SWB_12", "SWB_21", and "SWB_22") are described in detail below.

Even in the driving method, row reset is performed in a column by using one of the vertical signal line 17A and the vertical signal line 17B. At the same time, signal readout is performed by using the other in the same column. As can be seen from the lower section of FIG. 16, in this example, the first reference voltage applying circuit 60 is used for signal readout in one of the even numbered rows and a given column. In addition, the second reference voltage applying circuit 61 is used for the row reset serving as an electronic shutter in one of the odd numbered rows in the column.

The leftmost 1H period in FIG. 16 is discussed below. During the 1H period, signal readout is performed using the vertical signal line 17B, and the row reset is performed using the vertical signal line 17A. At that time, the control signal to control the switch SWV_11 is set to "High", and the first reference voltage applying circuit 60 is enabled. In addition, the control signal to control the switch SWV_22 is set to "High", and the second reference voltage applying circuit 61 is enabled. In contrast, during the next 1H period, signal readout is performed using the vertical signal line 17A, and the row reset is performed using the vertical signal line 17B. At that time, the control signal to control the switch SWV_21 is set to "High", and the first reference voltage applying circuit 60 is enabled. In addition, the control signal to control the switch SWV_12 is set to "High", and the second reference voltage applying circuit 61 is enabled. The timing of control of the switches SWV_SH_1 and SWV_SH_2 performed by the first reference voltage applying circuit 60 and the second reference voltage applying circuit 61 can be the same as the timing of control in the second exemplary embodiment described with reference to FIG. 12.

According to the driving method, in addition to the effect described in the section "Row Reset Period Hold and Signal Readout Period Hold" for the second exemplary embodiment, images can be captured at a high frame rate, since feedback paths are concurrently formed in the pixels 14 disposed in the odd numbered rows and the pixels 14 disposed in the even numbered rows in the same column.

Fifth Exemplary Embodiment

A fifth exemplary embodiment of the present disclosure is described below with reference to FIGS. 10, 12, 15, 16, and 17. Unlike the imaging device 1C according to the fourth exemplary embodiment, an imaging device 1D according to the present exemplary embodiment further include a bias circuit 40B including a third switching circuit 72A. Like the fourth exemplary embodiment, the present exemplary embodiment is applied to a reference voltage applying circuit of a column feedback configuration. The differences from the imaging device 1C according to the fourth exemplary embodiment are mainly described below.

Figure 17:
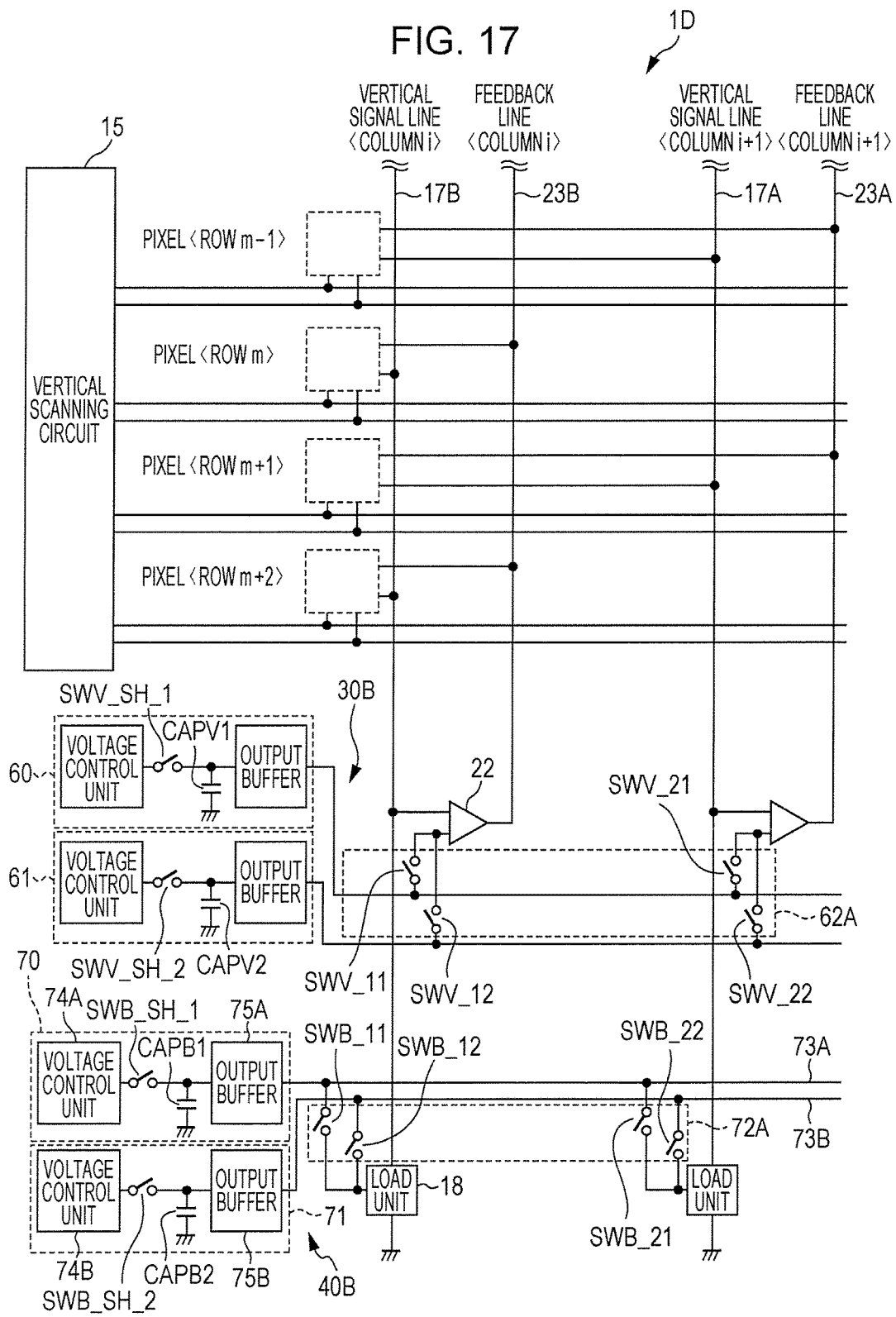
FIG. 17 is a schematic illustration of the circuit configuration of an imaging device according to a fifth exemplary embodiment.

FIG. 17 is a schematic illustration of the circuit configuration of the imaging device 1D according to the fifth exemplary embodiment. Like the above-described second switching circuit 62A, the third switching circuit 72A illustrated in FIG. 17 includes two pairs of switches. In this exemplary embodiment, a switch SWB_11 is connected between a load unit 18 connected to the vertical signal line 17B and a signal line 73A that is common to the columns of the pixels 14, and a switch SWB_12 is connected between the load unit 18 and a signal line 73B that is common to the columns of the pixels 14. In addition, a switch SWB_21 is connected between the load unit 18 connected to the vertical signal line 17A and the common signal line 73A, and a switch SWB_22 is connected between the load unit 18 and a signal line 73B that is common to the columns of the pixels 14. The switch SWB_11 and the switch SWB_21 in each of the columns are connected to the first bias circuit 70 via the common signal line 73A. The switch SWB_12 and a switch SWB_22 for each of the columns are connected to the second bias circuit 71 via the common signal line 73B.

One Frame Scanning Period Hold

The signal waveforms of the control signals to control the switches in the third switching circuit 72A are also illustrated in FIG. 15. Note that the signal waveforms of the switches SWB_11, SWB_12, SWB_21, and SWB_22 are the same as the signal waveforms of the switches SWV_11, SWV_12, SWV_21, and SWV_22, respectively. That is, the switches of the third switching circuit 72A and the switches of the second switching circuit 62A can be controlled at the same timing.

The time points at which the switches SWB_SH_1 and SWB_SH_2 provided in the first bias circuit 70 and the second bias circuit 71, respectively, are controlled can be the same as those in the third exemplary embodiment described with reference to FIG. 10.

According to the driving method, in addition to the effect described in the section "One Frame Scanning Period Hold" for the third exemplary embodiment, images can be captured at a high frame rate, since feedback paths are concurrently formed in the pixels 14 disposed in the odd numbered rows and the pixels 14 disposed in the even numbered rows in the same column.

Row Reset Period Hold and Signal Readout Period Hold

A driving method that differs from the driving method illustrated in FIGS. 10 and 15 is described below with reference to FIGS. 12 and 16.

FIG. 16 also illustrates an example of the waveforms of the control signals for the switches of the third switching circuit 72A. In this example, the signal waveforms of the switches SWB_11, SWB_12, SWB_21, and SWB_22 are the same as those of the switches SWV_11, SWV_12, SWV_21, and SWV_22, respectively. That is, the switches of the third switching circuit 72A and the switches of the second switching circuit 62A can be controlled at the same timing.

The time points at which the switches SWB_SH_1 and SWB_SH_2 provided in the first bias circuit 70 and the second bias circuit 71, respectively, are controlled can be the same as those in the third exemplary embodiment described with reference to FIG. 12.

According to the driving method, in addition to the effect described in the section "Row Reset Period Hold and Signal Readout Period Hold" for the third exemplary embodiment, images can be captured at a high frame rate, since feedback paths are concurrently formed in the pixels 14 disposed in the odd numbered rows and the pixels 14 disposed in the even numbered rows in the same column.

Sixth Exemplary Embodiment

In the above-described second to fifth exemplary embodiments, as an example, the circuit configuration that allows a feedback path including the inverting amplifier 22 disposed so as to correspond to the vertical signal line (the vertical signal line 17 or a pair consisting of the vertical signal lines 17A and 17B) to be formed is provided. However, the configuration of the feedback path is not limited thereto. For example, as described below, a circuit configuration in which a feedback path is closed in a pixel can be applied.

Figure 18:
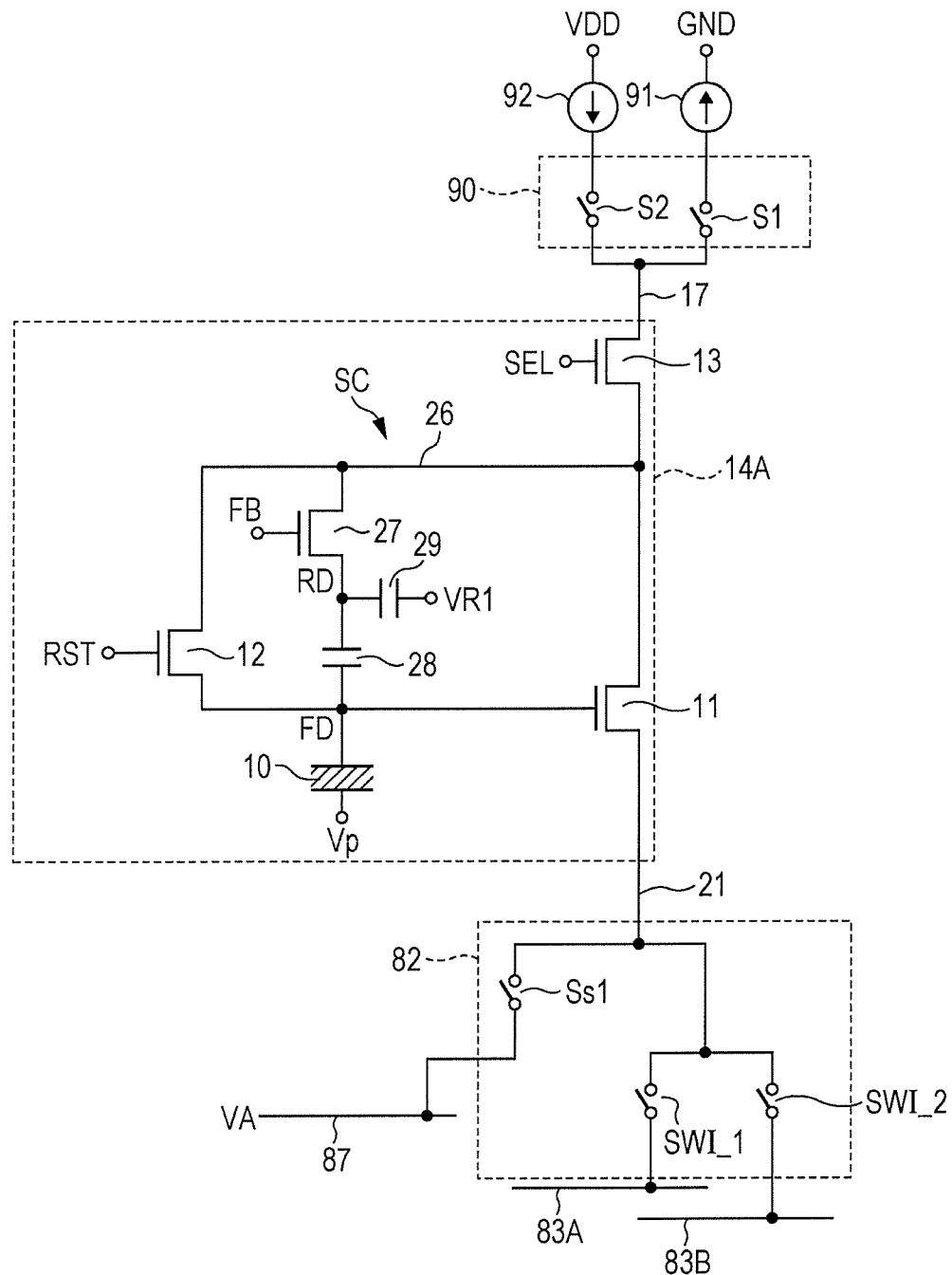
FIG. 18 is a schematic illustration of an exemplary circuit configuration of a pixel capable of forming a feedback path.

FIG. 18 illustrates an example of a circuit configuration of a pixel capable of forming a feedback path. A pixel 14A illustrated in FIG. 18 includes a photoelectric conversion unit 10 and a signal detection circuit SC that detects a signal generated by the photoelectric conversion unit 10. As illustrated in FIG. 18, the signal detection circuit SC includes an amplifier transistor 11 and an address transistor 13. In the configuration illustrated in FIG. 18 as an example, the signal detection circuit SC further includes a reset transistor 12, a feedback transistor 27, a first capacitative element 28, and a second capacitative element 29. One of a source and a drain of the reset transistor 12 is connected to a FD node that connects the photoelectric conversion unit 10 to a gate of the amplifier transistor 11. The other of the source and the drain of the reset transistor 12 is connected to a node between the amplifier transistor 11 and the address transistor 13 via a feedback line 26. The feedback transistor 27 and the first capacitative element 28 are connected between the source and the drain of the reset transistor 12. That is, the feedback transistor 27 and the first capacitative element 28 are connected between the FD node and the feedback line 26. As illustrated in FIG. 18, one of two electrodes of the second capacitative element 29 is connected to a node between the feedback transistor 27 and the first capacitative element 28 (hereinafter, the node is also referred to as a "node RD").

The gate of the reset transistor 12 is connected to a reset control line 24 (not illustrated in FIG. 18, and refer to FIG. 3). When the imaging device operates, a reset control signal RST is applied to the gate of the reset transistor 12 via the reset control line 24. A vertical scanning circuit 15 (refer to FIG. 3) can reset the voltage of the FD node of a selected pixel 14A by turning on the reset transistor 12 via the reset control line 24. In this example, by turning on the reset transistor 12, the voltage of the feedback line 26 is applied to the FD node.

The gate of the feedback transistor 27 is connected to a feedback control line (not illustrated). When the imaging device operates, a feedback control signal FB is applied to the gate of the feedback transistor 27 via the feedback control line. The feedback control line is connected to, for example, the vertical scanning circuit 15. The vertical scanning circuit can switch on/off the feedback transistor 27 via the feedback control line.

As illustrated in FIG. 18, one of the source and the drain of the feedback transistor 27 is electrically connected to the photoelectric conversion unit 10 via the first capacitative element 28. By setting an address control signal SEL for the gate of the address transistor 13 to, for example, a high level to turn on the address transistor 13 and further turning on the feedback transistor 27, a feedback path including the amplifier transistor 11 of the selected pixel 14A as part of the path can be formed. The feedback path includes the feedback line 26 connected between the source of the amplifier transistor 11 and the photoelectric conversion unit 10 as part thereof. The feedback path allows the output of the amplifier transistor 11 to be negatively fed back to one of the source and drain of the feedback transistor 27 which is not connected to the node RD.

Typically, the second capacitative element 29 in the signal detection circuit SC has a capacitance value higher than the first capacitative element 28. When the imaging device operates, a reference voltage VR1 (e.g., 0 V) is applied to the electrode of the second capacitative element 29 which is not connected to the node RD. The reference voltage VR1 may be a fixed voltage or, for example, a pulse voltage.

In the example illustrated in FIG. 18, constant current sources 91 and 92 are connected to the vertical signal line 17 via a switching circuit 90. When the imaging device operates, one end of the constant current source 91 and one end of the constant current source 92 are connected to a reference voltage (typically, ground (GND)) and a power source voltage VDD, respectively. Each of the constant current sources 91 and 92 includes a load unit including, for example, a load transistor.

The switching circuit 90 includes a switch S1 connected between the constant current source 91 and the vertical signal line 17 and a switch S2 connected between the constant current source 92 and the vertical signal line 17. The switches S1 and S2 of the switching circuit 90 are controlled so as to be exclusively performed. That is, if the switch S1 is turned on, the switch S2 is turned off. If the switch S1 is turned off, the switch S2 is turned on. As described below, according to the present exemplary embodiment, the switch S2 is turned on in resetting of the pixel 14A. In signal readout from the pixel 14A, the switch S1 is turned on.

A fourth switching circuit 82 is connected to the power source wiring line 21 connected to the drain of the amplifier transistor 11. In the example illustrated in FIG. 18, the fourth switching circuit 82 includes a switch Ss1 and a pair consisting of switches SWI_1 and SWI_2. The switch Ss1 is connected between the power source wiring line 21 and a voltage line 87 to which a predetermined voltage VA (typically, VDD) is applied when the imaging device operates. The switch SWI_1 is connected between the power source wiring line 21 and a signal line 83A to which a predetermined voltage (typically, GND) is applied when the imaging device operates. The switch SWI_2 is connected between the power source wiring line 21 and a signal line 83B to which a predetermined voltage (typically, GND) is applied when the imaging device operates. The signal lines 83A and 83B supply a predetermined drain voltage to the drain of the amplifier transistor 11. In a configuration in which a plurality of pixels 14A are arranged two-dimensionally, each of the signal lines 83A and 83B is a signal line common to all the columns of the pixels 14A. The magnitude of the voltage of the signal line 83A and the magnitude of the voltage of the signal line 83B are basically equivalent to each other when the imaging device operates. That is, the magnitudes are equivalent to each other to the extent that the noise due to the difference of these voltages cannot be recognized in the resulting image. The switch Ss1 and the switches SWI_1 and SWI_2 are controlled so that if the switch Ss1 is on, the switches SWI_1 and SWI_2 are turned off and, if the switch Ss1 is off, one of the switches SWI_1 and SWI_2 is turned on.

In signal readout, the address transistor 13 is turned on, and the switch S1 of the switching circuit 90 and the switch Ss1 of the fourth switching circuit 82 are turned on. In this manner, an electric current flows in a direction from the amplifier transistor 11 to the address transistor 13. At that time, the signal voltage in accordance with the charge generated in the photoelectric conversion unit 10 is output to the vertical signal line 17. That is, the voltage of the FD node amplified by the amplifier transistor 11 can be detected. That is, the signal detection circuit SC can include an amplifier circuit as a part thereof.

In contrast, in resetting of the pixel 14A, the address transistor 13 is turned on, and the switch S2 of the switching circuit 90 and one of the switch SWI_1 and the switch SWI_2 of the fourth switching circuit 82 are turned on. In this manner, an electric current flows in the amplifier transistor 11 in a direction that is opposite from that in the signal readout. At that time, by turning on the feedback transistor 27, a feedback path including the amplifier transistor 11, the feedback line 26, the feedback transistor 27, and the first capacitative element 28 as part thereof is formed. Accordingly, by forming the feedback path, kTC noise can be prevented.

A typical example of the operations performed by the pixel 14A in signal readout and in resetting is briefly described below. In signal readout, under the condition that the address transistor 13 is on, the switch Ss1 of the fourth switching circuit 82 and the switch S1 of the switching circuit 90 are turned on. In this manner, the voltage VA is supplied to the drain of the amplifier transistor 11 of the pixel 14A. The voltage VA can be the same as the power source voltage.

At that time, the amplifier transistor 11 and the constant current source 91 form a source follower, and a voltage in accordance with the amount of charge accumulated in the FD node is read out into the vertical signal line 17. The amplification factor of the source follower is about 1.

In contrast, in resetting of the pixel 14A, under the condition that the address transistor 13 is on, the reset transistor 12 and the feedback transistor 27 are turned on. At that time, one of the switches SWI_1 and SWI_2 of the fourth switching circuit 82 and the switch S2 of the switching circuit 90 are turned on. By turning on the reset transistor 12, the FD node is connected to the feedback line 26 via the reset transistor 12 and, thus, the pixel 14A is reset. That is, the signal detection circuit SC includes a reset circuit including the reset transistor 12 and, in addition, the vertical scanning circuit 15 connected to the reset control line 24 (refer to FIG. 3) serves as a circuit that supplies the control signal to control the reset circuit.

Thereafter, the reset transistor 12 is turned off. When the reset transistor 12 is turned off, kTC noise is generated. Accordingly, the kTC noise is added to the voltage of the FD node after resetting. However, since the feedback transistor 27 remains on, the condition that forms the feedback path that negatively feeds back the output of the amplifier transistor 11 to one of the source and the drain of the feedback transistor 27 still continues. Accordingly, the kTC noise generated by turning off the reset transistor 12 is reduced to $1/(1+A)^{1/2}$, where A represents the gain of the feedback.

Subsequently, the voltage level of the feedback control signal FB is decreased to, for example, a level between the high level and the low level. Thereafter, the feedback control signal FB is set to the low level. By setting the voltage level of the feedback control signal FB to a level lower than the high level, the operating bandwidth of the feedback transistor 27 is decreased from that when the feedback control signal FB is at the high level. If the feedback control signal FB reaches the low level, the feedback transistor 27 is turned off, and the formed feedback path disappears. At that time, if the operating bandwidth of the feedback transistor 27 is lower than the operating bandwidth of the amplifier transistor 11, the kTC noise generated by turning off the feedback transistor 27 is reduced from that generated when no feedback path is formed. If the amplification factor of an amplifier formed by the fourth switching circuit 82 and the amplifier transistor 11 is set to (−D), the kTC noise generated by turning off the feedback transistor 27 is reduced to $(1/(1+D))^{1/2}$ times the kTC noise generated when no feedback path is generated. In this manner, by using the feedback control signal FB, band limiting by the feedback transistor 27 can be performed. Note that the value of D is greater than 1 and can be set to a value in the range from several tens to several hundreds.

In this example, by switching the electric current to the pixel 14A, the amplifier transistor 11 is allowed to function as a source follower in signal readout, and the amplifier transistor 11 is allowed to function as a common source in resetting of the pixel 14A. In this manner, even when the feedback path is formed in each of the pixels 14A, the kTC noise remaining in the FD node can be reduced from that generated when no feedback is provided. The following control may be performed. That is, a slope voltage may be used as the feedback control signal FB, and the voltage level of the feedback control signal FB may be decreased from the high level to the low level.

In the example of configuration illustrated in FIG. 18, the signal detection circuit SC includes a capacitance circuit including series connection of the first capacitative element 28 and the second capacitative element 29 between the FD node and the reference voltage VR1. Accordingly, let B be the attenuation rate obtained by the capacitance circuit. Then, the magnitude of the kTC noise added to the voltage of the FD node when the feedback transistor 27 is turned off can be reduced to $(1+(1+A\cdot B)\cdot Cfd/C2)^{1/2}/(1+A\cdot B)$ times the magnitude of the kTC noise generated when the feedback transistor 27 is directly connected to the FD node without providing a capacitance circuit in the signal detection circuit SC. In this manner, by providing the first capacitative element 28 and the second capacitative element 29 in the signal detection circuit SC, the magnitude of the kTC noise added to the voltage of the FD node can be reduced more. Note that Cfd and C2 in the above expression represent the capacitance value of the FD node and the capacitance value of the second capacitative element 29, respectively.

The above-described technique for reducing the kTC noise can be applied to even the circuit configuration of a pixel 14B illustrated in FIG. 19. In the configuration illustrated in FIG. 19 as an example, the reset transistor 12 is connected to the first capacitative element 28 in parallel. That is, in the example illustrated in FIG. 19, one of the source and the drain of the reset transistor 12 that is not connected to the FD node is connected to an RD node. Even such a configuration can reduce the magnitude of the kTC noise added to the voltage of the FD node by applying the above-described operation. Note that in the example of configuration illustrated in FIG. 18, one of the source and the drain of the reset transistor 12 that is not connected to the FD node is directly connected to the feedback line 26. Accordingly, the flexibility of the design of an impurity profile for ensuring the driving power of the reset transistor 12 can be advantageously increased.

The imaging device according to the sixth exemplary embodiment of the present disclosure is described below with reference to FIGS. 20A and 20B, FIG. 8A, and FIGS. 10, 12, 14, 15, 16, and 17.

Figure 20A:
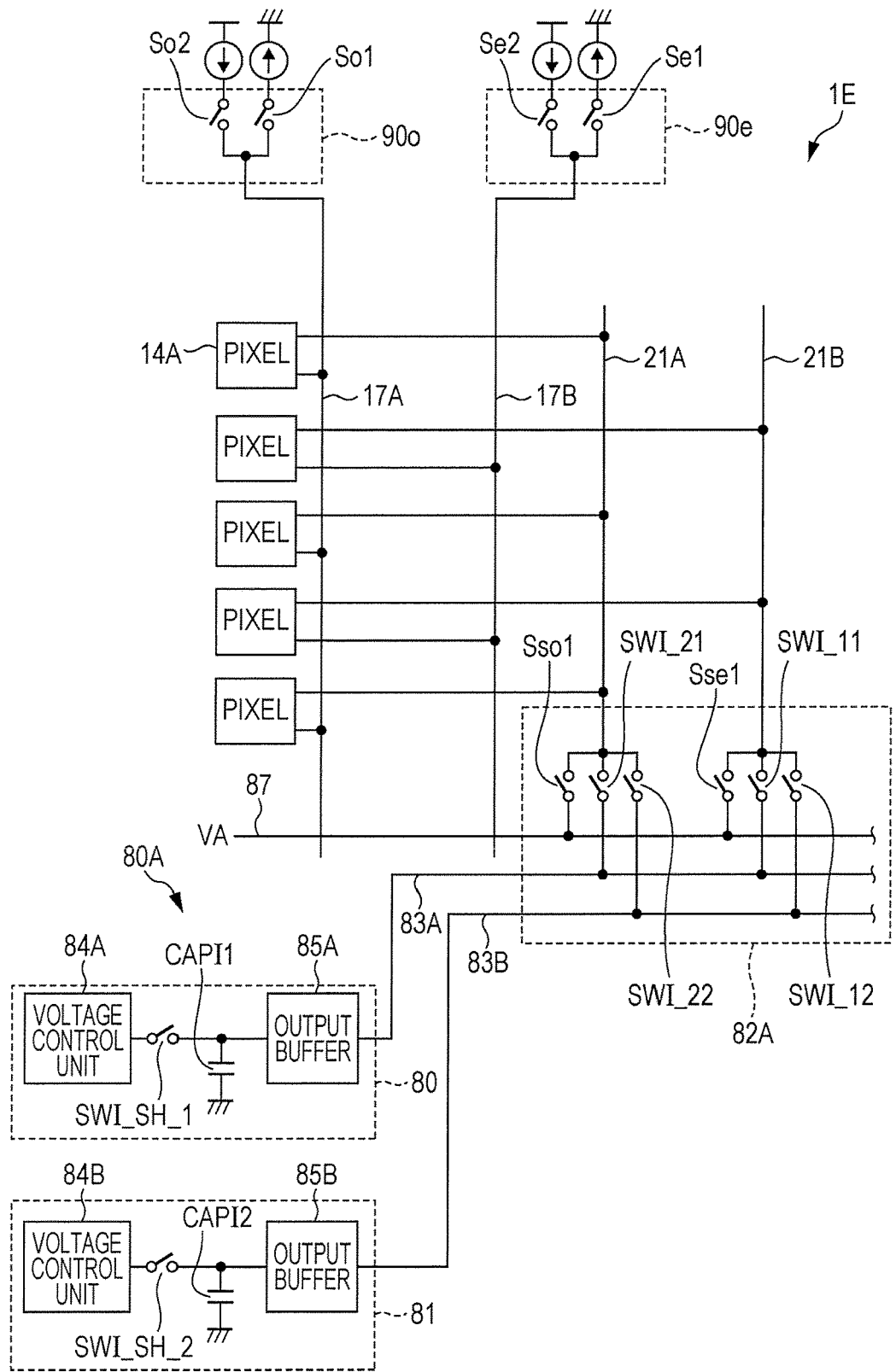
FIG. 20A is a schematic illustration of the circuit configuration of an imaging device according to a sixth exemplary embodiment.

FIG. 20A is a schematic illustration of the circuit configuration of an imaging device 1E according to the sixth exemplary embodiment. The imaging device 1E illustrated in FIG. 20A includes a plurality of pixels 14A arranged two-dimensionally. In this example, for simplicity of the drawings, only five of the pixels 14A in a given column of the pixels 14A are illustrated. Note that instead of the pixels 14A, the pixels 14B described above with reference to FIG. 19 can be applied.

Like the imaging device 10 illustrated in FIG. 14 and the imaging device 1D illustrated in FIG. 17, the imaging device 1E in the example of configuration illustrated in FIG. 20A includes two vertical signal lines, that is, a vertical signal line 17A and a vertical signal line 17B for each of the columns of the pixels 14A. The source of the amplifier transistor 11 of each of the pixels 14A in the odd numbered rows is electrically connected to the vertical signal line 17A, and the source of the amplifier transistor 11 of each of the pixels 14A in the even numbered rows is electrically connected to the vertical signal line 17B. Note that two vertical signal lines, that is, the vertical signal lines 17A and 17B need not be always provided for each of the columns of the pixels 14A. For example, like the example illustrated in FIG. 8A, a configuration in which only one vertical signal line may be provided for each of the columns of the pixels 14A may be employed.

As illustrated in FIG. 20A, as the vertical signal lines 17A and 17B are disposed for each of the columns of the pixel 14A, a switching circuit 90o is connected between the vertical signal line 17A and a constant current source, and a switching circuit 90e is connected between the vertical signal line 17B and the constant current source. The switching circuit 90o includes switches So1 and So2. The switching circuit 90e includes switches Se1 and Se2. The switches So1 and So2 correspond to the switches S1 and S2 illustrated in FIG. 18, respectively, and can be controlled in the same manner as the switches S1 and S2. In addition, the switches Se1 and Se2 correspond to the switches S1 and S2 illustrated in FIG. 18, respectively, and can be controlled in the same manner as the switches S1 and S2.

In this example, two vertical signal lines, that is, the vertical signal lines 17A and 17B are disposed for each of the columns of the pixels 14A, two power source wiring lines, that is, the power source wiring lines 21A and 21B are disposed for each of the columns of the pixels 14A. As illustrated in FIG. 20A, the power source wiring lines 21A and 21B for each of the columns are connected to the pixels 14A disposed in the odd numbered rows and the pixels 14A disposed in the even numbered rows, respectively.

In the example of configuration illustrated in FIG. 20A, the imaging device 1E includes a drain voltage applying circuit 80A which includes a fourth switching circuit 82A, a first drain voltage applying circuit 80, and a second drain voltage applying circuit 81. In this example, as the power source wiring lines 21A and 21B are disposed for each of the columns of the pixel 14A, the fourth switching circuit 82A is connected between each of the power source wiring lines 21A and 21B and each of signal lines 83A and 83B and between each of the power source wiring lines 21A and 21B and the voltage line 87.

The fourth switching circuit 82A includes switches Sso1, SWI_21, and SWI_22 each having one end connected to the power source wiring line 21A and switches Sse1, SWI_11, and SWI_12 each having one end connected to the power source wiring line 21B. As illustrated in FIG. 20A, the other end of each of the switches Sso1 and Sse1 is connected to the voltage line 87. The other end of each of the switches SWI_21 and SWI_11 is connected to the signal line 83A. The other end of each of the switches SWI_22 and SWI_12 is connected to the signal line 83B.

The switches Sso1, SWI_21, and SWI_22 correspond to the switches Ss1, SWI_1, and SWI_2 illustrated in FIG. 18 and are controlled in the same manner as the switches Ss1, SWI_1, and SWI_2, respectively. Similarly, the switches Sse1, SWI_11, and SWI_12 correspond to the switches Ss1, SWI_1, and SWI_2 illustrated in FIG. 18 and are controlled in the same manner as the switches Ss1, SWI_1, and SWI_2, respectively. Accordingly, for example, if the switch Sso1 is on, the switches SWI_21 and SWI_22 are off.

The signal lines 83A and 83B are connected to the drain voltage applying circuit 80A. In this example, the signal lines 83A and 83B are connected to the first drain voltage applying circuit 80 and the second drain voltage applying circuit 81, respectively. That is, in this example, the first drain voltage applying circuit 80 and the second drain voltage applying circuit 81 can be electrically connected to the drain of the amplifier transistor 11 of the pixel 14A via the fourth switching circuit 82A. Each of the first drain voltage applying circuit 80 and the second drain voltage applying circuit 81 generates the drain voltage of the amplifier transistor 11 of the pixel 14A. The magnitudes of the drain voltages generated by the first drain voltage applying circuit 80 and the second drain voltage applying circuit 81 are equivalent to each other. In other word, the magnitudes are equivalent to each other to the extent that the noise due to the difference of these drain voltages cannot be recognized in the resulting image.

Each of the first drain voltage applying circuit 80 and the second drain voltage applying circuit 81 can include a sample-and-hold circuit. In the example illustrated in FIG. 20A, the first drain voltage applying circuit 80 includes an output buffer 85A, a capacitor CAPI1, a switch SWI_SH_1, and a voltage control unit 84A. Similarly, the second drain voltage applying circuit 81 includes an output buffer 85B, a capacitor CAPI2, a switch SWI_SH_2, and a voltage control unit 84B. The capacitors CAPI1 and CAPI2 and the voltage control units 84A and 84B may be disposed outside the imaging device 1E.

For example, if the switch SWI_SH_1 is turned on, the output voltage from the voltage control unit 84A is charged in the capacitor CAPI1 (sampling). If the switch SWI_SH_1 is turned off, the sample operation is completed, and the sampled voltage signal is held in the capacitor CAPI1 (hold). In the same manner, a sample operation and a hold operation are performed in the second drain voltage applying circuit 81. The voltage signals held in the capacitors CAPI1 and CAPI2 are output to the fourth switching circuit 82A via the output buffers 85A and 85B, respectively. The fourth switching circuit 82A can be controlled by, for example, a peripheral logic circuit (not illustrated).

If the switch SWI_21 and the switch So2 are turned on, the first drain voltage applying circuit 80 is electrically connected to the power source wiring line 21A. Accordingly, a predetermined drain voltage (typically, GND) sampled into the capacitor CAPI1 can be applied to the drain of the amplifier transistor 11 of the pixel 14A in the selected row (one of the odd numbered rows). In addition, if the switch Sso1 and the switch So1 are turned on, the output of the pixel 14A in the selected row (one of the odd numbered rows) can be read out into the vertical signal line 17A.

Similarly, if the switch SWI_22 and the switch So2 are turned on, the second drain voltage applying circuit 81 is electrically connected to the power source wiring line 21A. Accordingly, a predetermined drain voltage (typically, GND) sampled into the capacitor CAPI2 can be applied to the drain of the amplifier transistor 11 of the pixel 14A of the selected row (one of the odd numbered rows). By controlling the switches Sse1, SWI_11, and SWI_12 and controlling the switches Set and Se2, a similar operation can be performed on the pixel 14A of an even numbered row.

In this example, the switch Sso1 and the pair consisting of the switches SWI_21 and SWI_22, and the switch Sse1 and the pair consisting of switches SWI_11 and SWI_12 are provided for each of the each of the columns of the pixels 14A. Accordingly, resetting of one of two pixels 14A disposed in the same column and signal readout from the other pixel 14A can be performed at the same time.

One Frame Scanning Period Hold

Even in the sixth exemplary embodiment, the imaging device can operate in a manner that is almost the same as the imaging devices according to the fourth and fifth exemplary embodiments. For example, the imaging device can perform an operation that is the same as illustrated in FIGS. 15 and 10.

For example, in the same column, the second drain voltage applying circuit 81 may be connected to the vertical signal line 17B (or the vertical signal line 17A) in the row reset period and the signal readout period according to the n-th frame, and the first drain voltage applying circuit 80 may be connected to the vertical signal line 17A (or the vertical signal line 17B) in the row reset period and the signal readout period according to the (n+1)th frame. That is, the fourth switching circuit 82A may be controlled so that the second drain voltage applying circuit 81 is electrically connected to the drain of the amplifier transistor 11 of one of the pixels 14A in an even numbered row for the n-th frame, and the first drain voltage applying circuit 80 is electrically connected to the drain of the amplifier transistor 11 of one of the pixels 14A in an odd numbered row for the (n+1)th frame.

In such a case, for resetting of the pixel 14A, on/off of the switch SWI_12 and the switch Se2 can be made to correspond to on/off of the switch SWV_12 illustrated in FIG. 15. That is, the switch SWI_12 and the switch Se2 can be turned on and off in the same manner as the switch SWV_12 is turned on and off, as illustrated in FIG. 15. In addition, on/off of the switch SWI_22 and the switch So2 can be made to correspond to on/off of the switch SWV_22 illustrated in FIG. 15. Similarly, on/off of the switch SWI_11 and the switch Se2 can be made to correspond to on/off of the switch SWV_11 illustrated in FIG. 15. On/off of the switch SWI_21 and the switch So2 can be made to correspond to on/off of the switch SWV_21 illustrated in FIG. 15. The switches SWI_SH_1 and SWI_SH_2 can be turned on and off in the same manner as the switches SWV_SH_1 and SWV_SH_2 are turned on and off, as illustrated in FIG. 10. Note that for signal readout from the pixel 14A, for example, signal readout for the pixel 14A in an even numbered row, on and off of the switch SWV_12 can be replaced with on and off of the switch Sse1 and the switch Se1 as illustrated in FIG. 15. For signal readout from the pixel 14A in an odd numbered row, on and off of the switch SWV_22 can be replaced with on and off of the switch Sso1 and the switch So1 as illustrated in FIG. 15.

According to the driving method, in addition to the effect described in the section "One Frame Scanning Period Hold" for the third exemplary embodiment, images can be captured at a high frame rate, since feedback paths are concurrently formed for the pixels 14A disposed in the odd numbered rows and the pixels 14A disposed in the even numbered rows in the same column.

Row Reset Period Hold and Signal Readout Period Hold

Even in the sixth exemplary embodiment, an operation that is the same as the operation illustrated in FIGS. 12 and 16 can be applied. That is, the fourth switching circuit 82A may be controlled so that during the row reset period in one frame period, the second drain voltage applying circuit 81 is electrically connected to the drain of the amplifier transistor 11 in one of the pixels 14A in an odd numbered row (or an even numbered row) and during the pixel signal readout period in the one frame period, the first drain voltage applying circuit 80 is electrically connected to the drain of the amplifier transistor 11 of one of the pixels 14A in an even numbered row (or an odd numbered row).

In such a case, as described in the example of the operation in the section "One Frame Scanning Period Hold", for resetting of the pixel 14A, on and off of the switch SWI_12 and the switch Se2 can be made to correspond to on and off of the switch SWV_12 as illustrated in FIG. 16. On and off of the switch SWI_22 and the switch So2 can be made to correspond to on and off of the switch SWV_22 illustrated in FIG. 16. Similarly, on and off of the switch SWI_11 and the switch Se2 can be made to correspond to on and off of the switch SWV_11 illustrated in FIG. 16. On and off of the switch SWI_21 and the switch So2 can be made to correspond to on/off of the switch SWV_21 illustrated in FIG. 16. The switches SWI_SH_1 and SWI_SH_2 can be turned on and off in the same manner as the switches SWVSH_1 and SWV_SH2 are turned on and off, as illustrated in FIG. 12.

According to the driving method, the hold operation performed by the sample-and-hold circuit of one of the first drain voltage applying circuit 80 and the second drain voltage applying circuit 81 can be maintained throughout the row reset period and throughout the signal readout period. According to the driving method, in addition to the effect described in the section "Row Reset Period Hold and Signal Readout Period Hold" for the third exemplary embodiment, images can be captured at a high frame rate, since feedback paths can be concurrently formed in the pixel 14A disposed in an odd numbered row and the pixel 14A disposed in an even numbered row in the same column.

Figure 20B:
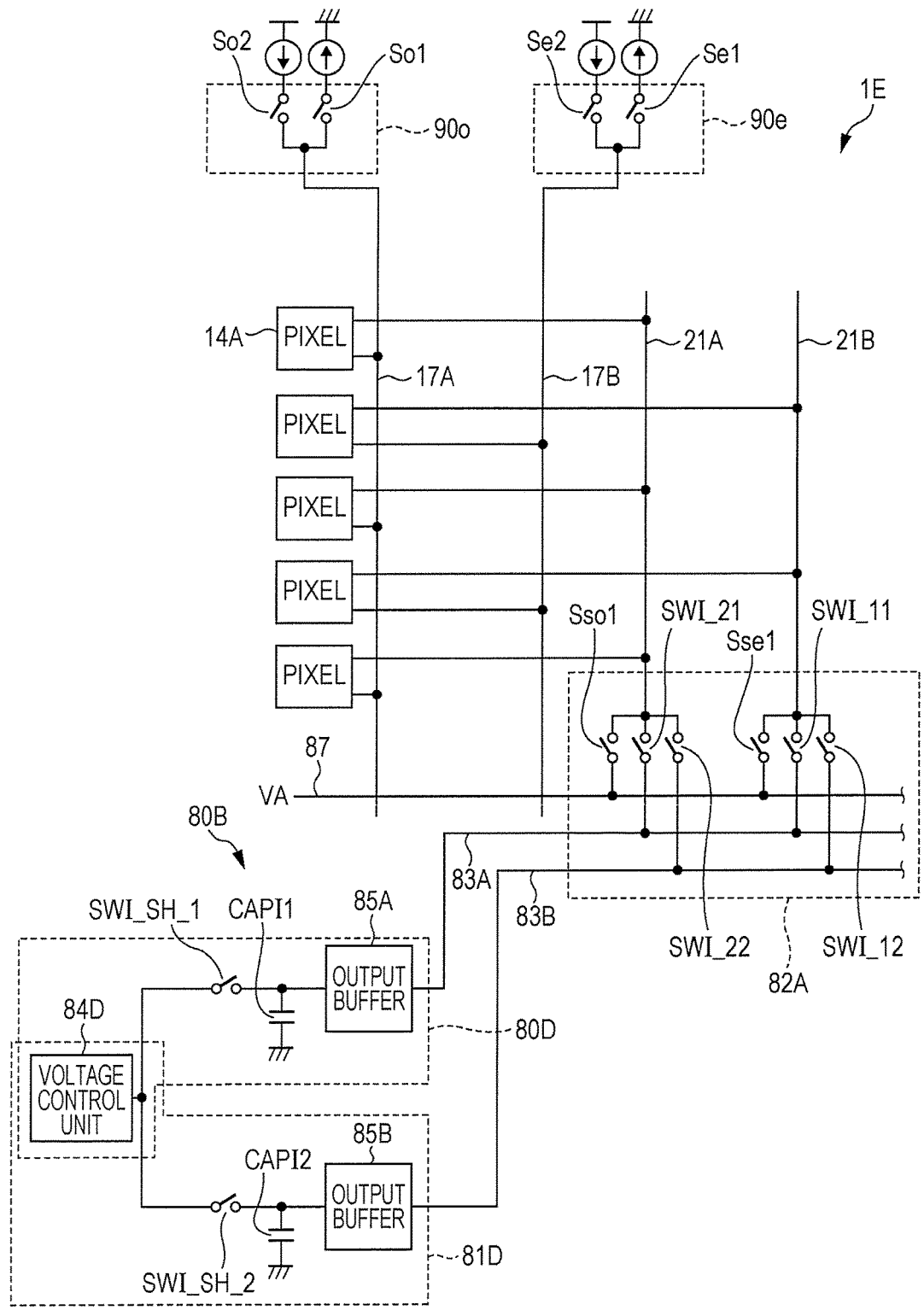
FIG. 20B is a schematic illustration of another example of the circuit configuration of the imaging device according to the sixth exemplary embodiment.

As illustrated in FIG. 20B, a drain voltage applying circuit 80B in which instead of the drain voltage applying circuit 80A, a first drain voltage applying circuit 80D and a second drain voltage applying circuit 81D are provided and a voltage control unit 84D is shared by the first drain voltage applying circuit 80D and the second drain voltage applying circuit 81D may be employed. By sharing the voltage control unit, the size of the drive circuit unit can be advantageously reduced. The voltage control unit 84D may be disposed either inside or outside the imaging device 1E. Note that instead of disposing the switches Sso1, SWI_21, and SWI_22 and the switches Sse1, SWI_11, and SWI_12 for each of the columns of the pixels 14A, a set of the switches Sso1, SWI_21, and SWI_22 may be connected between the signal line 83A and the first drain voltage applying circuit 80, and a set of Sse1, SWI_11, and SWI_12 may be connected between the signal line 83B and the second drain voltage applying circuit 81.

Figure 21:
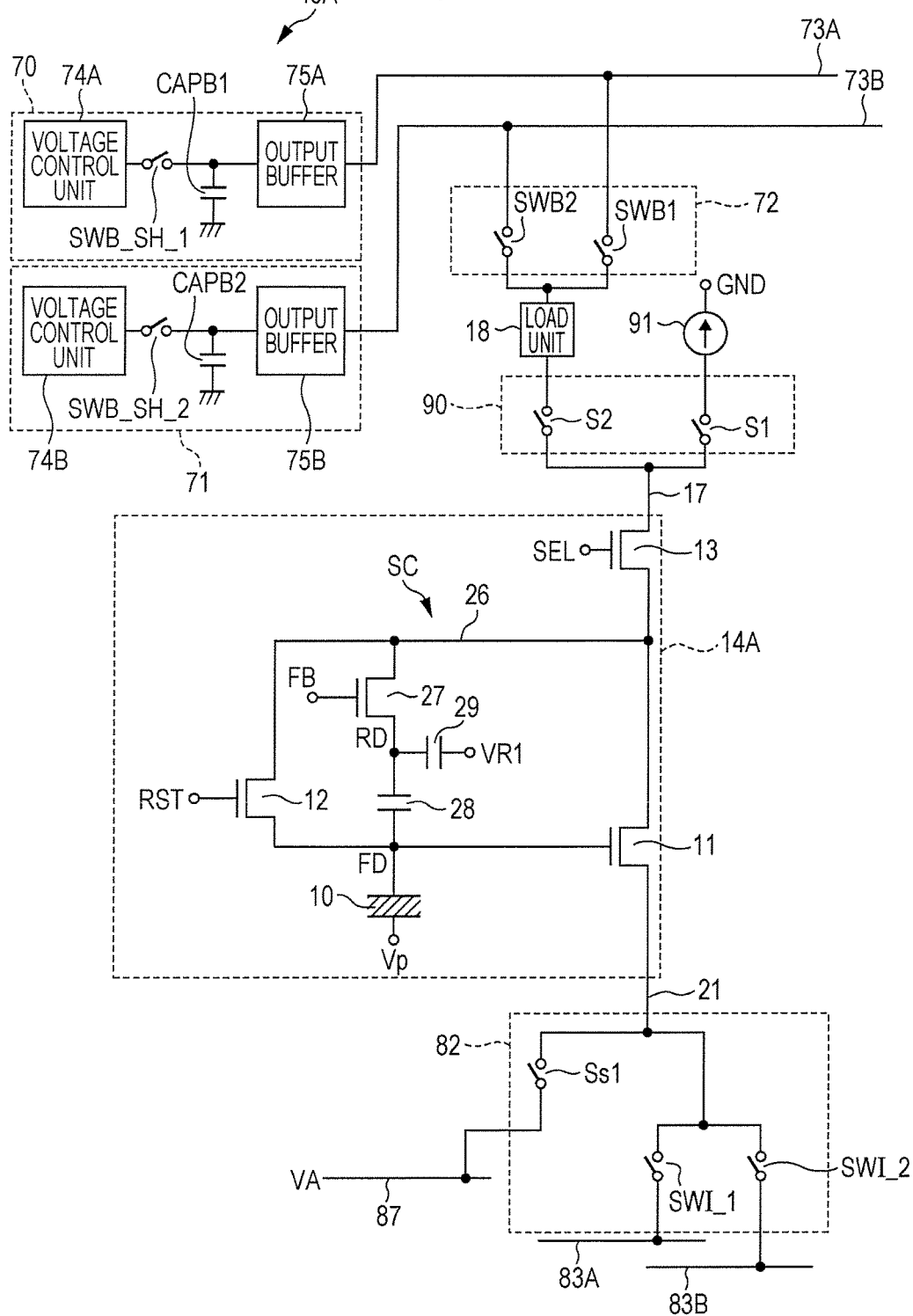
FIG. 21 illustrates a modification of the circuit configuration according to the sixth exemplary embodiment.

FIG. 21 illustrates a modification of the circuit configuration according to the sixth exemplary embodiment. In FIG. 21, for simplicity of the drawings, only one of the plurality of pixels 14A is illustrated.

As illustrated in FIG. 21, the configuration illustrated in FIG. 13A may be applied to the constant current source 92 used to reset the pixel 14A. In the configuration illustrated in FIG. 21 as an example, the bias circuit 40A illustrated in FIG. 13A is connected to the switch S2 of the switching circuit 90. Like the third exemplary embodiment, by performing switch control on the third switching circuit 72, a variation of the bias voltage in resetting of the pixel 14A can be prevented and, thus, random horizontal line noise can be effectively prevented. Note that instead of the bias circuit 40A, the bias circuit 40D illustrated in FIG. 13B may be employed.

According to the sixth exemplary embodiment, the variation of the drain voltage of an amplifier transistor caused by disturbance noise or thermal noise can be prevented. In addition, according to the sixth exemplary embodiment, since the amplifier transistor 11 of each of the pixels functions as a signal detection circuit transistor of the signal detection circuit SC and an amplifier transistor of the feedback circuit, the need for an inverting amplifier for each of the columns of the pixels can be eliminated. Accordingly, the size and the power consumption of the imaging device can be advantageously reduced.

The imaging device of the present disclosure is applicable to a variety of camera systems and sensor systems, such as digital still cameras, cameras for medical use, security cameras, in-vehicle cameras, digital single-lens reflex cameras, and digital mirrorless single-lens reflex cameras.

What is claimed is:

1. An imaging device comprising:
a pixel comprising:
a photoelectric converter that converts incident light into charges, and
a reset transistor having a first source, a first drain and a first gate, one of the first source and the first drain being coupled to the photoelectric converter;
first voltage generating circuitry that generates a first voltage;
second voltage generating circuitry that generates a second voltage, the second voltage generating circuitry being different from the first voltage generating circuitry; and
first switching circuitry that causes either the first voltage generating circuitry or the second voltage generating circuitry to selectively couple to the other of the first source and the first drain of the reset transistor.

2. The imaging device according to claim 1, wherein the first voltage generating circuitry includes a first capacitor for holding the first voltage, and
the second voltage generating circuitry includes a second capacitor for holding the second voltage, the second capacitor being different from the first capacitor.

3. The imaging device according to claim 1, wherein the first voltage is equivalent to the second voltage.

4. The imaging device according to claim 1, further comprising:
an inverting amplifier having a first input terminal, a second input terminal and an output terminal, the output terminal being coupled to the other of the first source and the first drain of the reset transistor, wherein
the pixel includes an amplifier transistor having a second source, a second drain and a second gate, the second gate being coupled to the photoelectric converter, one of the second source and the second drain being coupled to the first input terminal of the inverting amplifier, and the first switching circuitry causes either the first voltage generating circuitry or the second voltage generating circuitry to selectively couple to the second input terminal of the inverting amplifier, to thereby cause either the first voltage generating circuitry or the second voltage generating circuitry to selectively couple to the other of the first source and the first drain of the reset transistor.

5. The imaging device according to claim 4, further comprising:
load circuitry coupled to the one of the second source and the second drain of the amplifier transistor;
third voltage generating circuitry that generates a third voltage;
fourth voltage generating circuitry that generates a fourth voltage; and
second switching circuitry that causes either the third voltage generating circuitry or the fourth voltage generating circuitry to selectively couple to the load circuitry.

6. The imaging device according to claim 5, wherein each of the third voltage generating circuitry and the fourth voltage generating circuitry includes a sample hold circuitry.

7. The imaging device according to claim 1, wherein
the pixel includes an amplifier transistor having a second source, a second drain and a second gate, the second gate being coupled to the photoelectric converter, one of the second source and the second drain being coupled to the other of the first source and the first drain of the reset transistor, and
the first switching circuitry causes either the first voltage generating circuitry or the second voltage generating circuitry to selectively couple to the other of the second source and the second drain of the amplifier transistor, to thereby cause either the first voltage generating circuitry or the second voltage generating circuitry to selectively couple to the other of the first source and the first drain of the reset transistor.

8. The imaging device according to claim 7, wherein
the pixel includes an feedback transistor having a third source, a third drain and a third gate, one of the third source and the third drain being coupled to the other of the first source and the first drain of the reset transistor, the other of the third source and the third drain being coupled to the one of the second source and the second drain of the amplifier transistor.

9. The imaging device according to claim 7, further comprising:
load circuitry coupled to the other of the second source and the second drain of the amplifier transistor;
third voltage generating circuitry that generate a third voltage;
fourth voltage generating circuitry that generates a fourth voltage; and
second switching circuitry that causes either the third voltage generating circuitry or the fourth voltage generating circuitry to selectively couple to the load circuitry.

10. The imaging device according to claim 9, wherein each of the third voltage generating circuitry and the fourth voltage generating circuitry includes a sample hold circuitry.

11. The imaging device according to claim 1, wherein
the first switching circuitry causes the first voltage generating circuitry to couple to the other of the first source and the first drain of the reset transistor in a first period included in a first frame period according to a first frame, and
the first switching circuitry causes the second voltage generating circuitry to couple to the other of the first source and the first drain of the reset transistor in a second period included in a second frame period according to a second frame subsequent to the first frame.

12. The imaging device according to claim 1, wherein
the first switching circuitry causes the first voltage generating circuitry to couple to the other of the first source and the first drain of the reset transistor in a first period included in a first frame period according to a first frame, and
the first switching circuitry causes the second voltage generating circuitry to couple to the other of the first source and the first drain of the reset transistor in a second period included in the first frame period, the second period being different from the first period.

13. The imaging device according to claim 1, wherein each of the first voltage generating circuitry and the second voltage generating circuitry includes a sample hold circuitry.

* * * * *